United States Patent
Yamamoto

(10) Patent No.: US 10,224,906 B2
(45) Date of Patent: Mar. 5, 2019

(54) SEMICONDUCTOR DEVICE

(71) Applicant: Semiconductor Energy Laboratory Co., Ltd., Atsugi-shi, Kanagawa-ken (JP)

(72) Inventor: Roh Yamamoto, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 43 days.

(21) Appl. No.: 15/438,861

(22) Filed: Feb. 22, 2017

(65) Prior Publication Data

US 2017/0250680 A1    Aug. 31, 2017

(30) Foreign Application Priority Data

Feb. 25, 2016 (JP) ................................. 2016-034301

(51) Int. Cl.
*H03K 3/0233* (2006.01)
*H03K 3/3565* (2006.01)
*H03K 5/24* (2006.01)

(52) U.S. Cl.
CPC ....... *H03K 3/02337* (2013.01); *H03K 3/3565* (2013.01); *H03K 5/2481* (2013.01)

(58) Field of Classification Search
None
See application file for complete search history.

(56) References Cited

U.S. PATENT DOCUMENTS

| | | | |
|---|---|---|---|
| 6,310,600 B1 | 10/2001 | Koyama et al. | |
| 6,369,862 B1 | 4/2002 | Yamazaki | |
| 6,614,418 B2 | 9/2003 | Koyama et al. | |
| 6,697,057 B2 | 2/2004 | Koyama et al. | |
| 6,806,744 B1 * | 10/2004 | Bell ..................... | H03K 5/2481 327/53 |
| 6,891,356 B2 | 5/2005 | Kimura et al. | |
| 6,970,124 B1 * | 11/2005 | Patterson ............. | H03K 5/2481 341/155 |
| 7,072,000 B2 | 7/2006 | Yamazaki | |
| 7,180,515 B2 | 2/2007 | Miyagawa et al. | |
| 7,248,031 B2 | 7/2007 | Kimura et al. | |
| 7,262,749 B2 | 8/2007 | Koyama et al. | |
| 7,453,453 B2 | 11/2008 | Miyagawa et al. | |
| 7,456,625 B2 | 11/2008 | Kimura et al. | |
| 7,456,830 B2 | 11/2008 | Kawasaki et al. | |
| 7,522,159 B2 | 4/2009 | Miyata et al. | |

(Continued)

FOREIGN PATENT DOCUMENTS

| JP | 2008-005547 A | 1/2008 |
|---|---|---|
| JP | 2013-009325 A | 1/2013 |

(Continued)

*Primary Examiner* — Cassandra Cox
(74) *Attorney, Agent, or Firm* — Fish & Richardson P.C.

(57) ABSTRACT

A hysteresis comparator that has a small circuit area and low power consumption is provided. A differential pair in the comparator is formed using transistors each including a back gate. The comparator is configured to apply an inverted signal of a logic value of an output signal of the comparator to the back gate of the transistor. That is, the threshold voltage of the transistor is controlled by the inverted signal. By the change of the threshold voltage, hysteresis can be added to an input comparison voltage.

19 Claims, 32 Drawing Sheets

(56) References Cited

U.S. PATENT DOCUMENTS

| | | |
|---|---|---|
| 7,525,472 B2 | 4/2009 | Kawae |
| 7,764,058 B2 | 7/2010 | Kimura et al. |
| 7,773,082 B2 | 8/2010 | Miyagawa et al. |
| 7,877,068 B2 | 1/2011 | Atsumi et al. |
| 7,907,902 B2 | 3/2011 | Kato et al. |
| 7,987,498 B2 | 7/2011 | Tanada et al. |
| 7,999,769 B2 | 8/2011 | Miyagawa et al. |
| 8,044,813 B1 | 10/2011 | Dembo et al. |
| 8,063,895 B2 | 11/2011 | Koyama et al. |
| 8,085,028 B2 | 12/2011 | Kimura et al. |
| 8,115,160 B2 | 2/2012 | Koyama et al. |
| 8,124,922 B2 | 2/2012 | Koyama et al. |
| 8,159,449 B2 | 4/2012 | Kimura et al. |
| 8,160,636 B2 | 4/2012 | Tadokoro |
| 8,188,875 B2 | 5/2012 | Dembo et al. |
| 8,198,936 B2 | 6/2012 | Matsuzaki |
| 8,243,863 B2 | 8/2012 | Kobayashi |
| 8,253,660 B2 | 8/2012 | Miyagawa et al. |
| 8,314,601 B2 | 11/2012 | Kimura et al. |
| 8,330,607 B2 | 12/2012 | Dembo et al. |
| 8,395,608 B2 | 3/2013 | Koyama et al. |
| 8,431,883 B2 | 4/2013 | Yanagisawa et al. |
| 8,502,724 B2 | 8/2013 | Kurokawa |
| 8,508,561 B2 | 8/2013 | Yamazaki et al. |
| 8,514,165 B2 | 8/2013 | Yoshida |
| 8,587,270 B2 | 11/2013 | Ohmaru et al. |
| 8,588,683 B2 | 11/2013 | Kamata |
| 8,604,473 B2 | 12/2013 | Saito et al. |
| 8,610,696 B2 | 12/2013 | Kurokawa |
| 8,614,637 B2 | 12/2013 | Ito |
| 8,643,583 B2 | 2/2014 | Yoshida |
| 8,723,781 B2 | 5/2014 | Fukutome et al. |
| 8,773,333 B2 | 7/2014 | Miyagawa et al. |
| 8,816,662 B2 | 8/2014 | Takahashi et al. |
| 8,847,861 B2 | 9/2014 | Kimura |
| 8,866,725 B2 | 10/2014 | Yamazaki et al. |
| 8,912,016 B2 | 12/2014 | Godo et al. |
| 8,952,728 B2 | 2/2015 | Takewaki et al. |
| 8,977,203 B2 | 3/2015 | Kato et al. |
| 9,001,563 B2 | 4/2015 | Atsumi et al. |
| 9,041,442 B2 | 5/2015 | Yamamoto et al. |
| 9,083,327 B2 | 7/2015 | Ohmaru |
| 9,135,880 B2 | 9/2015 | Koyama |
| 9,136,188 B2 | 9/2015 | Godo et al. |
| 9,147,698 B2 | 9/2015 | Miyagawa et al. |
| 9,171,492 B2 | 10/2015 | Yoshida |
| 9,176,176 B2 | 11/2015 | Dembo et al. |
| 9,178,419 B2 | 11/2015 | Ito et al. |
| 9,200,952 B2 | 12/2015 | Kozuma |
| 9,230,648 B2 | 1/2016 | Matsubayashi |
| 9,245,650 B2 | 1/2016 | Inoue et al. |
| 9,294,058 B2 | 3/2016 | Yamamoto et al. |
| 9,298,035 B2 | 3/2016 | Yamazaki et al. |
| 9,349,454 B2 | 5/2016 | Ikeda et al. |
| 9,362,820 B2 | 6/2016 | Ito et al. |
| 9,391,449 B2 | 7/2016 | Kato et al. |
| 9,391,598 B2 | 7/2016 | Inoue et al. |
| 9,397,622 B2* | 7/2016 | Vashishtha .......... H03K 5/2481 |
| 9,412,762 B2 | 8/2016 | Koyama et al. |
| 9,443,563 B2 | 9/2016 | Atsumi et al. |
| 9,496,022 B2 | 11/2016 | Ohmaru |
| 9,508,276 B2 | 11/2016 | Hirakata et al. |
| 9,614,094 B2 | 4/2017 | Watanabe |
| 2006/0103434 A1* | 5/2006 | Okamoto ............... G11O 5/145 |
| | | 327/77 |
| 2006/0251428 A1* | 11/2006 | Gieseler ............ H03F 3/45085 |
| | | 398/189 |
| 2007/0222737 A1 | 9/2007 | Kimura |
| 2009/0128195 A1* | 5/2009 | Forbes ................ H03F 3/45183 |
| | | 327/89 |
| 2011/0090204 A1 | 4/2011 | Yamazaki et al. |
| 2011/0157254 A1 | 6/2011 | Yamazaki et al. |
| 2011/0285426 A1 | 11/2011 | Takahashi et al. |
| 2012/0044223 A1 | 2/2012 | Tamura |
| 2012/0056863 A1 | 3/2012 | Watanabe et al. |
| 2012/0154066 A1* | 6/2012 | Kubota ................... H03B 5/06 |
| | | 331/116 FE |
| 2012/0274361 A1 | 11/2012 | Miyake |
| 2012/0292680 A1 | 11/2012 | Nagatsuka et al. |
| 2013/0271220 A1 | 10/2013 | Takahashi et al. |
| 2013/0293138 A1 | 11/2013 | Takahashi |
| 2013/0307496 A1 | 11/2013 | Watanabe |
| 2014/0097871 A1* | 4/2014 | Hsu ........................ G01R 19/10 |
| | | 327/52 |
| 2015/0035509 A1 | 2/2015 | Koyama et al. |
| 2015/0091003 A1* | 4/2015 | Kurokawa .......... H01L 27/1225 |
| | | 257/43 |
| 2015/0317028 A1 | 11/2015 | Takahashi et al. |
| 2015/0340015 A1 | 11/2015 | Yoshida |
| 2016/0037106 A1 | 2/2016 | Ohmaru |
| 2016/0041213 A1 | 2/2016 | Dembo et al. |
| 2016/0094236 A1 | 3/2016 | Shionoiri et al. |
| 2016/0149567 A1 | 5/2016 | Matsuzaki et al. |
| 2016/0190331 A1 | 6/2016 | Miyake et al. |
| 2016/0191052 A1 | 6/2016 | Kimura et al. |
| 2016/0210910 A1 | 7/2016 | Yamazaki et al. |
| 2016/0232834 A1 | 8/2016 | Kimura et al. |
| 2016/0240239 A1 | 8/2016 | Ikeda et al. |
| 2016/0285369 A1 | 9/2016 | Koyama et al. |
| 2016/0329368 A1 | 11/2016 | Ohmaru |
| 2016/0356645 A1 | 12/2016 | Yoneda et al. |
| 2016/0381266 A1 | 12/2016 | Ohmaru |
| 2017/0005669 A1 | 1/2017 | Fujita |
| 2017/0018587 A1 | 1/2017 | Ohmaru |
| 2017/0041517 A1 | 2/2017 | Ikeda |
| 2017/0053584 A1 | 2/2017 | Takahashi |

FOREIGN PATENT DOCUMENTS

| | | |
|---|---|---|
| JP | 2014-007471 A | 1/2014 |
| JP | 2014-195128 A | 10/2014 |
| JP | 2015-070527 A | 4/2015 |

* cited by examiner

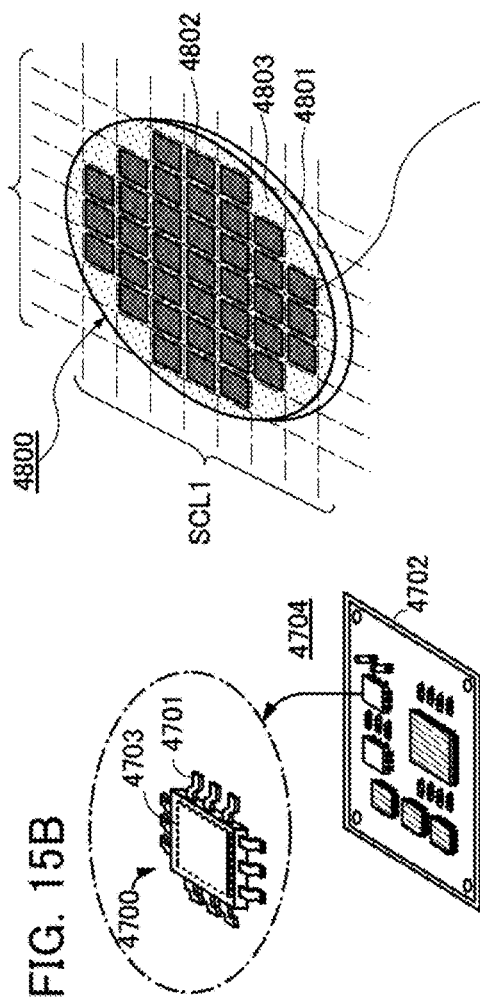
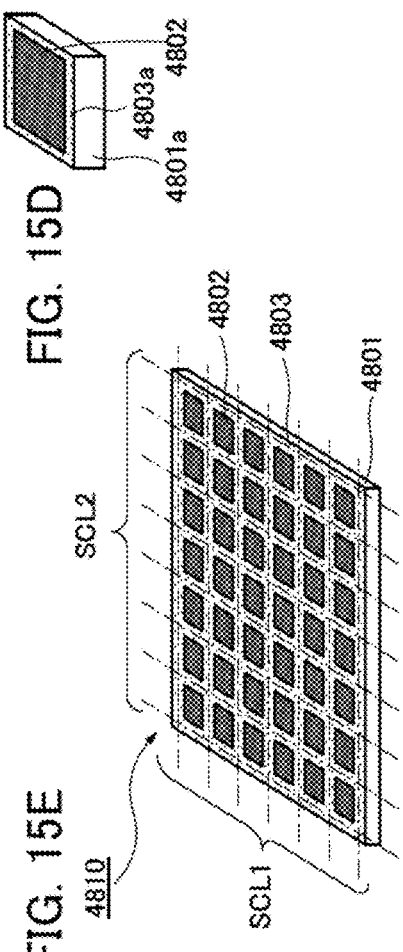
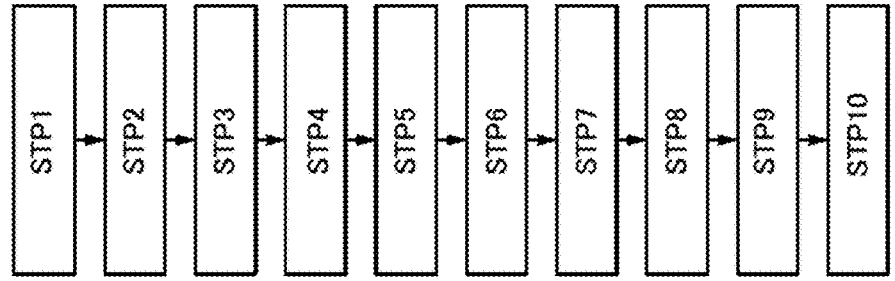

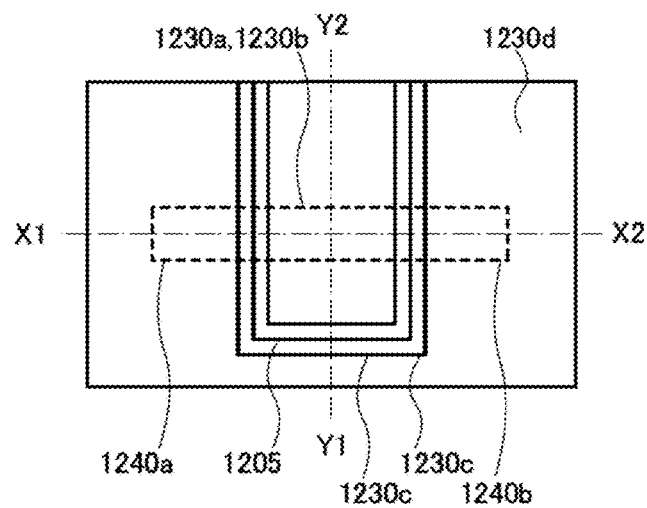
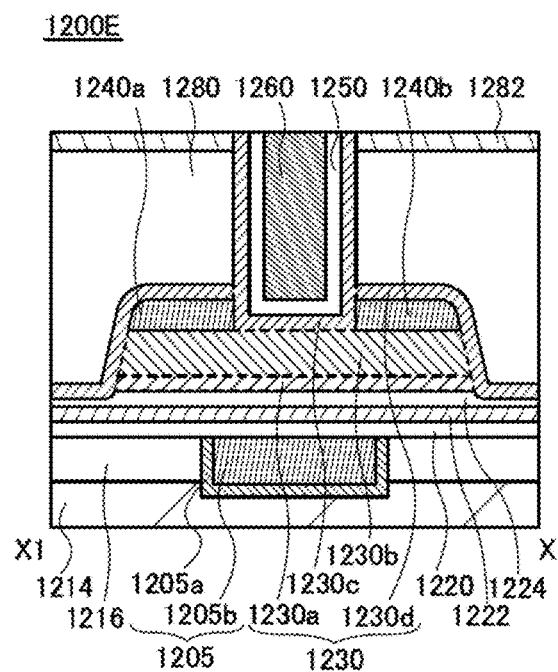
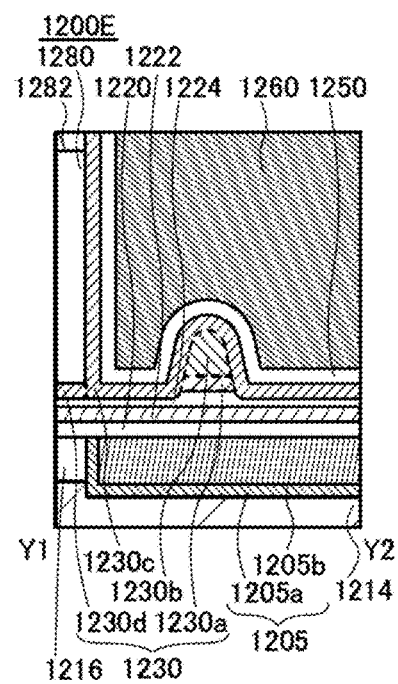

FIG. 28A out-of-plane method CAAC-OS
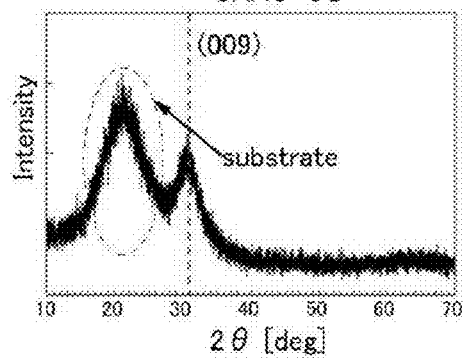
FIG. 28B
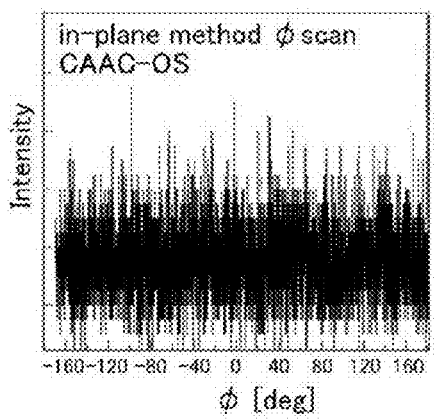
FIG. 28C in-plane method φ scan single crystal OS
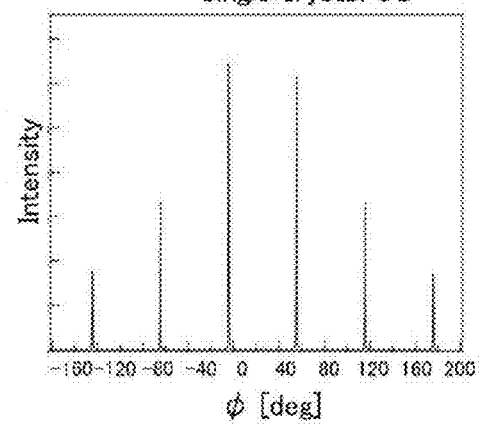
FIG. 28D
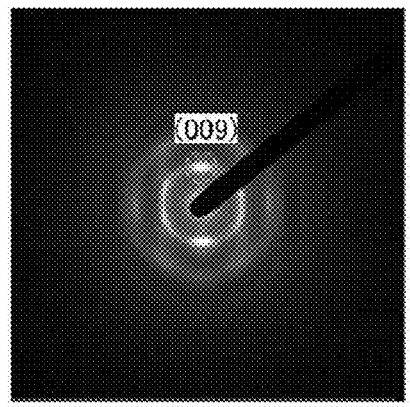
FIG. 28E
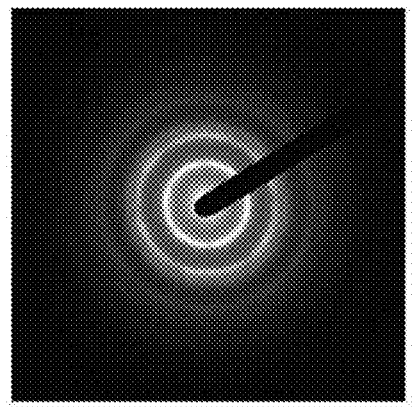

SEMICONDUCTOR DEVICE

BACKGROUND OF THE INVENTION

1. Field of the Invention

One embodiment of the present invention relates to a semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

In recent years, semiconductor devices such as central processing units (CPUs), memories, or display devices have been used in various electronic devices such as mobile phones, personal computers, vehicle-mounted devices, and digital cameras.

It has been especially proposed to use a transistor whose channel formation region is formed using an oxide semiconductor (hereinafter, also referred to as an "oxide semiconductor transistor" or an "OS transistor") for circuits included in the semiconductor devices. For example, the OS transistor has an extremely low off-state current because the oxide semiconductor has a wider band gap than silicon. Thus, the use of the OS transistor as a write transistor or the like in a memory cell can prevent discharge of stored electric charge due to leakage current. Furthermore, a processor, a display device, or the like with low power consumption can be provided by utilizing the low off-state current characteristics of the OS transistor for a semiconductor device such as a driver circuit or an amplifier without limitation to a memory cell.

The OS transistor can include a first gate electrode (also referred to as a gate or a front gate) and a second gate electrode (also referred to as a back gate; the first gate electrode and the second gate electrode may be collectively referred to as a gate). That is, the OS transistor can have a dual-gate structure. The threshold voltage of the transistor with the back gate can be shifted in the negative direction by application of a negative potential to the back gate. Also, the threshold voltage of the transistor with the back gate can be shifted in the positive direction by application of a positive potential to the back gate.

REFERENCE

Patent Document

[Patent Document 1] Japanese Published Patent Application No. 2015-70527
[Patent Document 2] Japanese Published Patent Application No. 2014-195128
[Patent Document 3] Japanese Published Patent Application No. 2014-7471
[Patent Document 4] Japanese Published Patent Application No. 2008-5547

SUMMARY OF THE INVENTION

Display devices, memory devices, processors, and the like each include a hysteresis comparator in some cases. The hysteresis comparator is an analog voltage comparator in which hysteresis is applied to input comparison voltage. The use of the hysteresis comparator can prevent a change of output voltage due to noise of input voltage, or the like, so that the output voltage can be output stably.

Patent Documents 1 to 4 each disclose a circuit structure in which hysteresis is applied to a comparator. In the case where the hysteresis is applied to the comparator, an element or a circuit needs to be newly provided; thus, the area of the circuit for the comparator is increased. In addition, power consumption is increased for the addition of the circuit.

It is an object of one embodiment of the present invention to provide a novel semiconductor device. Another object of one embodiment of the present invention is to provide a memory device or a module including the novel semiconductor device. Another object of one embodiment of the present invention is to provide an electronic device using the memory device or the module including the novel semiconductor device. Another object of one embodiment of the present invention is to provide a system using the memory device or the module including the novel semiconductor device.

Another object of one embodiment of the present invention is to provide a semiconductor device with a small circuit area. Another object of one embodiment of the present invention is to provide a semiconductor device with low power consumption. Another object of one embodiment of the present invention is to provide a comparator that supplies stable output voltage. Another object of one embodiment of the present invention is to provide an electronic device including the above-described semiconductor device or the above-described comparator.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is a semiconductor device including a first transistor, a second transistor, a third transistor, a first circuit, a second circuit, a first inverter circuit, a first constant current circuit, and a second constant current circuit. The second transistor has a back gate. Each of the first transistor and the second transistor is an n-channel transistor. The third transistor is a p-channel transistor. The first circuit has a first terminal, a second terminal, and a third terminal. The first circuit is configured to output a potential corresponding to current flowing through the first terminal and current flowing through the second terminal from the third terminal. The second circuit has a fourth terminal and a fifth terminal. The second circuit is configured to output one of two potentials from the fifth terminal in accordance with a potential applied to the fourth terminal. The first constant current circuit is configured to make constant current flow from an input terminal of the first constant current circuit to an output terminal of the first constant current circuit. The second constant current circuit is configured to make constant current flow from an input terminal of the second constant current circuit to an output terminal of the second constant current circuit. One of a source and a drain of the first transistor is electrically connected to the first terminal. The other of the source and the drain of the first transistor is electrically connected to the input terminal of the first constant current circuit. One of a source and a drain of the second transistor is electrically connected to the second terminal. The other of the source and the drain of the second transistor is electrically connected to the input terminal of the first constant current circuit. A gate of the third transistor is electrically connected to the third terminal. One of a source and a drain of the third transistor is electrically connected to the input terminal of the second constant current circuit. An input terminal of the first inverter circuit is electrically connected to the one of the source and the drain of the third transistor. An output terminal of the first inverter circuit is electrically connected to the fourth terminal. The fifth terminal is electrically connected to the back gate of the second transistor.

(2) Another embodiment of the present invention is the semiconductor device according to (1), in which the first transistor has a back gate.

(3) Another embodiment of the present invention is the semiconductor device according to (1) or (2), in which the second circuit includes a second inverter circuit, the second inverter circuit includes a fourth transistor, an input terminal of the second inverter circuit is electrically connected to the fourth terminal, an output terminal of the second inverter circuit is electrically connected to the fifth terminal, and a gate of the fourth transistor is electrically connected to the input terminal of the second inverter circuit.

(4) Another embodiment of the present invention is the semiconductor device according to (1) or (2), in which the second circuit includes a fourth transistor and a first resistor, a gate of the fourth transistor is electrically connected to the fourth terminal, one of a source and a drain of the fourth transistor is electrically connected to one terminal of the first resistor, and the fifth terminal is electrically connected to the one of the source and the drain of the fourth transistor.

(5) Another embodiment of the present invention is the semiconductor device according to (1) or (2), in which the second circuit includes a fourth transistor and a first diode, a gate of the fourth transistor is electrically connected to the fourth terminal, one of a source and a drain of the fourth transistor is electrically connected to an output terminal of the first diode, and the fifth terminal is electrically connected to the one of the source and the drain of the fourth transistor.

(6) Another embodiment of the present invention is the semiconductor device according to any one of (3) to (5), in which a channel formation region of the fourth transistor includes an oxide containing at least one of indium, an element M (the element M is aluminum, gallium, yttrium, or tin), and zinc.

(7) One embodiment of the present invention is a semiconductor device including a first transistor, a second transistor, a third transistor, a first circuit, a first inverter circuit, a first constant current circuit, and a second constant current circuit. The second transistor has a back gate. Each of the first transistor and the second transistor is an n-channel transistor. The third transistor is a p-channel transistor. The first circuit has a first terminal, a second terminal, and a third terminal. The first circuit is configured to output a potential corresponding to current flowing through the first terminal and current flowing through the second terminal from the third terminal. The first constant current circuit is configured to make constant current flow from an input terminal of the first constant current circuit to an output terminal of the first constant current circuit. The second constant current circuit is configured to make constant current flow from an input terminal of the second constant current circuit to an output terminal of the second constant current circuit. One of a source and a drain of the first transistor is electrically connected to the first terminal. The other of the source and the drain of the first transistor is electrically connected to the input terminal of the first constant current circuit. One of a source and a drain of the second transistor is electrically connected to the second terminal. The other of the source and the drain of the second transistor is electrically connected to the input terminal of the first constant current circuit. A gate of the third transistor is electrically connected to the third terminal. One of a source and a drain of the third transistor is electrically connected to the input terminal of the second constant current circuit. An input terminal of the first inverter circuit is electrically connected to the one of the source and the drain of the third transistor. The back gate of the second transistor is electrically connected to the one of the source and the drain of the third transistor.

(8) Another embodiment of the present invention is the semiconductor device according to (7), in which the first transistor has a back gate.

(9) Another embodiment of the present invention is the semiconductor device according to (7) or (8), further including a second circuit. The second circuit has a fourth terminal and a fifth terminal. The second circuit is configured to output one of two potentials from the fifth terminal in accordance with a potential applied to the fourth terminal. The second circuit is positioned in an electrical path between the back gate of the second transistor and the one of the source and the drain of the third transistor. The fourth terminal is electrically connected to the one of the source and the drain of the third transistor. The fifth terminal is electrically connected to the back gate of the second transistor.

(10) Another embodiment of the present invention is the semiconductor device according to (9), in which the second circuit includes a buffer circuit, an input terminal of the buffer circuit is electrically connected to the fourth terminal, and an output terminal of the buffer circuit is electrically connected to the fifth terminal.

(11) Another embodiment of the present invention is the semiconductor device according to any one of (1) to (10), in which the first circuit includes a current mirror circuit, the current mirror circuit has a sixth terminal and a seventh terminal, the fourth terminal is electrically connected to the sixth terminal, the fifth terminal is electrically connected to the seventh terminal, and the third terminal is electrically connected to the seventh terminal.

(12) Another embodiment of the present invention is the semiconductor device according to any one of (1) to (10), in which the first circuit includes a second resistor and a third resistor, the first terminal is electrically connected to one terminal of the second resistor, the second terminal is electrically connected to one terminal of the third resistor, and the third terminal is electrically connected to the one terminal of the third resistor.

(13) Another embodiment of the present invention is the semiconductor device according to any one of (1) to (10), in which the first circuit includes a second diode and a third diode, in which the first terminal is electrically connected to an output terminal of the second diode, in which the second terminal is electrically connected to an output terminal of the third diode, and in which the third terminal is electrically connected to the output terminal of the third diode.

(14) Another embodiment of the present invention is the semiconductor device according to any one of (1) to (13), in which the first inverter circuit includes a fifth transistor, and a channel formation region of the fifth transistor includes an oxide containing at least one of indium, an element M (the element M is aluminum, gallium, yttrium, or tin), and zinc.

(15) Another embodiment of the present invention is the semiconductor device according to any one of (1) to (14), in which the first constant current circuit includes a sixth transistor, the second constant current circuit includes a seventh transistor, each of the sixth transistor and the seventh transistor is an n-channel transistor, one of a source and a drain of the sixth transistor is electrically connected to the input terminal of the first constant current circuit, the other of the source and the drain of the sixth transistor is electrically connected to the output terminal of the first constant current circuit, a gate of the sixth transistor is electrically connected to a gate of the seventh transistor, one of a source and a drain of the seventh transistor is electrically connected to the input terminal of the second constant current circuit, the other of the source and the drain of the seventh transistor is electrically connected to the output terminal of the second constant current circuit.

(16) Another embodiment of the present invention is the semiconductor device according to (15), in which each of the sixth transistor and the seventh transistor includes a back gate.

(17) Another embodiment of the present invention is the semiconductor device according to (16), in which the back gate of the sixth transistor is electrically connected to the gate of the sixth transistor, and the back gate of the seventh transistor is electrically connected to the gate of the seventh transistor.

(18) Another embodiment of the present invention is the semiconductor device according to any one of (15) to (17), in which a channel formation region of each of the sixth transistor and the seventh transistor includes an oxide containing at least one of indium, an element M (the element M is aluminum, gallium, yttrium, or tin), and zinc.

(19) Another embodiment of the present invention is the semiconductor device according to any one of (1) to (18), in which a channel formation region of each of the first transistor and the second transistor includes an oxide containing at least one of indium, an element M (the element M is aluminum, gallium, yttrium, or tin), and zinc.

(20) Another embodiment of the present invention is a semiconductor wafer including a plurality of the semiconductor devices according to any one of (1) to (19) and a region for dicing.

(21) Another embodiment of the present invention is an electronic device including the semiconductor device according to any one of (1) to (19) and a housing.

According to one embodiment of the present invention, a novel semiconductor device can be provided. Another embodiment of the present invention can provide a memory device or a module including the novel semiconductor device. Another embodiment of the present invention can provide an electronic device using the memory device or the module including the novel semiconductor device. According to one embodiment of the present invention, a system with the memory device including the novel semiconductor device can be provided.

According to one embodiment of the present invention, a semiconductor device with a small circuit area can be provided. According to one embodiment of the present invention, a semiconductor device with low power consumption can be provided. According to one embodiment of the present invention, a comparator that supplies a stable output voltage can be provided. According to one embodiment of the present invention, an electronic device including the above-described semiconductor device or the above-described comparator can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

In the accompanying drawings:

FIG. 15A is a flow chart showing an example of a method for manufacturing an electronic component, FIG. 15B is a perspective view of the electronic component, and FIGS. 15C to 15E are perspective views of semiconductor wafers;

FIGS. 22A to 22C are a top view and cross-sectional views illustrating a structure example of a transistor;

FIGS. 28A to 28E show structural analysis of a CAAC-OS and a single crystal oxide semiconductor by XRD and selected-area electron diffraction patterns of a CAAC-OS;

DETAILED DESCRIPTION OF THE INVENTION

An "electronic device", an "electronic component", a "module", and a "semiconductor device" are described. In general, an "electronic device" may refer to a personal computer, a mobile phone, a tablet terminal, an e-book reader, a wearable terminal, an audiovisual (AV) device, an electronic appliance, a household appliance, an industrial appliance, a digital signage, a car, or an electric appliance including a system, for example. An "electronic component" or a "module" may refer to a processor, a memory device, a sensor, a battery, a display device, a light-emitting device, an interface device, a radio frequency (RF) tag, a receiver, or a transmitter included in an electronic device. A "semiconductor device" may refer to a device including a semiconductor element or a driver circuit, a control circuit, a logic circuit, a signal generation circuit, a signal conversion circuit, a potential level converter circuit, a voltage source, a current source, a switching circuit, an amplifier circuit, a memory circuit, a memory cell, a display circuit, a display pixel, or the like which includes a semiconductor element and is included in an electronic component or a module.

Embodiment 1

In this embodiment, a hysteresis comparator that is a semiconductor device of one embodiment of the present invention is described.

Structure Example 1

Figure 1:
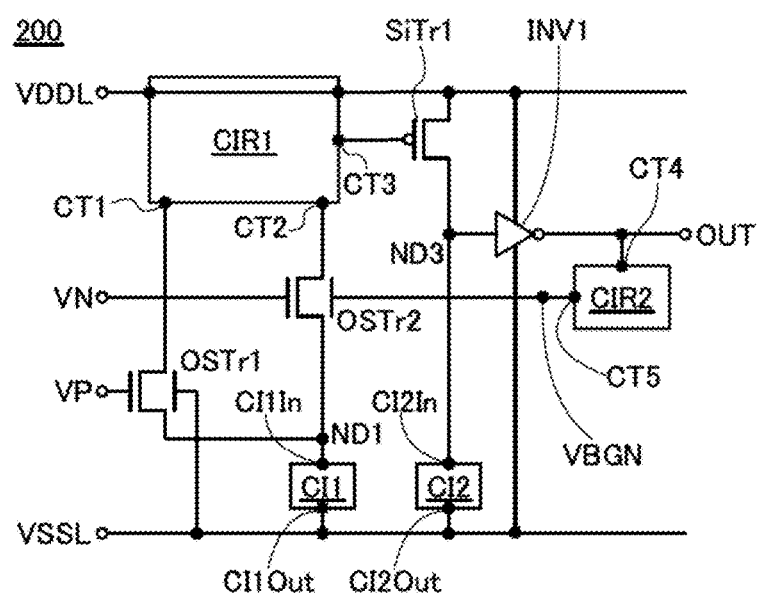
FIG. 1 is a circuit diagram showing an example of a semiconductor device.

FIG. 1 illustrates an example of a semiconductor device of one embodiment of the present invention. A semiconductor device 200 includes a transistor SiTr1, a transistor OSTr1, a transistor OSTr2, a circuit CIR1, a circuit CIR2, an inverter circuit INV1, a constant current circuit CI1, a constant current circuit CI2, an input terminal VN, an input terminal VP, and an output terminal OUT.

The transistor SiTr1 is a p-channel transistor, and each of the transistor OSTr1 and the transistor OSTr2 is an n-channel transistor. In addition, the transistor OSTr1 and the transistor OSTr2 each have a dual-gate structure including a front gate (in this specification, simply referred to as a gate) and a back gate.

A channel formation region of the transistor SiTr1 preferably contains silicon. A channel formation region of each of the transistor OSTr1 and the transistor OSTr2 includes an oxide semiconductor containing at least one of indium, an element M (the element M is aluminum, gallium, yttrium, or tin), and zinc. The transistor OSTr1 and the transistor OSTr2 each preferably have a structure of a transistor described in Embodiment 5. Furthermore, $I_d$-$V_g$ characteristics (source-drain current characteristics with respect to gate-source voltage) of the transistor OSTr1 is preferably the same as $I_d$-$V_g$ characteristics of the transistor OSTr2 when the same potential is applied to the back gates of the transistor OSTr1 and the transistor OSTr2.

The circuit CIR1 has a terminal CT1, a terminal CT2, and a terminal CT3. The circuit CIR1 has a function of outputting to the terminal CT3 a potential corresponding to current flowing through the terminal CT1 and current flowing through the terminal CT2. That is, the circuit CIR1 functions as a current-voltage converter circuit.

The circuit CIR2 has a terminal CT4 and a terminal CT5. The CIR2 has a function of outputting one of two potentials to the terminal CT5 in accordance with a potential applied to the terminal CT4. Note that two potentials can be a low-level potential and a high-level potential, for example.

The constant current circuit CI' has a terminal CI1In and a terminal CI1Out. The terminal CI1In functions as an input terminal and the terminal CI1Out functions as an output terminal. The constant current circuit CI1 has a function of keeping current flowing from the terminal CI1In to the terminal CI1Out constant.

The constant current circuit CI2 has a terminal CI2In and a terminal CI2Out. The terminal CI2In functions as an input terminal and the terminal CI2Out functions as an output terminal. The constant current circuit CI2 has a function of keeping current flowing from the terminal CI2In to the terminal CI2Out constant.

Note that it is preferable that the constant current circuit CI1 and the constant current circuit CI2 have the same circuitry.

The input terminal VP of the semiconductor device 200 functions as a positive input terminal (hereinafter referred to as a non-inverting input terminal) of a comparator, and the input terminal VN of the semiconductor device 200 functions as a negative input terminal (hereinafter referred to as an inverting input terminal) of the comparator.

Note that the semiconductor device 200 is electrically connected to a wiring VDDL and a wiring VSSL so as to be connected to an external power source. The wiring VDDL is a wiring for supplying a high-level potential VDD, and the wiring VSSL is a wiring for supplying a low-level potential VSS.

A first terminal of the transistor OSTr1 is electrically connected to the terminal CT1 of the circuit CIR1, a second terminal of the transistor OSTr1 is electrically connected to the terminal CI1In of the constant current circuit CI1, the gate of the transistor OSTr1 is electrically connected to the input terminal VP, and the back gate of the transistor OSTr1 is electrically connected to the wiring VSSL. A first terminal of the transistor OSTr2 is electrically connected to the terminal CT2 of the circuit CIR1, a second terminal of the transistor OSTr2 is electrically connected to the terminal CI1In of the constant current circuit CI1, the gate of the transistor OSTr2 is electrically connected to the input terminal VN, and the back gate of the transistor OSTr2 is electrically connected to the terminal CT5 of the circuit CIR2. The terminal CI1Out of the constant current circuit CI1 is electrically connected to the wiring VSSL.

The transistor OSTr1 and the transistor OSTr2 function as a differential pair in the semiconductor device 200.

A connection portion of the second terminal of the transistor OSTr1, the second terminal of the transistor OSTr2, and the terminal CI1In of the constant current circuit CI1 is referred to as a node ND1. In addition, a connection portion of the back gate of the transistor OSTr2 and the terminal CT5 of the circuit CIR2 is referred to as a node VBGN.

A first terminal of the transistor SiTr1 is electrically connected to the wiring VDDL, a second terminal of the transistor SiTr1 is electrically connected to the terminal CI2In of the constant current circuit CI2, and a gate of the transistor SiTr1 is electrically connected to the terminal CT3 of the circuit CIR1. The terminal CI2Out of the constant current circuit CI2 is electrically connected to the wiring VSSL.

An input terminal of the inverter circuit INV1 is electrically connected to the terminal CI2In of the constant current circuit CI2, and an output terminal of the inverter circuit INV1 is electrically connected to the output terminal OUT of the semiconductor device 200. The terminal CT4 of the circuit CIR2 is electrically connected to the output terminal of the inverter circuit INV1.

Note that a connection portion of the second terminal of the transistor SiTr1, the terminal CI2In of the constant current circuit CI2, and the input terminal of the inverter circuit INV1 is referred to as a node ND3.

The circuit CIR1 is electrically connected to the wiring VDDL so as to be connected to an external power source. The inverter circuit INV1 is electrically connected to the wiring VDDL and the wiring VSSL so as to be connected to external power sources.

Note that the electrical connection between the circuit CIR2 and the wirings VDDL and VSSL is not illustrated in FIG. 1 and FIG. 2A to FIG. 7 which are described later. The circuit CIR2 needs to be connected to an external power source depending on the internal structure of the circuit CIR2 in some cases. In that case, the circuit CIR2 is electrically connected to the wiring VDDL and the wiring VSSL.

<<Circuit CIR1>>

Here, a structure example of the circuit CIR1 of the semiconductor device 200 is described.

For example, the circuit CIR1 of the semiconductor device 200 may include a current mirror circuit. A semiconductor device 211 shown in FIG. 2A has a structure in which the circuit CIR1 of the semiconductor device 200 includes a current mirror circuit CMC. The current mirror circuit CMC has a terminal CM1 and a terminal CM2. The terminal CM1 of the current mirror circuit CMC is electrically connected to the terminal CT1 of the circuit CIR1, and the terminal CM2 of the current mirror circuit CMC is electrically connected to the terminal CT2 of the circuit CIR1. The terminal CT3 of the circuit CIR1 is electrically connected to the first terminal of the transistor OSTr2 through the terminal CT2 of the circuit CIR1.

Note that a connection portion of the terminal CM2 of the current mirror circuit CMC, the terminal CT2 of the circuit CIR1, and the terminal CT3 of the circuit CIR1 is referred to as a node ND2.

Figure 2A:
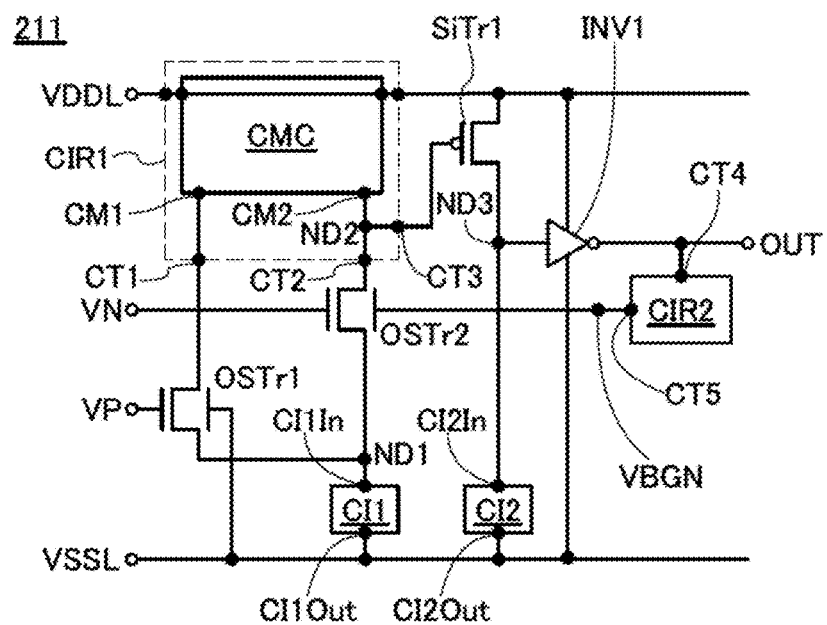
FIGS. 2A and 2B are circuit diagrams showing examples of a semiconductor device and a current mirror circuit.
Figure 2B:
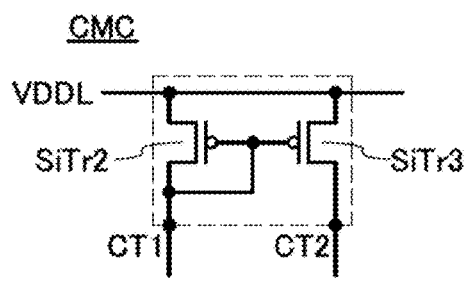

FIG. 2B illustrates an example of the current mirror circuit CMC. The current mirror circuit CMC in FIG. 2B includes a transistor SiTr2 and a transistor SiTr3. Note that each of the transistor SiTr2 and the transistor SiTr3 is a p-channel transistor. A first terminal of the transistor SiTr2 is electrically connected to the wiring VDDL and a second terminal of the transistor SiTr2 is electrically connected to a gate of the transistor SiTr2, a gate of the transistor SiTr3, and the terminal CT1. A first terminal of the transistor SiTr3 is electrically connected to the wiring VDDL, and a second terminal of the transistor SiTr3 is electrically connected to the terminal CT2. Note that the current mirror circuit in the semiconductor device of one embodiment of the present invention is not limited to that having the structure shown in FIG. 2B and may be a current mirror circuit that is different from that shown in FIG. 2B.

Furthermore, for example, the circuit CIR1 of the semiconductor device 200 may include a resistor. A semiconductor device 212 shown in FIG. 3A includes a resistor R1 and a resistor R2 in the circuit CIR1 of the semiconductor device 200. One terminal of the resistor R1 is electrically connected to the terminal CT1 of the circuit CIR1, and the other terminal of the resistor R1 is electrically connected to the wiring VDDL. One terminal of the resistor R2 is electrically connected to the terminal CT2 of the circuit CIR1, and the other terminal of the resistor R2 is electrically connected to the wiring VDDL. The terminal CT3 of the circuit CIR1 is electrically connected to the first terminal of the transistor OSTr2 through the terminal CT2 of the circuit CIR1.

Note that a connection portion of the one terminal of the resistor R2, the terminal CT2 of the circuit CIR1, and the terminal CT3 of the circuit CIR1 is referred to as the node ND2.

For example, the circuit CIR1 in the semiconductor device 200 may include a diode. A semiconductor device 213 shown in FIG. 3B includes a diode D1 and a diode D2 in the circuit CIR1 of the semiconductor device 200. An output terminal of the diode D1 is electrically connected to the terminal CT1 of the circuit CIR1 and an input terminal of the diode D1 is electrically connected to the wiring VDDL. An output terminal of the diode D2 is electrically connected to the terminal CT2 of the circuit CIR1 and an input terminal of the diode D2 is electrically connected to the wiring VDDL. The terminal CT3 of the circuit CIR1 is electrically connected to the first terminal of the transistor OSTr2 through the terminal CT2 of the circuit CIR1.

Note that a connection portion of the output terminal of the diode D2, the terminal CT2 of the circuit CIR1, and the terminal CT3 of the circuit CIR1 is referred to as the node ND2.

Figure 3A:
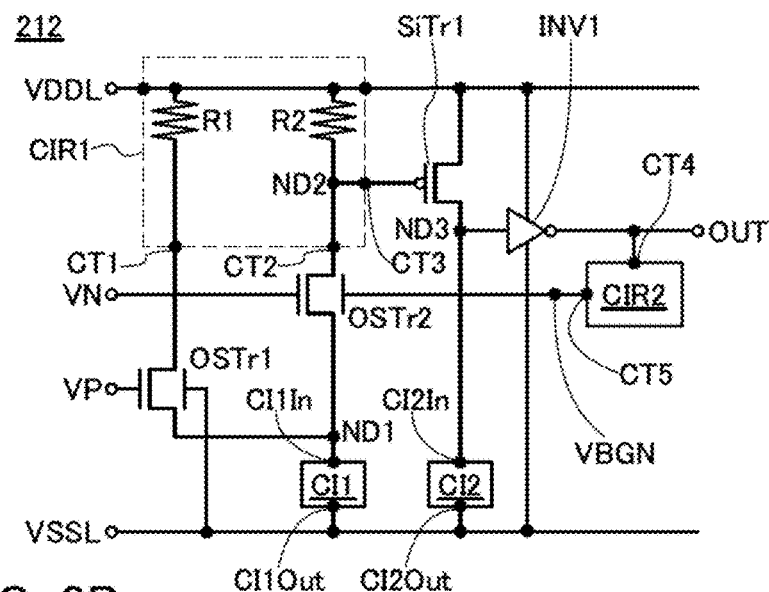
FIGS. 3A and 3B are circuit diagrams each showing an example of a semiconductor device.
Figure 3B:
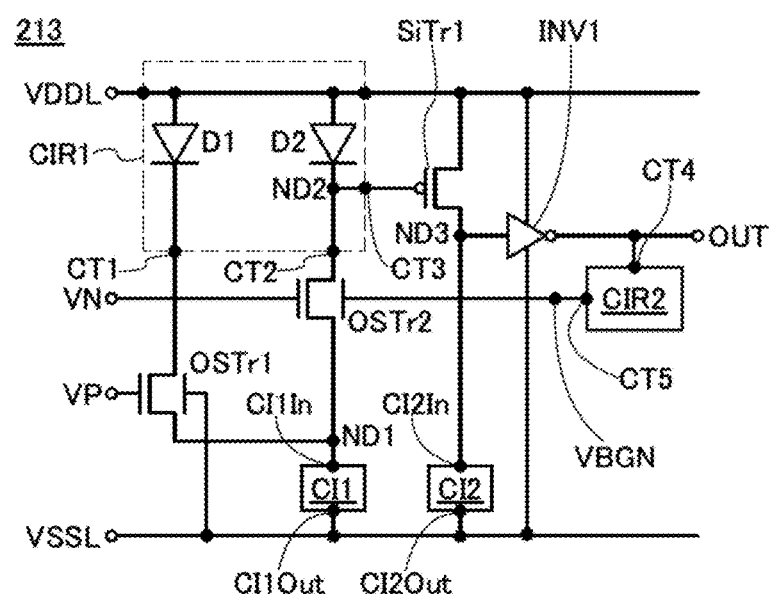

Note that a diode-connected transistor may be used as each of the diode D1 and the diode D2 which are shown in FIG. 3B. The diode-connected transistor is a transistor whose gate and drain are electrically connected to each other. In the case of using the diode-connected transistors, manufacturing steps of the semiconductor device 213 can be reduced by forming the diode-connected transistors using the same material and the same structure as the transistor OSTr1 and the transistor OSTr2. Furthermore, the manufacturing steps of the semiconductor device 213 can also be reduced by forming the diode-connected transistors using the same material and the same structure as the transistor SiTr1. Furthermore, the manufacturing steps of the semiconductor device 213 can also be reduced by forming the diode-connected transistors using the same material and the same structure as a transistor included in any of the inverter circuit INV1, the constant current circuit CI1, the constant current circuit CI2, and the circuit CIR2.

When the circuit CIR1 of the semiconductor device 200 has any one of the above-described structures of the circuit CIR1 of the semiconductor device 211, the circuit CIR1 of the semiconductor device 212, and the circuit CIR1 of the semiconductor device 213, the circuit CIR1 can function as a current-voltage converter circuit which outputs to the terminal CT3 a potential corresponding to current flowing through the terminal CT1 and current flowing through the terminal CT2.

Note that one embodiment of the present invention is not limited to any of the structures of the semiconductor device 211, the semiconductor device 212, and the semiconductor device 213. The circuit CIR1 may be different from that in the semiconductor device 211, the semiconductor device 212, or the semiconductor device 213 as long as it has a function of the current-voltage converter circuit.

<<Constant Current Circuit CI1, CI2>>

Next, specific circuit structures that can be applied to the constant current circuit CI1 and the constant current circuit CI2 of the semiconductor device 200 are described.

For example, the constant current circuit CI1 and the constant current circuit CI2 each may include a transistor. A semiconductor device 221 shown in FIG. 4A includes a transistor OSTr3 and a transistor OSTr4 in the constant current circuit CI1 and the constant current circuit CI2 of the semiconductor device 200, respectively.

A wiring VBIASL is a wiring for supplying a potential to a gate of the transistor OSTr3 and a gate of the transistor OSTr4.

A first terminal of the transistor OSTr3 is electrically connected to the terminal CI1In of the constant current circuit CI1, a second terminal of the transistor OSTr3 is electrically connected to the terminal CI1Out of the constant current circuit CI1, and a gate of the transistor OSTr3 is electrically connected to the wiring VBIASL. A first terminal of the transistor OSTr4 is electrically connected to the terminal CI2In of the constant current circuit CI2, a second terminal of the transistor OSTr4 is electrically connected to the terminal CI2Out of the constant current circuit CI2, and a gate of the transistor OSTr4 is electrically connected to the wiring VBIASL.

Figure 4A:
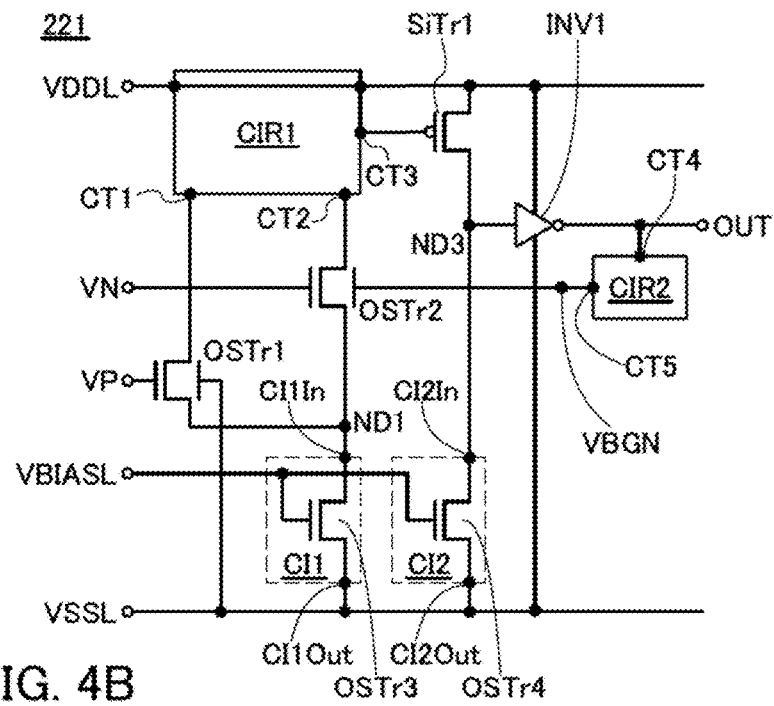
FIGS. 4A and 4B are circuit diagrams each showing an example of a semiconductor device.

For example, the transistor OSTr3 and the transistor OSTr4 in the semiconductor device 221 shown in FIG. 4A each may have a dual-gate structure. In a semiconductor device 222 shown in FIG. 4B, the transistor OSTr3 and the transistor OSTr4 each have a dual-gate structure including a gate and a back gate. The back gate of the transistor OSTr3 is electrically connected to a wiring BGL3 and the back gate of the transistor OSTr4 is electrically connected to a wiring BGL4. With this connection structure, the threshold voltage of each of the transistor OSTr3 and the transistor OSTr4 can be controlled by application of potentials to the wirings BGL3 and BGL4.

Figure 4B:
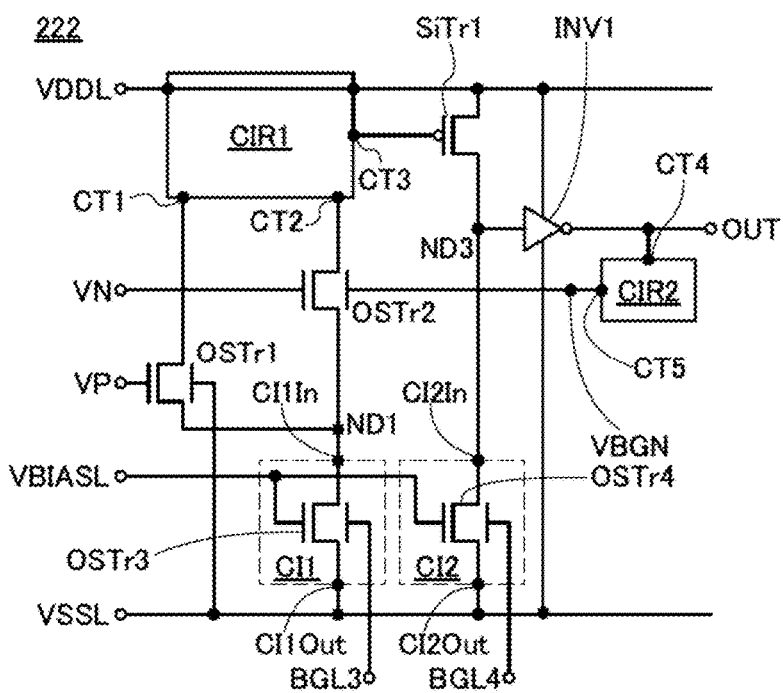
Figure 5A:
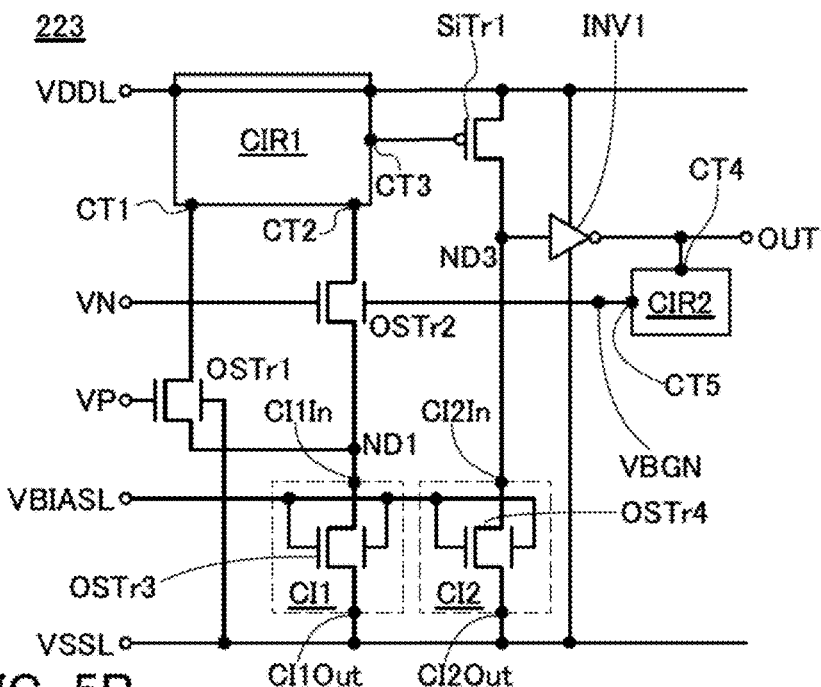
FIGS. 5A and 5B are circuit diagrams each showing an example of a semiconductor device.

For example, the structure of the semiconductor device 222 shown in FIG. 4B may be changed to the structure of a semiconductor device 223 shown in FIG. 5A. The semiconductor device 223 has a structure in which connection destinations of the back gates of the transistor OSTr3 and the transistor OSTr4 in the semiconductor device 222 are changed. The back gate of the transistor OSTr3 is electrically connected to the gate of the transistor OSTr3. The back gate of the transistor OSTr4 is electrically connected to the gate of the transistor OSTr4. This connection structure enables the same potential to be applied to the gate and the back gate of each of the transistor OSTr3 and the transistor OSTr4. Thus, on-state current in the conduction state of each of the transistors can be increased. That is, with the structure of the semiconductor device 223, the speed of change in potential applied to the wirings, elements, and the like in the circuit is increased, so that the operation speed of the hysteresis comparator can be increased.

Figure 5B:
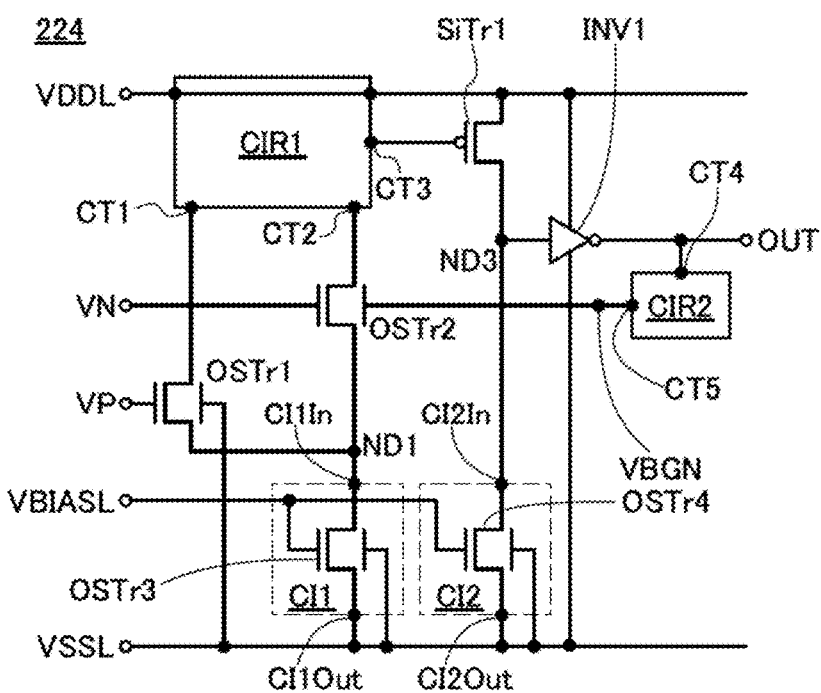

For example, the structure of the semiconductor device 222 shown in FIG. 4B may be that of a semiconductor device 224 shown in FIG. 5B. Besides the semiconductor device 223, the semiconductor device 224 has a structure in which connection destinations of the back gates of the transistor OSTr3 and the transistor OSTr4 of the semiconductor device 222 are changed. The back gate of the transistor OSTr3 and the back gate of the transistor OSTr4 are each electrically connected to the wiring VSSL. This connection structure enables application of a low-level potential VSS to the back gate of each of the transistor OSTr3 and the transistor OSTr4. Accordingly, the threshold voltages of the transistor OSTr3 and the transistor OSTr4 can be shifted in the positive direction and thus current flowing through the transistor OSTr3 and the transistor OSTr4 can be reduced. The structure of the semiconductor device 224 can prevent excessive current from flowing through the hysteresis comparator.

Note that the structure of a semiconductor device of one embodiment of the present invention is not limited to any of the structures of the semiconductor device 221, the semiconductor device 222, the semiconductor device 223, and the semiconductor device 224. The constant current circuit CI1 and the constant current circuit CI2 may be different from those in the semiconductor device 221, the semiconductor device 222, the semiconductor device 223, and the semiconductor device 224 as long as they each function as a constant current circuit.

<<Inverter Circuit INV1>>

Next, examples of an internal structure of the inverter circuit INV1 is described.

Figure 6A:
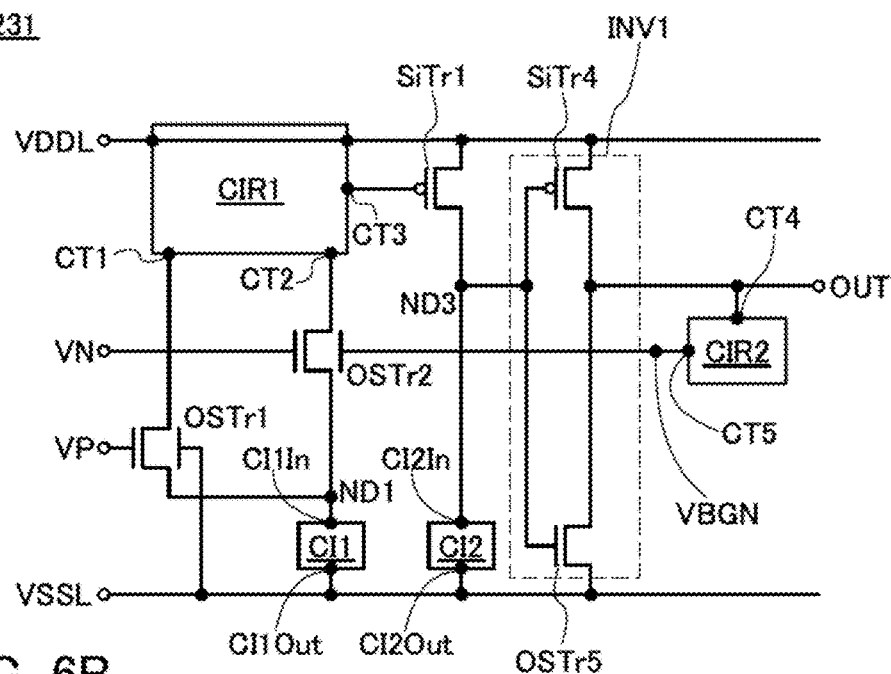
FIGS. 6A and 6B are circuit diagrams each showing an example of a semiconductor device.

FIG. 6A is a circuit diagram of a semiconductor device 231 illustrating the internal structure of the inverter circuit INV1.

In the semiconductor device 231, the inverter circuit INV1 includes a transistor SiTr4 and a transistor OSTr5.

A channel formation region of the transistor OSTr5 preferably includes an oxide semiconductor containing at least one of indium, an element M (the element M is aluminum, gallium, yttrium, or tin), and zinc. Furthermore, the transistor OSTr5 is preferably a transistor described in Embodiment 5.

In the inverter circuit INV1 of the semiconductor device 231, a first terminal of the transistor SiTr4 is electrically connected to the wiring VDDL, a second terminal of the transistor SiTr4 is electrically connected to a first terminal of the transistor OSTr5 and the output terminal of the inverter circuit INV1, and a gate of the transistor SiTr4 is electrically connected to a gate of the transistor OSTr5 and the input terminal of the inverter circuit INV1. A second terminal of the transistor OSTr5 is electrically connected to the wiring VSSL.

Note that the structure of the inverter circuit INV1 of the semiconductor device of one embodiment of the present invention is not limited to that of the inverter circuit INV1 of the semiconductor device 231 shown in FIG. 6A. The internal structure of the inverter circuit INV1 can be changed depending on circumstances or conditions or as needed.

For example, although the transistor OSTr5 of the semiconductor device 231 in FIG. 6A has a single-gate structure, it may have a dual-gate structure. A semiconductor device 232 in FIG. 6B has a structure in which the transistor OSTr5 of the semiconductor device 231 in FIG. 6A is changed to have a dual-gate structure. The transistor OSTr5 has a gate and a back gate. The back gate of the transistor OSTr5 is electrically connected to a wiring BGL5. With this connection structure, the threshold voltage of the transistor OSTr5 can be controlled by application of a potential to the wiring BGL5.

Figure 6B:
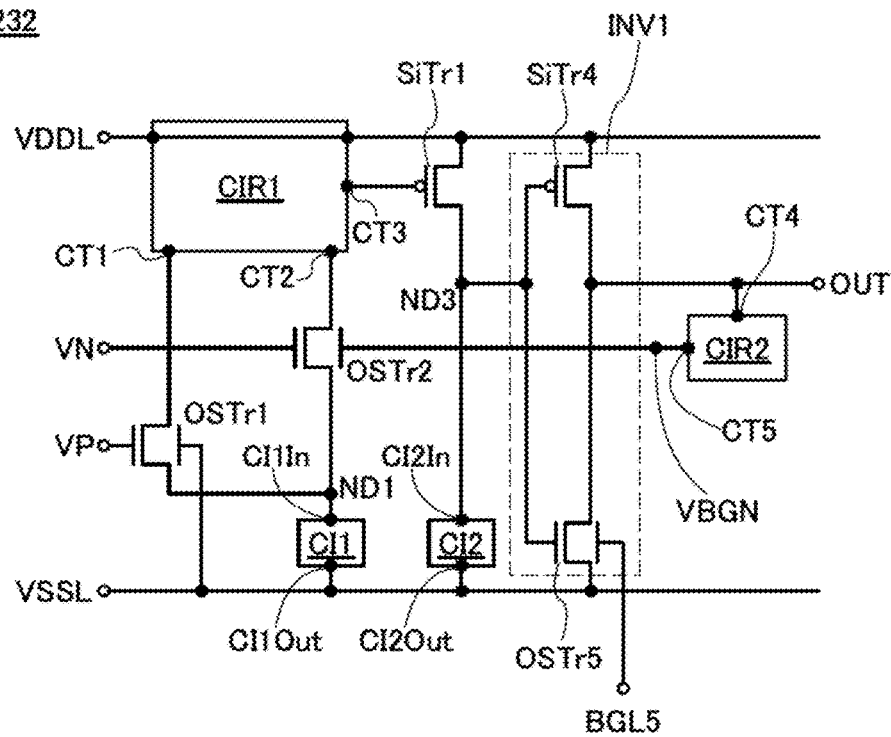

For example, the connection structure of the back gate of the transistor OSTr5 of the semiconductor device 232 in FIG. 6B may be changed. A semiconductor device 233 in FIG. 7A has a structure in which a connection destination of the back gate of the transistor OSTr5 of the semiconductor device 232 shown in FIG. 6B is changed. The back gate of the transistor OSTr5 is electrically connected to the gate of the transistor SiTr4. This connection structure enables the same potential to be applied to the back gate and the gate of the transistor OSTr5. Thus, on-state current in the conduction state of the transistor OSTr5 can be increased. That is, with the structure of the semiconductor device 233, the operation speed of the hysteresis comparator can be increased.

Figure 7A:
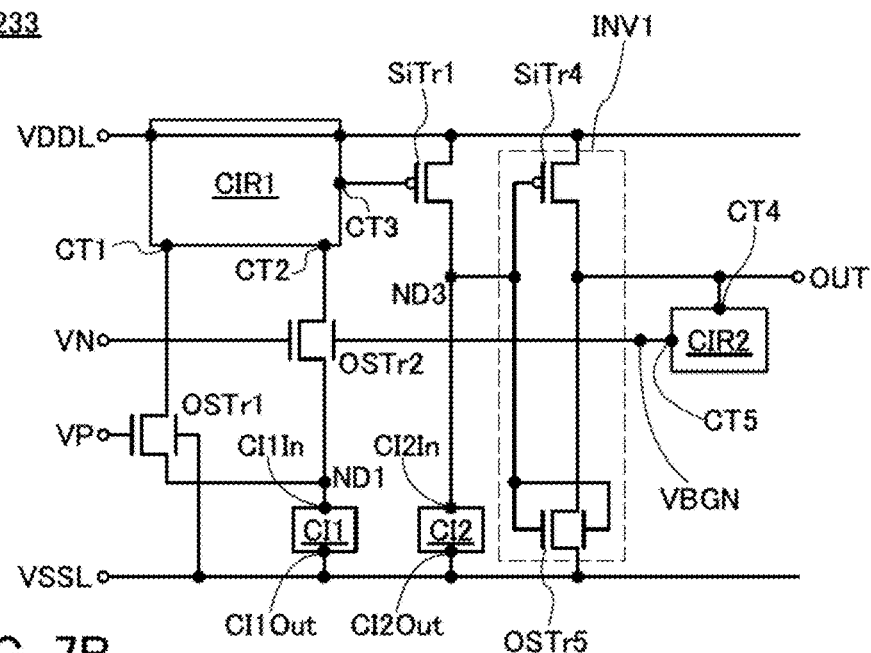
FIGS. 7A and 7B are circuit diagrams each showing an example of a semiconductor device.
Figure 7B:
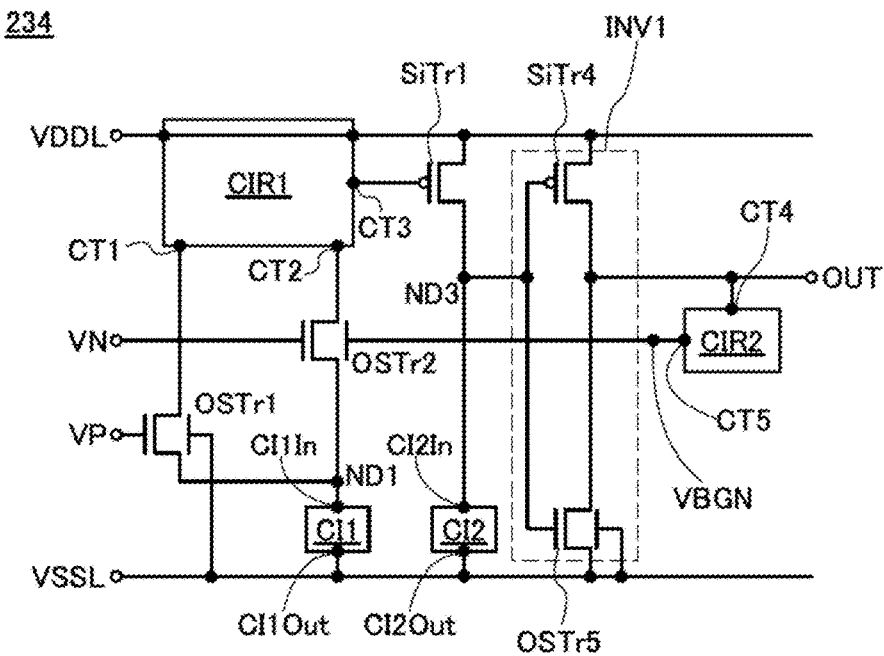

For example, besides the semiconductor device 233 in FIG. 7A, the connection structure of the back gate of the transistor OSTr5 of the semiconductor device 232 in FIG. 6B may be changed. A semiconductor device 234 shown in FIG. 7B has a structure in which the connection destination of the back gate of the transistor OSTr5 of the semiconductor device 232 in FIG. 6B is changed in a manner different from that of the semiconductor device 233 in FIG. 7A. The back gate of the transistor OSTr5 is electrically connected to the wiring VSSL. With this connection structure, a low-level potential VSS can be applied to the back gate of the transistor OSTr5. Accordingly, the threshold voltage of the transistor OSTr5 can be shifted in the positive direction and thus current flowing through the transistor OSTr5 can be reduced. The structure of the semiconductor device 234 can prevent excessive current from flowing through the hysteresis comparator.

<<Circuit CIR2>>

Next, a specific circuit structure that can be applied to the circuit CIR2 of the semiconductor device 200 is described.

Figure 8A:
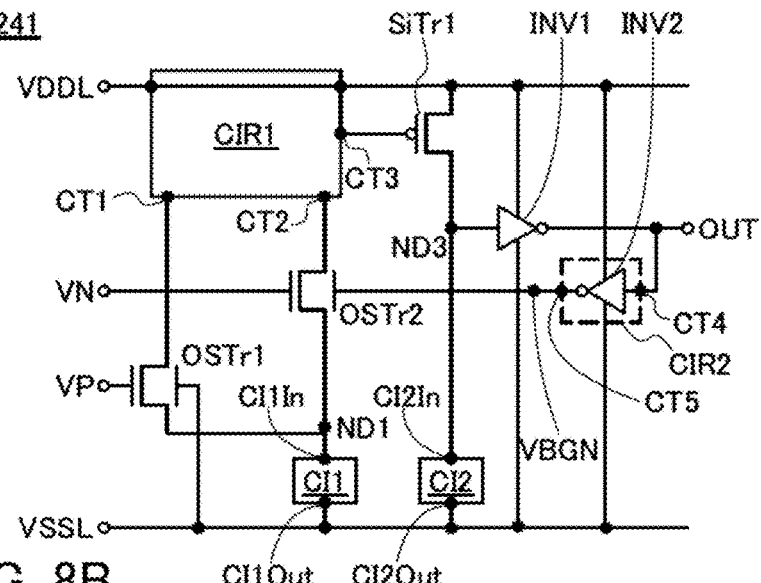
FIGS. 8A and 8B are circuit diagrams each showing an example of a semiconductor device.

For example, the circuit CIR2 may include an inverter circuit. A semiconductor device 241 shown in FIG. 8A has a structure in which the circuit CIR2 of the semiconductor device 200 includes an inverter circuit INV2. An input terminal of the inverter circuit INV2 is electrically connected to the terminal CT4 of the circuit CIR2, and an output terminal of the inverter circuit INV2 is electrically connected to the terminal CT5 of the circuit CIR2. Note that the inverter circuit INV2 is electrically connected to the wiring VDDL and the wiring VSSL so as to be connected to external power sources.

Figure 8B:
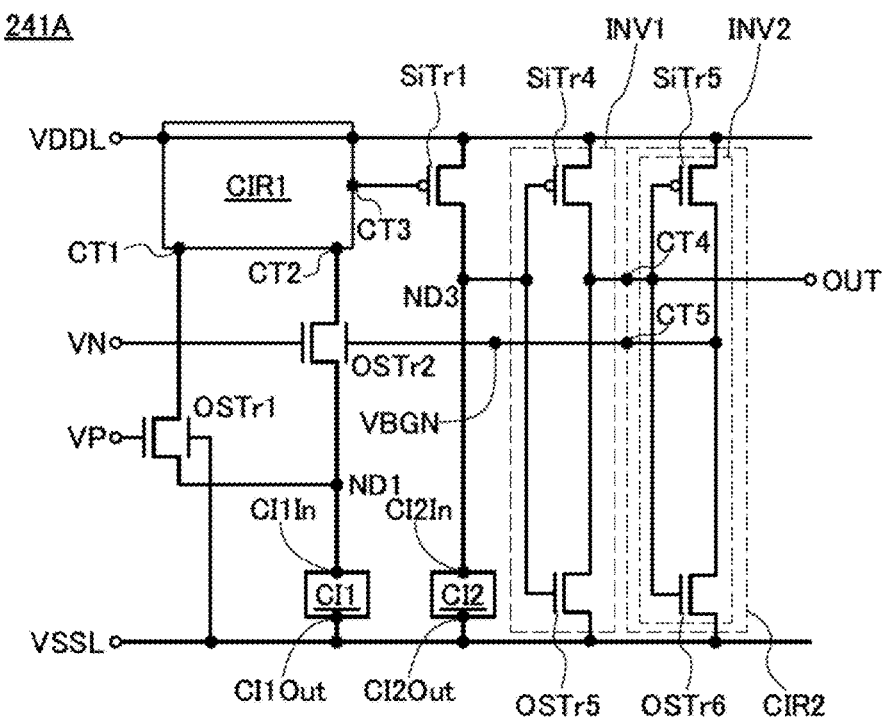

The inverter circuit INV2 of the semiconductor device 241 may have the same circuit structure as the inverter circuit INV1 of the semiconductor device 231 in FIG. 6A. FIG. 8B is a circuit diagram of a semiconductor device 241A showing an example of the internal structures of the inverter circuit INV1 and the inverter circuit INV2.

In the semiconductor device 241A, the inverter circuit INV1 includes the transistor SiTr4 and the transistor OSTr5, and the inverter circuit INV2 includes a transistor SiTr5 and a transistor OSTr6.

A channel formation region of each of the transistor OSTr5 and the transistor OSTr6 preferably includes an oxide semiconductor containing at least one of indium, an element M (the element M is aluminum, gallium, yttrium, or tin), and zinc. Furthermore, each of the transistor OSTr5 and the transistor OSTr6 is preferably a transistor described in Embodiment 5.

For the example of the circuit structure inside the inverter circuit INV1 of the semiconductor device 241A, refer to the description of the inverter circuit INV1 of the semiconductor device 231. In the inverter circuit INV2 of the semiconductor device 241A, a first terminal of the transistor SiTr5 is electrically connected to the wiring VDDL, a second terminal of the transistor SiTr5 is electrically connected to a first terminal of the transistor OSTr6 and an output terminal of the inverter circuit INV2, and a gate of the transistor SiTr5 is electrically connected to a gate of the transistor OSTr6 and the input terminal of the inverter circuit INV2. The second terminal of the transistor OSTr5 is electrically connected to the wiring VSSL. The terminal CT4 of the circuit CIR2 is electrically connected to the input terminal of the inverter circuit INV2, and the terminal CT5 of the circuit CIR2 is electrically connected to the output terminal of the inverter circuit INV2.

Figure 9A:
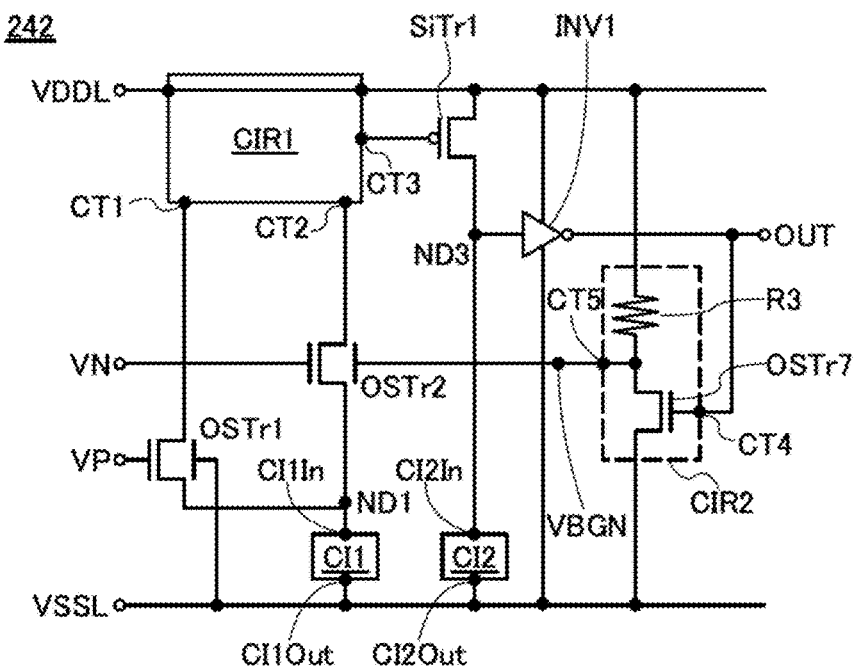
FIGS. 9A and 9B are circuit diagrams each showing an example of a semiconductor device.

For example, the circuit CIR2 may include a resistor and a transistor. The semiconductor device 242 shown in FIG. 9A has a structure in which the circuit CIR2 of the semiconductor device 200 includes a resistor R3 and a transistor OSTr7. A first terminal of the transistor OSTr7 is electrically connected to one terminal of the resistor R3, a second terminal of the transistor OSTr7 is electrically connected to the wiring VSSL, and a gate of the transistor OSTr7 is electrically connected to the terminal CT4 of the circuit CIR2. The other terminal of the resistor R3 is electrically connected to the wiring VDDL. The terminal CT5 of the circuit CIR2 is electrically to the first terminal of the transistor OSTr7.

Figure 9B:
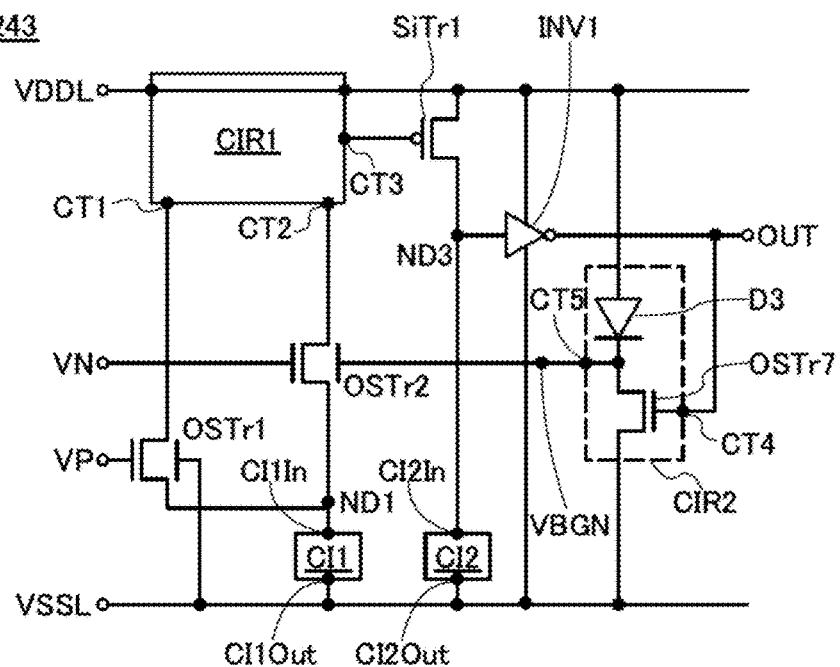

For example, the circuit CIR2 may include a diode and a transistor. A semiconductor device 243 in FIG. 9B has a structure in which the circuit CIR2 of the semiconductor device 200 includes a diode D3 and a transistor OSTr7. A first terminal of the transistor OSTr7 is electrically connected to an output terminal of the diode D3, a second terminal of the transistor OSTr7 is electrically connected to the wiring VSSL, and a gate of the transistor OSTr7 is electrically connected to the terminal CT4 of the circuit CIR2. An input terminal of the diode D3 is electrically connected to the wiring VDDL. The terminal CT5 of the circuit CIR2 is electrically to the first terminal of the transistor OSTr7.

A channel formation region of the transistor OSTr7 included in the circuit CIR2 of each of the semiconductor device 242 and the semiconductor device 243 preferably includes an oxide semiconductor containing at least one of indium, an element M (the element M is aluminum, gallium, yttrium, or tin), and zinc. Furthermore, the transistor OSTr7 further preferably has a structure of a transistor described in Embodiment 5.

As described above, having any of the structures in the semiconductor device 241, the semiconductor device 242, and the semiconductor device 243, the circuit CIR2 can output one of two potentials to the terminal CT5 in accordance with a potential applied to the terminal CT4.

Note that one embodiment of the present invention is not limited to any of the structures of the semiconductor device 241, the semiconductor device 242, and the semiconductor device 243. The circuit CIR2 may be different from that in the semiconductor device 241, the semiconductor device 242, and the semiconductor device 243 as long as it has a function of outputting one of two potentials in accordance with an input potential.

The semiconductor device of one embodiment of the present invention may have a structure in which the above-described structures are combined depending on circumstances or conditions or as needed.

Structure Example 2

Figure 10:
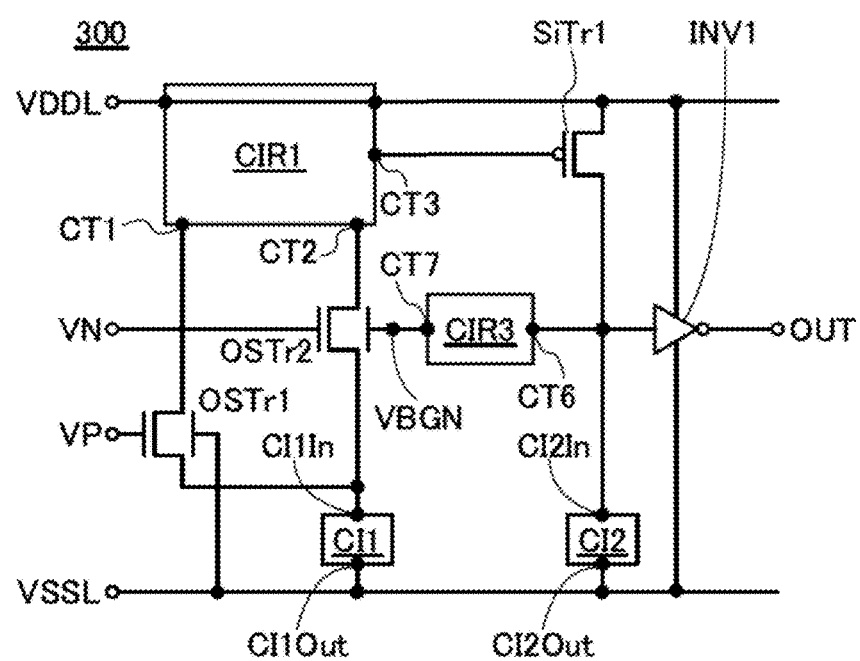
FIG. 10 is a circuit diagram showing an example of a semiconductor device.

FIG. 10 shows another example of a semiconductor device that is different from the semiconductor device 200 in FIG. 1. A semiconductor device 300 has a circuit structure of the semiconductor device 200 from which the circuit CIR2 is removed and to which a circuit CIR3 is added. That is, the semiconductor device 300 includes the transistor SiTr1, the transistor OSTr1, the transistor OSTr2, the circuit CIR1, the circuit CIR3, the inverter circuit INV1, the constant current circuit CI1, the constant current circuit CI2, the input terminal VN, the input terminal VP, and the output terminal OUT.

As in the semiconductor device 200, the channel formation region of the transistor SiTr1 in the semiconductor device 300 preferably contains silicon. The channel formation region of each of the transistor OSTr1 and the transistor OSTr2 preferably includes an oxide semiconductor containing at least one of indium, an element M (the element M is aluminum, gallium, yttrium, or tin), and zinc. The transistor OSTr1 and the transistor OSTr2 each preferably have a structure of a transistor described in Embodiment 5. Furthermore, $I_d$-$V_g$ characteristics (source-drain current characteristics with respect to gate-source voltage) of the transistor OSTr1 is preferably the same as $I_d$-$V_g$ characteristics of the transistor OSTr2 when the same potential is applied to the back gates of the transistor OSTr1 and the transistor OSTr2.

In the semiconductor device 300, the circuit CIR1 functions as a current-voltage converter circuit, as in the semiconductor device 200. Note that for the details of the circuit CIR1, the description of the circuit CIR1 of the semiconductor device 200 can be referred.

As in the semiconductor device 200, the constant current circuit CI1 in the semiconductor device 300 has the terminal CI1In and the terminal CI1Out and has a function of keeping current flowing from the terminal CI1In to the terminal CI1Out constant. Note that for the details of the constant current circuit CI1, the description of the constant current circuit CI1 in the semiconductor device 200 can be referred.

As in the semiconductor device 200, the constant current circuit CI2 in the semiconductor device 300 has the terminal CI2In and the terminal CI2Out and has a function of keeping current flowing from the terminal CI2In to the terminal CI2Out constant. Note that for the details of the constant current circuit CI2, the description of the constant current circuit CI2 in the semiconductor device 200 can be referred.

The circuit CIR3 has a terminal CT6 and a terminal CT7. The circuit CIR3 has a function of outputting one of two potentials to the terminal CT7 in accordance with a potential applied to the terminal CT6.

The input terminal VP of the semiconductor device 300 functions as a non-inverting input terminal of the comparator, and the input terminal VN of the semiconductor device 300 functions as an inverting input terminal of the comparator.

The semiconductor device 300 is electrically connected to the wiring VDDL and the wiring VSSL so as to be connected to external power sources. The wiring VDDL is a wiring for supplying a high-level potential VDD, and the wiring VSSL is a wiring for supplying a low-level potential VSS.

The first terminal of the transistor OSTr1 is electrically connected to the terminal CT1 of the circuit CIR1, the second terminal of the transistor OSTr1 is electrically connected to the terminal CI1In of the constant current circuit CI1, the gate of the transistor OSTr1 is electrically connected to the input terminal VP, and the back gate of the transistor OSTr1 is electrically connected to the wiring VSSL. The first terminal of the transistor OSTr2 is electrically connected to the terminal CT2 of the circuit CIR1, the second terminal of the transistor OSTr2 is electrically connected to the terminal CI1In of the constant current circuit CI1, the gate of the transistor OSTr2 is electrically connected to the input terminal VN, and the back gate of the transistor OSTr2 is electrically connected to the terminal CT7 of the circuit CIR3. Note that a connection portion of the back gate of the transistor OSTr2 and the terminal CT7 of the circuit CIR3 is referred to as the node VBGN. The terminal CI1Out of the constant current circuit CI' is electrically connected to the wiring VSSL.

The transistor OSTr1 and the transistor OSTr2 function as a differential pair in the semiconductor device 300.

The first terminal of the transistor SiTr1 is electrically connected to the wiring VDDL, the second terminal of the transistor SiTr1 is electrically connected to the terminal CI2In of the constant current circuit CI2, and the gate of the transistor SiTr1 is electrically connected to the terminal CT3 of the circuit CIR1. The terminal CI2Out of the constant current circuit CI2 is electrically connected to the wiring VSSL. The terminal CT6 of the circuit CIR3 is electrically connected to the terminal CI2In of the constant current circuit CI2.

The input terminal of the inverter circuit INV1 is electrically connected to the terminal CI2In of the constant current circuit CI2, and the output terminal of the inverter circuit INV1 is electrically connected to the output terminal OUT of the semiconductor device 300.

Note that electrical connection between the circuit CIR3 and the wirings VDDL and VSSL is not illustrated in FIG. 10. The circuit CIR3 needs to be connected to an external power source depending on the internal structure of the circuit CIR3 in some cases. In that case, the circuit CIR3 is electrically connected to the wiring VDDL and the wiring VSSL.

<<Circuit CIR3>>

Here, a structure example of the circuit CIR3 of the semiconductor device 300 is described.

Figure 11A:
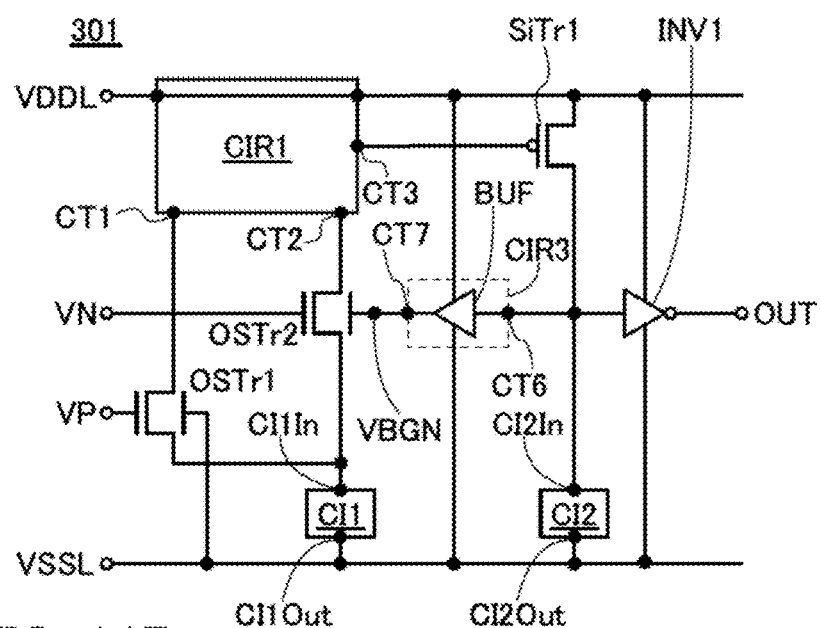
FIGS. 11A and 11B are circuit diagrams each showing an example of a semiconductor device.

For example, the circuit CIR3 of the semiconductor device 300 may include a buffer circuit. A semiconductor device 301 in FIG. 11A includes a buffer circuit BUF in the circuit CIR3 of the semiconductor device 300.

The buffer circuit BUF has a function of outputting a high-level potential VDD from an output terminal of the buffer circuit BUF when a potential applied to an input terminal of the buffer circuit BUF is higher than a predetermined threshold voltage and outputting a low-level potential VSS from the output terminal of the buffer circuit BUF when a potential applied to the input terminal of the buffer circuit BUF is lower than the predetermined threshold voltage.

The input terminal of the buffer circuit BUF is electrically connected to the terminal CT6 of the circuit CIR3 and the output terminal of the buffer circuit BUF is electrically connected to the terminal CT7 of the circuit CIR3. In addition, the circuit CIR3 is electrically connected to the wiring VDDL and the wiring VSSL so as to be connected to external power sources.

With this structure, the potential of the terminal CT6 can be restored to a predetermined level to be output to the terminal CT7.

Note that one embodiment of the present invention is not limited to the structure of the semiconductor device 301. The circuit CIR3 may be different from that in the semiconductor device 301 as long as it has a function of outputting one of two potentials in accordance with an input potential as described above.

Figure 11B:
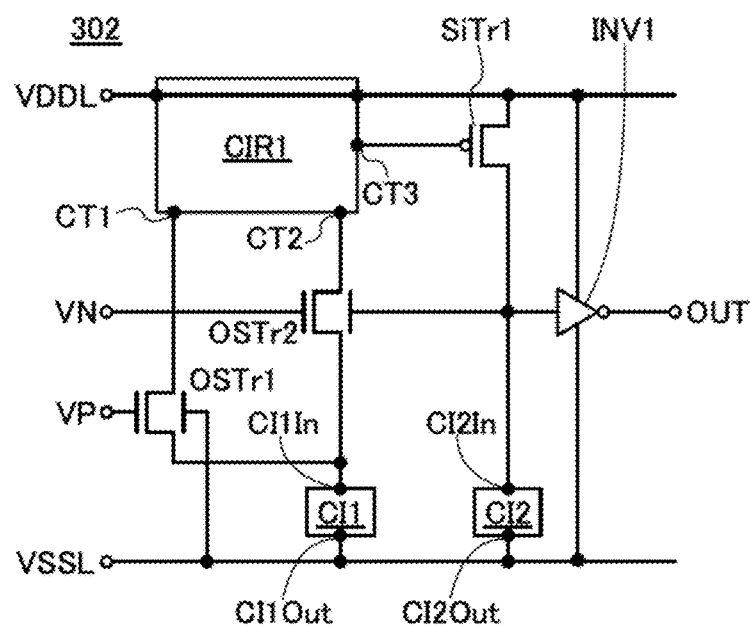

The circuit CIR3 may be omitted as in a semiconductor device 302 in FIG. 11B when it is not necessary to restore and output a potential using the circuit CIR3 of the semiconductor device 301. The semiconductor device 302 can have a simpler circuit structure than the semiconductor device 301; thus, the circuit area can be reduced.

The semiconductor device in Structure example 2 may be combined with the circuit of any of the semiconductor devices in Structure example 1 depending on circumstances or conditions or as needed.

Operation Example

Figure 12:
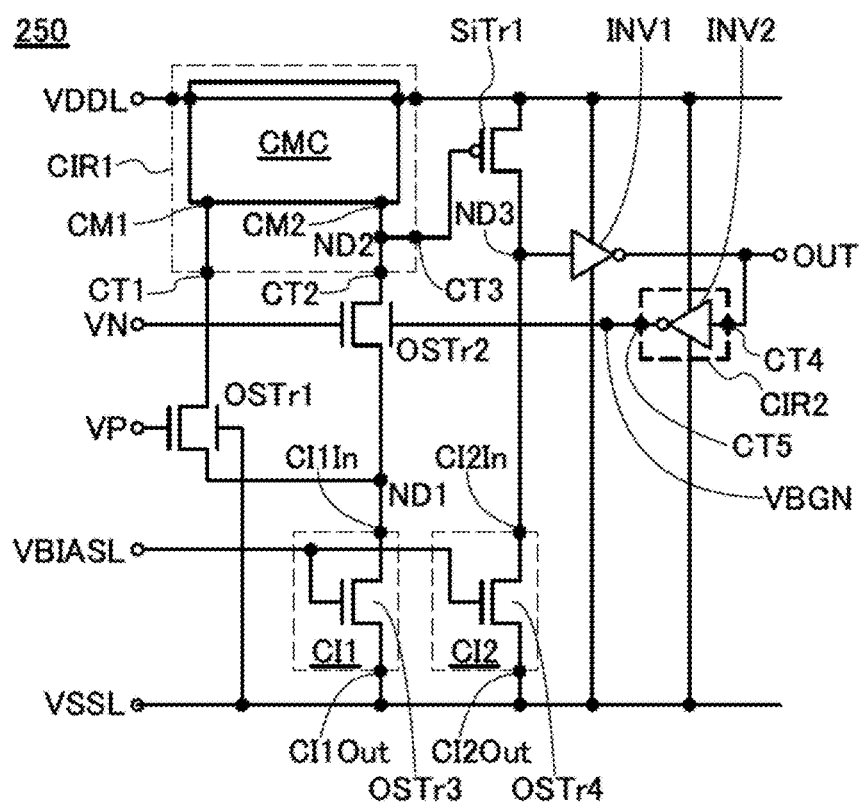
FIG. 12 is a circuit diagram showing an example of a semiconductor device.

Here, an example of the operation of the semiconductor device of one embodiment of the present invention is described. In the description of this operation example, a semiconductor device 250 in FIG. 12 is used. The semiconductor device 250 is a hysteresis comparator in which the circuit CIR1 shown in the semiconductor device 211, the constant current circuit CI' and the constant current circuit CI2 which are shown in the semiconductor device 221, and the circuit CIR2 shown in the semiconductor device 241 are combined.

Figure 13:
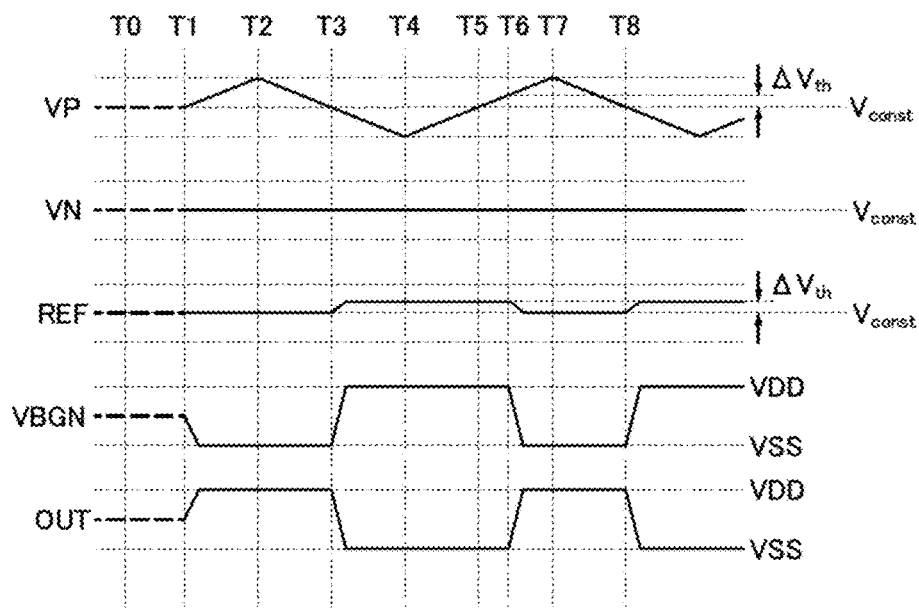
FIG. 13 is a timing chart showing an operation example of the semiconductor device shown in FIG. 12.

The operation example of the semiconductor device 250 is shown in the timing chart in FIG. 13. The timing chart in FIG. 13 shows a change in the potential of each of the input terminal VP, the input terminal VN, the node VBGN, and the output terminal OUT in Time T0 to Time T8. In addition, REF denotes a change in an effective reference potential in the semiconductor device 250.

Here, the effective reference potential REF is described. In general, an effective reference potential in a comparator is often defined as a potential applied to the inverting input terminal; however, in the hysteresis comparator of the semiconductor device 250, the threshold voltage of the transistor OSTr2 is changed when a potential is applied to the back gate of the transistor OSTr2 serving as one of the differential pair and thus the potential applied to the input terminal VN does not directly correspond to the reference potential. In that case, the effective reference potential REF of the hysteresis comparator of the semiconductor device 250 is a potential that is the sum of the potential applied to the input terminal VN and the amount of change in the threshold voltage.

<<Time T0 to Time T1>>

Time T0 is an initial state, and a potential that is neither high nor low is applied to each of the input terminal VP and the input terminal VN. Thus, the reference potential REF, the potential of the node VBGN, and the potential of the output terminal become indefinite. Note that in FIG. 13, the potential of the input terminal VP, the potential of the input terminal VN, the reference potential REF, the potential of the node VBGN, and the potential of the output terminal OUT before Time T1 are indicated by dashed lines.

When the semiconductor device 250 operates, a predetermined potential is applied to the wiring VBIASL. Accordingly, current $I_3$ flows between a source and a drain of the transistor OSTr3 and a source and a drain of the transistor OSTr4 on the basis of the predetermined potential.

<<Time T1 to Time T2>>

At Time T1, a constant potential $V_{const}$ is applied to the input terminal VN. In addition, in a period from Time T1 to Time T2, a potential that is higher than the constant potential $V_{const}$ is applied to the input terminal VP. Note that the potential applied to the input terminal VP has increased over the period from Time T1 to Time T2.

By the input of the potential to the input terminal VP, the potential is applied to the gate of the transistor OSTr1. Thus, current $I_1$ flows between the source and the drain of the transistor OSTr1. Note that over the period from Time T1 to Time T2, the potential applied to the input terminal VP has increased; thus, the current $I_1$ is increased in that period. The current $I_1$ flows from the terminal CM1 of the current mirror circuit CMC to the node ND1 through the transistor OSTr1.

Note that $I_2$ is current flowing between a source and a drain of the transistor OSTr2. Since the current $I_1$ flows through the terminal CM1 of the current mirror circuit CMC, the amount of the current $I_2$ flowing through the terminal CM2 tends to be the same as that of the current $I_1$ in accordance with the principle of the current mirror circuit. However, the current $I_2$ becomes smaller than the current $I_1$ since the potential $V_{const}$ that is lower than the potential of the gate of the transistor OSTr1 is applied to the gate of the transistor OSTr2. Thus, the amount of charge flowing from the terminal CM2 to the node ND2 is increased, thereby increasing the potential of the node ND2. Accordingly, the potential of the gate of the transistor SiTr1 is increased and the amount of current flowing between the source and the drain of the transistor SiTr1 is reduced. Furthermore, the transistor SiTr1 becomes off depending on the level of the potential of the node ND2.

In accordance with Kirchhoff's low, the current $I_3$ becomes equal to the sum of the current $I_1$ and the current $I_2$.

Here, the potential of the node ND3 is described. In the period from Time T1 to Time T2, the amount of current flowing between the source and the drain of the transistor SiTr1 is decreased, or the transistor SiTr1 is off. In addition, since the predetermined potential is applied from the wiring VBIASL to the gate of the transistor OSTr4, current based on the predetermined potential flows between the source and the drain of the transistor OSTr4. As a result, the potential of the node ND3 comes close to the low-level potential VSS.

Because the potential of the node ND3 is input to the input terminal of the inverter circuit INV1, a high-level potential VDD is output to the output terminal of the inverter circuit INV1. That is, the high-level potential VDD is output to the output terminal OUT of the semiconductor device 250.

Since the output terminal of the inverter circuit INV1 is electrically connected to the input terminal of the inverter circuit INV2, a low-level potential VSS is output to the output terminal of the inverter circuit INV2. Thus, the potential of the node VBGN becomes the low-level potential VSS, and this potential is applied to the back gate of the transistor OSTr2. Accordingly, the threshold voltage of the transistor OSTr2 is shifted in the positive direction. However, since the current $I_2$ flowing between the source and the drain of the transistor OSTr2 is not increased, the potential of the gate of the transistor SiTr1 does not change or increases. Thus, the potential of the node ND3 comes close to the low-level potential VSS, and the high-level potential VDD is output to the output terminal OUT of the semiconductor device 250. That is, even when the threshold voltage of the transistor OSTr2 is shifted in the positive direction, the potential of the output terminal OUT of the semiconductor device 250 is not changed. Furthermore, the effective reference potential becomes the potential $V_{const}$ that is the same as that of the input terminal VN.

<<Time T2 to Time T3>>

Over a period from Time T2 to Time T3, the potential applied to the input terminal VP has decreased. Specifically, at Time T3, the potential of the input terminal VP is decreased to the potential $V_{const}$. In the period from Time T2 to Time T3, since the potential of the input terminal VP is higher than the potential $V_{const}$ of the input terminal VN, the potential of the output terminal OUT and the potential of the node VBGN are not changed from those in the period from Time T1 to Time T2, respectively.

<<Time T3 to Time T4>>

Also over a period from Time T3 to Time T4, the potential applied to the input terminal VP has decreased. That is, after Time T3, the potential of the input terminal VP is lower than the potential $V_{const}$ of the input terminal VN.

Since the potential of the input terminal VP is decreased in the period from Time T3 to Time T4, the current $I_1$ flowing between the source and the drain of the transistor OSTr1 is lower than that flowing in the period from Time T1 to Time T3. The current $I_1$ flows from the terminal CM1 of the current mirror circuit CMC to the node ND1 through the transistor OSTr1.

Since the current $I_1$ flows from the terminal CM1 of the current mirror circuit CMC to the first terminal of the transistor OSTr1, the amount of the current $I_2$ flowing through the terminal CM2 is the same as that of current $I_1$ in accordance with the principle of the current mirror circuit in some cases. Thus, the current $I_2$ is also decreased by the decrease in the current $I_1$ in some cases. Since the constant potential $V_{const}$ is applied to the gate of the transistor OSTr2 and the current $I_2$ is decreased, the amount of charge flowing from the terminal CM2 to the node ND2 is decreased and the potential of the node ND2 is decreased. Thus, the potential of the gate of the transistor SiTr1 is decreased, resulting in an increase in the amount of current flowing between the source and the drain of the transistor SiTr1.

Here, the potential of the node ND3 is described. As described above, the amount of current flowing between the source and the drain of the transistor SiTr1 is increased in the period from Time T3 to Time T4. In addition, since the predetermined potential is applied from the wiring VBIASL to the gate of the transistor OSTr4, current flows between the source and the drain of the transistor OSTr4 in accordance with the predetermined potential. Here, the on-state current of the transistor SiTr1 is assumed to be higher than that of the transistor OSTr4, so that the potential of the node ND3 comes close to the high-level potential VDD.

As a method for making the on-state current of the transistor SiTr1 higher than that of the transistor OSTr4, the mobility of a semiconductor included in the channel formation region of the transistor SiTr1 is set higher than that of a semiconductor included in the channel formation region of the transistor OSTr4. For example, a transistor including silicon in its channel formation region is used as the transistor SiTr1, and a transistor including a semiconductor that has lower mobility than silicon is used as the transistor OSTr4.

The potential of the node ND3 comes close to the high-level potential VDD; thus, the high-level potential VDD is input to the input terminal of the inverter circuit INV1. Thus, the low-level potential VSS is output to the output terminal of the inverter circuit INV1. That is, the low-level potential VSS is output to the output terminal OUT of the semiconductor device 250.

Furthermore, the output terminal of the inverter circuit INV1 is electrically connected to the input terminal of the inverter circuit INV2; thus, the high-level potential VDD is output to the output terminal of the inverter circuit INV2. Therefore, the potential of the node VBGN becomes the high-level potential VDD, and this potential is applied to the back gate of the transistor OSTr2.

The high-level potential VDD is applied to the back gate of the transistor OSTr2, whereby the threshold voltage of the transistor OSTr2 is changed and $I_d$–$V_g$ characteristics (source-drain current characteristics with respect to gate-source voltage) of the transistor OSTr2 is shifted in the negative direction. Here, the amount of change in the threshold voltage is denoted by $\Delta V_{th}$.

At this time, the potential $V_{const}$ of the gate of the transistor OSTr2 is constant and the $I_d$–$V_g$ characteristics of the transistor OSTr2 is shifted in the negative direction; thus, the current $I_2$ flowing through the transistor OSTr2 is increased. The potential of the node ND2 is further decreased, so that the amount of current flowing between the source and the drain of the transistor SiTr1 is increased. Since the on-state current of the transistor SiTr1 is higher than that of the transistor OSTr4, the potential of the node ND3 further approaches the high-level potential VDD.

The low-level potential VSS is output to the output terminal of the inverter circuit INV1 when the potential of the node ND3 is input to the input terminal of the inverter circuit INV1; thus, the low-level potential VSS is output to the output terminal OUT. Then, the low-level potential VSS is input to the input terminal of the inverter circuit INV2, so that the potential of the node VBGN that is located ahead of the output terminal of the inverter circuit INV2 becomes the high-level potential VDD. That is, even with the change in the threshold voltage in the period from Time T3 to Time T4, the potential of the output terminal OUT and the potential of the node VBGN do not change.

The reference potential of the semiconductor device 250 is higher than the potential $V_{const}$ that is applied to the input terminal VN since the $I_d$–$V_g$ characteristics of the transistor OSTr2 is shifted in the negative direction. The level of the effective reference potential REF at this time is the sum of the potential $V_{const}$ that is applied to the input terminal VN and the amount of change $\Delta V_{th}$ in the threshold voltage.

<<Time T4 to Time T5>>

Over a period from Time T4 to Time T5, the potential applied to the input terminal VP has increased. Specifically, at Time T5, the potential of the input terminal VP is increased to the potential $V_{const}$. In the period from Time T4 to Time T5, the potential of the input terminal VP is lower than the potential $V_{const}$ of the input terminal VN; thus, the potential of the output terminal OUT and the potential of the node VBGN are not changed from those in the period from Time T3 to Time T4, respectively.

<<Time T5 to Time 6>>

Also over a period from Time T5 to Time T6, the potential applied to the input terminal VP has increased. That is, after Time T5, the potential of the input terminal VP is higher than the potential $V_{const}$ of the input terminal VN. Furthermore, at Time T6, the potential of the input terminal VP is increased to $V_{const}\Delta V_{th}$.

In the period from Time T5 to Time T6, the effective reference potential REF of the semiconductor device 250 is $V_{const}\Delta V_{th}$; thus, the on-state current of the transistor OSTr1 becomes lower than that of the transistor OSTr2 even when the potential $V_{const}$ that is the same as that applied to the gate of the transistor OSTr2 is applied to the gate of the transistor OSTr1. Thus, the potential of the node ND2 comes close to the low-level potential VSS, so that the on-state current flows through the transistor SiTr1. That is, the low-level potential VSS is output to the output terminal OUT of the semiconductor device 250 and the potential of the node VBGN becomes the high-level potential VDD. That is, in the period from Time T5 to Time T6, the potential of the output terminal OUT and the potential of the node VBGN remain unchanged from those before Time T5.

<<Time T6 to Time T7>>

Also over a period from Time T6 to Time T7, the potential applied to the input terminal VP has increased. That is, after Time T6, the potential of the input terminal VP is higher than $V_{const}\Delta V_{th}$.

At this time, the on-state current of the transistor OSTr1 is higher than that of the transistor OSTr2. The amount of current $I_2$ flowing between the source and the drain of the transistor OSTr2 tends to be the same as that of the current $I_1$ flowing between the source and the drain of the transistor OSTr1 in accordance with the principle of the current mirror circuit CMC. However, since the potential $V_{const}$ that is lower than the potential of the gate of the transistor OSTr1 is applied to the gate of the transistor OSTr2, the current $I_2$ becomes smaller than the current $I_1$. Thus, the amount of charge flowing from the terminal CM2 of the current mirror circuit to the node ND2 is increased, thereby increasing the potential of the node ND2. Accordingly, the potential of the gate of the transistor SiTr1 is increased, so that the amount of current flowing between the source and the drain of the transistor SiTr1 is decreased. Depending on the level of the potential of the node ND2, the transistor SiTr1 is off.

Here, the potential of the node ND3 is described. As described above, in the period from Time T6 to Time T7, the amount of current flowing between the source and the drain of the transistor SiTr1 is decreased or the transistor SiTr1 is off. In addition, the predetermined potential is applied from the wiring VBIASL to the gate of the transistor OSTr4; thus, constant current based on the predetermined potential flows between the source and the drain of the transistor OSTr4. As a result, the potential of the node ND3 comes close to the low-level potential VSS.

The potential of the node ND3 is input to the input terminal of the inverter circuit INV1, so that the high-level potential VDD is output to the output terminal of the inverter circuit INV1. That is, the high-level potential VDD is output to the output terminal OUT of the semiconductor device 250.

Furthermore, since the output terminal of the inverter circuit INV1 is electrically connected to the input terminal of the inverter circuit INV2, the low-level potential VSS is output to the output terminal of the inverter circuit INV2. Thus, the potential of the node VBGN becomes the low-level potential VSS, and this potential is applied to the back gate of the transistor OSTr2. Accordingly, the threshold voltage of the transistor OSTr2 is shifted in the positive direction, and the $I_d$-$V_g$ characteristics of the transistor OSTr2 returns to those in the period from Time T1 to Time T3. Thus, the effective reference potential REF of the semiconductor device 250 becomes the potential $V_{const}$ that is the same as that of the input terminal VN.

<<Time T7 to Time T8>>

Over a period from Time T7 to Time T8, the potential applied to the input terminal VP has decreased. Specifically, at Time T8, the potential of the input terminal VP is decreased to $V_{const}$. In the period from Time T7 to time T8, in the case where the potential of the input terminal VP is higher than the potential $V_{const}$ of the input terminal VN, the potential of the output terminal OUT and the potential of the node VBGN are not changed from those in Time T7, respectively.

The above operation is summarized below.

As illustrated in the period from Time T1 to Time T3, when the potential of the input terminal VP is higher than that of the input terminal VN, the potential of the node VBGN becomes the low-level potential VSS, and the output terminal OUT outputs the high-level potential VDD. At this time, since the low-level potential VSS is applied to the back gate of the transistor OSTr2, the threshold voltage of the transistor OSTr2 is not changed. As a result, the effective reference potential REF of the semiconductor device 250 becomes $V_{const}$.

As illustrated in the period from Time T3 to Time T5, when the potential of the input terminal VP is lower than that of the input terminal VN, the potential of the node VBGN becomes the high-level potential VDD, and the low-level potential VSS is output from the output terminal OUT. At this time, since the high-level potential VDD is applied to the back gate of the transistor OSTr2, the threshold voltage of the transistor OSTr2 is shifted in the negative direction. Thus, the effective reference potential REF of the semiconductor device 250 becomes $V_{const}\Delta V_{th}$.

As illustrated in the period from Time T5 to Time T6, in the state where the potential of the input terminal VP is lower than the potential $V_{const}$ of the input terminal VN, the potential of the node VBGN remains high, the high-level potential VDD, and is not changed from that before Time T5 even when the potential of the input terminal VP is made higher than that of the input terminal VN. In addition, the potential of the output terminal OUT remains low, the low-level potential VSS, and is not changed from that before Time T5. This is because the effective reference potential REF of the semiconductor device 250 is $V_{const}\Delta V_{th}$ and the potential of the input terminal VP is not higher than $V_{const}\Delta V_{th}$ in the period from Time T5 to Time T6.

As illustrated in the period from Time T6 to Time T8, when the potential of the input terminal VP is higher than $V_{const}\Delta V_{th}$, the potential of the node VBGN is the low-level potential VSS, and the high-level potential VDD is output from the output terminal OUT. At that time, the low-level potential VSS is applied to the back gate of the transistor OSTr2; thus, the $I_d$-$V_g$ characteristics of the transistor OSTr2 returns to those in the period from Time T1 to Time T3. Thus, the effective reference potential REF of the semiconductor device 250 becomes $V_{const}$.

That is, with the structure in which the threshold voltage of the transistor serving as one of the differential pair on the input terminal VN side is shifted in the negative direction when the potential of the input terminal VP is lower than the potential of the input terminal VN and the shift of the threshold voltage of the transistor serving as the one of the differential pair on the input terminal VN side is restored when the potential of the input terminal VP is higher than the potential of the input terminal VN, a comparator that applies hysteresis to an input comparison voltage can be provided.

In Embodiment 1, one embodiment of the present invention has been described. Other embodiments of the present invention will be described in Embodiments 2 to 6. Note that one embodiment of the present invention is not limited to the above examples. In other words, various embodiments of the invention are described in this embodiment and the other embodiments, and one embodiment of the present invention is not limited to a particular embodiment. Depending on the circumstances or conditions, a variety of semiconductors may be used for transistors in one embodiment of the present invention, the channel formation regions of the transistors, the source and drain regions of the transistors, and the like. Depending on the circumstances or conditions, transistors in one embodiment of the present invention, the channel formation regions of the transistors, the source and drain regions of the transistors, and the like may include, for example, at least one of silicon, germanium, silicon germanium, silicon carbide, gallium arsenide, aluminum gallium arsenide, indium phosphide, gallium nitride, and an organic semiconductor. Depending on the circumstances or case, transistors in one embodiment of the present invention, the channel formation regions of the transistors, the source and drain regions of the transistors, and the like do not necessarily include an oxide semiconductor.

Note that this embodiment can be combined with any of the other embodiments in this specification as appropriate.

Embodiment 2

A structure example of a memory device in one embodiment of the present invention is described with reference to FIG. 14.

Figure 14:
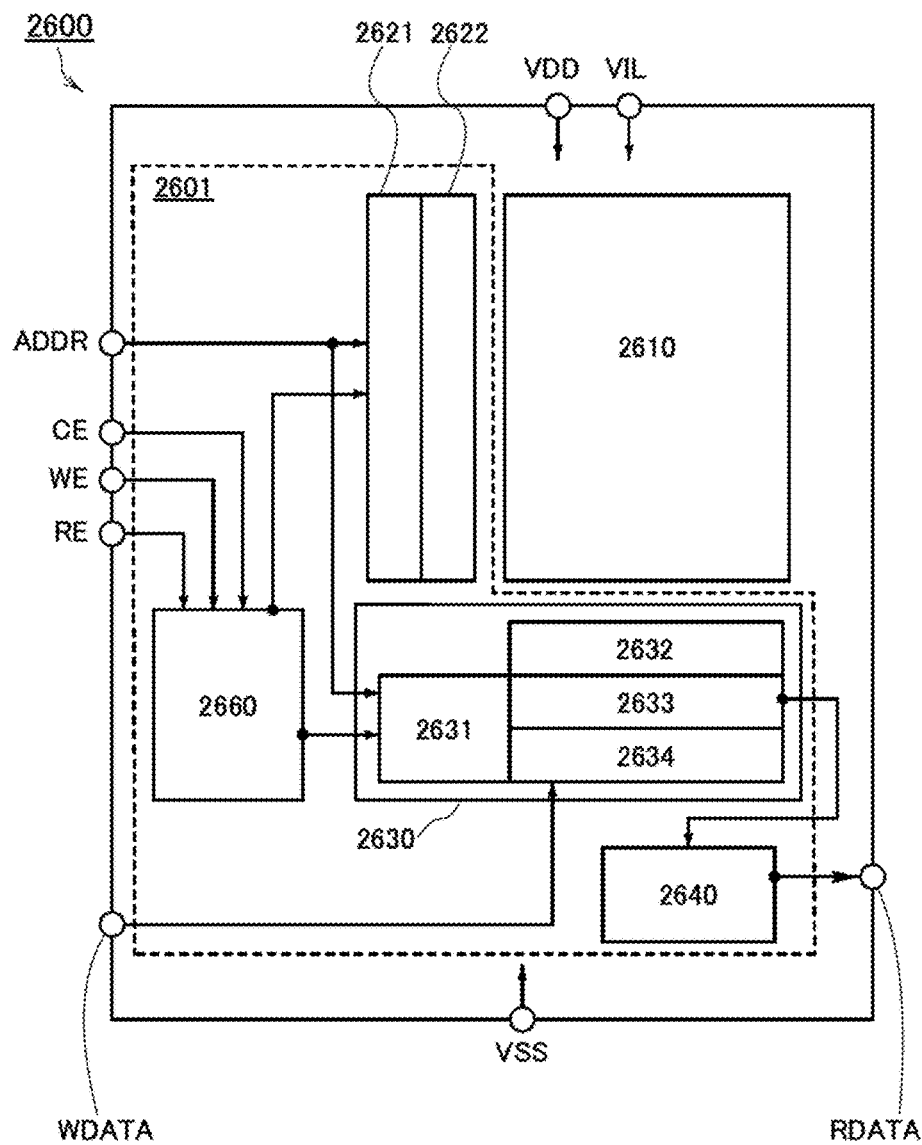
FIG. 14 is a block diagram showing an example of a memory device.

FIG. 14 illustrates an example of a structure of a memory device. A memory device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660.

The bit line driver circuit 2630 includes a column decoder 2631, a precharge circuit 2632, a sense amplifier 2633, and a write circuit 2634. The precharge circuit 2632 has a function of precharging bit lines. The sense amplifier 2633 has a function of amplifying a data signal read from the bit line. The amplified data signal is output as a digital data signal RDATA from the memory device 2600 through the output circuit 2640.

Any one of the semiconductor device 200, the semiconductor devices 211 to 213, the semiconductor devices 221 to 224, the semiconductor devices 231 to 234, the semiconductor devices 241 to 243, the semiconductor device 241A, the semiconductor device 250, and the semiconductor devices 300 to 302 which are described in Embodiment 1 can be applied to the output circuit 2640. The read data signal is sent to the input terminal of the output circuit 2640, so that determination whether the data signal is "0" or "1" can be made. Note that any one of the semiconductor device 200, the semiconductor devices 211 to 213, the semiconductor devices 221 to 224, the semiconductor devices 231 to 234, the semiconductor devices 241 to 243, the semiconductor device 241A, the semiconductor device 250, and the semiconductor devices 300 to 302 may be applied not to the output circuit 2640 but to the sense amplifier 2633.

As power source voltages, a low power source voltage (VSS), a high power source voltage (VDD) for the peripheral circuit 2601, and a high power source voltage (VIL) for the memory cell array 2610 are supplied to the memory device 2600 from the outside.

Control signals (CE, WE, and RE), an address signal ADDR, and a data signal WDATA are input to the memory device 2600 from the outside. The address signal ADDR is input to the row decoder 2621 and the column decoder 2631, and the data signal WDATA is input to the write circuit 2634.

The control logic circuit 2660 processes the signals (CE, WE, RE) input from the outside, and generates control signals for the row decoder 2621 and the column decoder 2631. The signal CE is a chip enable signal, the signal WE is a write enable signal, and the signal RE is a read enable signal. Signals processed by the control logic circuit 2660 are not limited to those listed above, and other control signals may be input as necessary.

Note that whether each circuit or each signal described above is provided or not can be determined as appropriate as needed.

When a p-channel Si transistor and a transistor including a channel formation region using an oxide semiconductor (preferably an oxide containing In, Ga, and Zn) described in Embodiment below are used in the memory device 2600, the memory device 2600 can be reduced in size. In addition, the memory device 2600 can be reduced in power consumption. Furthermore, the memory device 2600 can be increased in operation speed. Particularly when the Si transistors are only p-channel ones, the manufacturing cost can be reduced.

Note that the structure of this embodiment is not limited to that illustrated in FIG. 14. The structure may be changed as appropriate: for example, part of the peripheral circuit 2601, e.g., the precharge circuit 2632 and/or the sense amplifier 2633 may be provided below the memory cell array 2610.

Note that this embodiment can be combined with any of the other embodiments in this specification as appropriate.

Embodiment 3

In this embodiment, examples in which the semiconductor device described in any of the above embodiments is used as a memory device in an electronic component and in an electronic device including the electronic component are described with reference to FIGS. 15A to 15E and FIGS. 16A to 16H.

<Electronic Component>

FIG. 15A shows an example in which the semiconductor device described in any of the above embodiments is used as a memory device in an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A semiconductor device including the transistors described in Embodiments 1 and 2 is completed by integrating detachable components on a printed circuit board through the assembly process (post-process).

The post-process can be finished through the steps in FIG. 15A. Specifically, after an element substrate obtained in the proceeding process is completed (Step STP1), a rear surface of the substrate is ground (Step STP2). The substrate is thinned in this step to reduce warpage or the like of the substrate in the proceeding process and to reduce the size of the component itself.

After the rear surface of the substrate is ground, a dicing step is performed to divide the substrate into a plurality of chips (Step STP3). Then, the divided chips are separately picked up to be mounted on and bonded to a lead frame in a die bonding process (Step STP4). In this die bonding process, the chip is bonded to the lead frame by an appropriate method depending on a product, for example, bonding with a resin or a tape. Note that in the die bonding process, the chip may be mounted on an interposer to be bonded.

Note that in this embodiment, when an element is formed on a surface of a substrate, the other surface is referred to as a rear surface (a surface on which the element is not formed).

Next, wiring bonding for electrically connecting a lead of the lead frame and an electrode on a chip through a metal wire is performed (Step STP5). A silver line or a gold line can be used as the metal fine line. Ball bonding or wedge bonding can be used as the wire bonding.

A wire-bonded chip is subjected to a molding step of sealing the chip with an epoxy resin or the like (Step STP6). With the molding step, the inside of the electronic component is filled with a resin, thereby reducing damage to the circuit portion and the wire embedded in the component caused by external mechanical force as well as reducing deterioration of characteristics due to moisture or dust.

Next, plate processing is performed on the lead of the lead frame. Then, the lead is cut and processed into a predetermined shape (Step STP7). This plate processing prevents rust of the lead and facilitates soldering at the time of mounting the chip on a printed wiring board in a later step.

Next, printing (marking) is performed on a surface of the package (Step STP8). After a final testing step (Step STP9), the electronic component is completed (Step STP10).

The above electronic component can include the semiconductor device described in the above embodiment. Thus, a highly reliable electronic component can be obtained.

FIG. 15B is a schematic perspective view of the completed electronic component. FIG. 15B shows a schematic perspective diagram of a quad flat package (QFP) as an example of the electronic component. An electronic component 4700 in FIG. 15B includes a lead 4701 and a circuit portion 4703. The electronic component 4700 in FIG. 15B is mounted on a printed board 4702, for example. A plurality of electronic components 4700 which are combined and electrically connected to each other over the printed board 4702 can be mounted on an electronic device. A completed circuit board 4704 is provided in an electronic device or the like.

One embodiment of the present invention is not limited to the shape of the electronic component 4700, and the element substrate fabricated in Step STP1 is included. In addition, the element substrate of one embodiment of the present invention includes an element substrate that has been subjected to Step STP2 where the rear surface of the substrate is ground. Furthermore, the element substrate of one embodiment of the present invention includes an element substrate that has been subjected to Step STP3 where the dicing step is performed. For example, a semiconductor wafer 4800 or the like shown in FIG. 15C corresponds to the element substrate. In the semiconductor wafer 4800, a plurality of circuit portions 4802 are formed on a top surface of a wafer 4801. A part without the circuit portions 4802 on the top surface of the wafer 4801 is a spacing 4803 that is a region for dicing.

The dicing is carried out along scribe lines SCL1 and scribe lines SCL2 (referred to as dicing line or cutting line in some cases) indicated by dashed-dotted lines. For performing the dicing step easily, the spacing 4803 is preferably provided such that a plurality of scribe lines SCL1 are parallel to each other, a plurality of scribe lines SCL2 are parallel to each other, and the scribe lines SCL1 and the scribe lines SCL2 are intersected perpendicularly with each other.

With the dicing step, a chip 4800a as shown in FIG. 15D can be cut out from the semiconductor wafer 4800. The chip 4800a includes a wafer 4801a, the circuit portion 4802, and a spacing 4803a. Note that it is preferable to provide the spacing 4803a to be made as small as possible. In this case, it is preferable that the width of the spacing 4803 between adjacent circuit portions 4802 be substantially the same as a length of margin for cutting of the scribe line SCL1 or the scribe line SCL2.

The shape of the element substrate of one embodiment of the present invention is not limited to the shape of the semiconductor wafer 4800 shown in FIG. 15C. For example, a rectangular semiconductor wafer 4810 shown in FIG. 15E can be employed. The shape of the element substrate can be changed as appropriate, depending on a process for fabricating an element and an apparatus for fabricating an element.

<Electronic Device>

Next, electronic devices including the aforementioned electronic component are described.

A semiconductor device of one embodiment of the present invention can be used for a display device, a personal computer, or an image reproducing devices provided with recording media (typically, devices that reproduce the content of recording media such as digital versatile discs (DVDs) and have displays for displaying the reproduced images). Other than the above, as electronic devices which can be equipped with the semiconductor device of one embodiment of the present invention, mobile phones, portable game machines, portable information terminals, e-book readers, video cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), vending machines, medical devices, and the like can be given. Specifically, a hysteresis comparator is used for a sensor such as a temperature sensor, an optical sensor, or a touch sensor, and a semiconductor device of one embodiment of the present invention is used for such an electronic device. FIGS. 16A to 16H illustrate specific examples of these electronic devices.

Figure 16A:
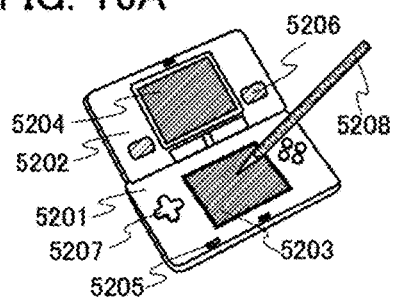
FIGS. 16A to 16H are perspective views each showing an example of an electronic device.

FIG. 16A illustrates a portable game machine, which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 16A has the two display portions 5203 and 5204, the number of display portions included in the portable game machine is not limited to this.

Figure 16B:
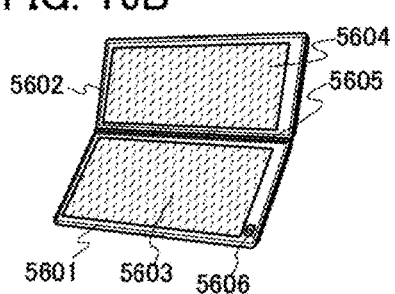

FIG. 16B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 16C:
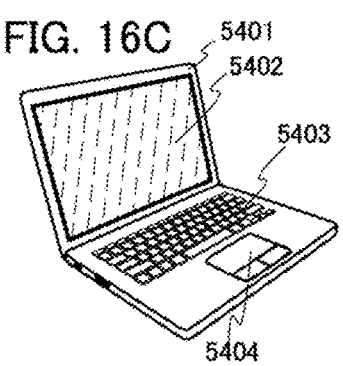

FIG. 16C illustrates a notebook personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 16D:
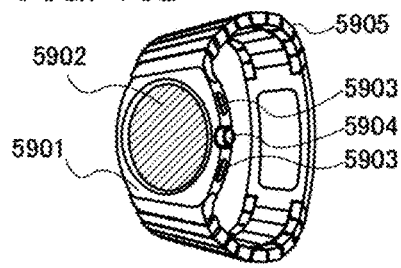

FIG. 16D illustrates a smart watch which is one of wearable terminals. The smart watch includes a housing 5901, a display portion 5902, operation buttons 5903, an operator 5904, and a band 5905. The semiconductor device of one embodiment of the present invention can be used for a variety of integrated circuits included in the smart watch. A display device with a position input function may be used as the display portion 5902. Note that the position input function can be added by provision of a touch panel in a display device. Alternatively, the position input function can be added by providing a photoelectric conversion element called a photosensor in a pixel area of a display device. As the operation buttons 5903, any one of a power switch for starting the smart watch, a button for operating an application of the smart watch, a volume control button, a switch for turning on or off the display portion 5902, and the like can be used. Although the smart watch in FIG. 16D includes two operation buttons 5903, the number of the operation buttons included in the smart watch is not limited to two. The operator 5904 functions as a crown performing time adjustment in the smart watch. The operator 5904 may be used as an input interface for operating an application of the smart watch as well as the crown for a time adjustment. Although the smart watch illustrated in FIG. 16D includes the operator 5904, one embodiment of the present invention is not limited thereto and the operator 5904 is not necessarily provided.

Figure 16E:
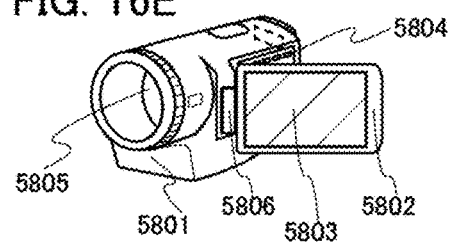

FIG. 16E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 16F:
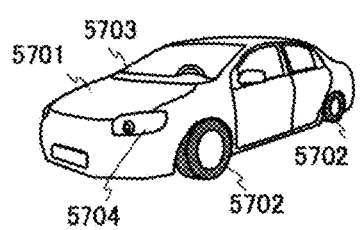

FIG. 16F illustrates a passenger car including a car body 5701, wheels 5702, a dashboard 5703, lights 5704, and the like. The semiconductor device of one embodiment of the present invention can be used for a variety of integrated circuits included in passenger cars.

Figure 16G:
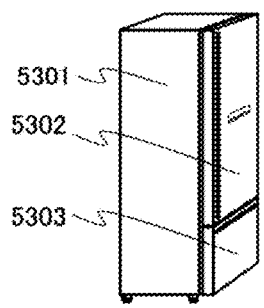

FIG. 16G illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 16H:
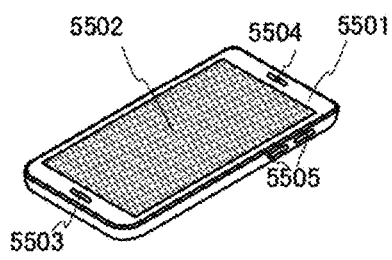

FIG. 16H is a mobile phone having a function of an information terminal. The mobile phone includes a housing 5501, a display portion 5502, a microphone 5503, a speaker 5504, and operation buttons 5505. A display device with a position input function may be used as the display portion 5502. Note that the position input function can be added by provision of a touch panel in a display device. Alternatively, the position input function can be added by providing a photoelectric conversion element called a photosensor in a pixel area of a display device. As operation buttons 5505, any one of a power switch for starting the mobile phone, a button for operating an application of the mobile phone, a volume control button, a switch for turning on or off the display portion 5502, and the like can be used. Although the mobile phone in FIG. 16H includes two operation buttons 5505, the number of the operation buttons included in the mobile phone is not limited to two. Although not illustrated, the mobile phone illustrated in FIG. 16H may be provided with a camera. Although not illustrated, the mobile phone illustrated in FIG. 16H may include a light-emitting device used for flashlight or a lighting purpose. Although not illustrated, the mobile phone in FIG. 16H may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays) in the housing 5501. In particular, the direction of the mobile phone (the direction of the mobile phone with respect to the vertical direction) shown in FIG. 16H is determined by providing a sensing device which includes a sensor for sensing inclinations, such as a gyroscope or an acceleration sensor, and display on the screen of the display portion 5502 can be automatically changed in accordance with the direction of the mobile phone. In particular, in the case where a sensing device including a sensor obtaining biological information of fingerprints, veins, iris, voice prints, or the like is provided, a mobile phone having a function of biometric authentication can be obtained.

Next, a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device which is a device including a display element, a light-emitting element, and a light-emitting device which is a device including a light-emitting element can employ a variety of modes or can include a variety of elements. For example, the display element, the display device, the light-emitting element, or the light-emitting device includes at least one of an electroluminescence (EL) element (e.g., an EL element including organic and inorganic materials, an organic EL element, or an inorganic EL element), a light-emitting diode (LED) chip (e.g., a white LED chip, a red LED chip, a green LED chip, or a blue LED chip), a transistor (a transistor that emits light depending on current), a plasma display panel (PDP), an electron emitter, a display element including a carbon nanotube, a liquid crystal element, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (registered trademark), an interferometric modulation (IMOD) element, a MEMS shutter display element, an optical-interference-type MEMS display element, or a piezoelectric ceramic display), quantum dots, and the like. Other than the above, a display medium whose contrast, luminance, reflectance, transmittance, or the like is changed by electric or magnetic action may be included in the display element, the display device, the light-emitting element, or the light-emitting device. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. Examples of display devices containing quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some of or all of pixel electrodes function as reflective electrodes. For example, some or all of pixel electrodes are formed to contain aluminum or silver. In such a case, a memory circuit such as an SRAM can be provided under the reflective electrodes. Thus, the power consumption can be further reduced. Note that in the case of using an LED chip, graphene or graphite may be provided under an electrode or a nitride semiconductor of the LED chip. Graphene or graphite may be a multilayer film in which a plurality of layers are stacked. As described above, the provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In the case of a display element including micro electro mechanical systems (MEMS), a drying agent may be provided in a space where the display element is sealed (e.g., between an element substrate over which the display element is placed and a counter substrate opposed to the element substrate). Providing a dry agent can prevent MEMS and the like from becoming difficult to move or deteriorating easily because of moisture or the like.

Note that this embodiment can be combined with any of the other embodiments in this specification as appropriate.

Embodiment 4

The memory device of one embodiment of the present invention can be used for removable memory devices such as memory cards (e.g., SD cards), universal serial bus (USB) memories, and solid state drives (SSD). In this embodiment, some structure examples of the removable memory device are described with reference to FIGS. 17A to 17E.

Figure 17A:
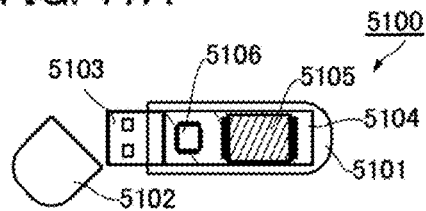
FIGS. 17A to 17E are perspective views illustrating examples of electronic devices.

FIG. 17A is a schematic diagram of a USB memory. A USB memory 5100 includes a housing 5101, a cap 5102, a USB connector 5103, and a substrate 5104. The substrate 5104 is held in the housing 5101. The substrate 5104 is provided with a memory device and a circuit for driving the memory device. For example, the substrate 5104 is provided with a memory chip 5105 and a controller chip 5106. The memory cell array 2610, the word line driver circuit 2622, the row decoder 2621, the sense amplifier 2633, the precharge circuit 2632, the column decoder 2631, and the like, described in Embodiment 3, are incorporated in the memory chip 5105. Specifically, a processor, a work memory, an ECC circuit, and the like are incorporated in the controller chip 5106. Note that the circuit structures of the memory chip 5105 and the controller chip 5106 are not limited to those described above, and can be changed depending on circumstances or conditions. For example, the word line driver circuit 2622, the row decoder 2621, the sense amplifier 2633, the precharge circuit 2632, and the column decoder 2631 may be incorporated into not the memory chip 5105 but the controller chip 5106. The USB connector 5103 functions as an interface for connection to an external device.

Figure 17B:
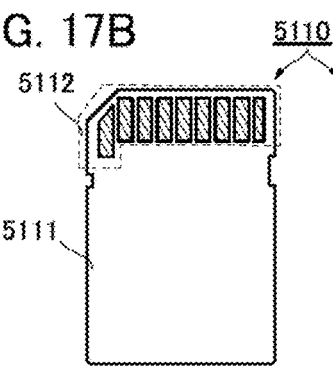
Figure 17C:
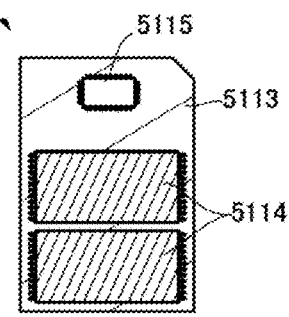

FIG. 17B is a schematic external diagram of an SD card, and FIG. 17C is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the substrate 5113 is provided with a memory chip 5114 and a controller chip 5115. The memory cell array 2610, the word line driver circuit 2622, the row decoder 2621, the sense amplifier 2633, the precharge circuit 2632, the column decoder 2631, and the like, described in Embodiment 3, are incorporated in the memory chip 5114. A processor, a work memory, an ECC circuit, and the like are incorporated in the controller chip 5115. Note that the circuit structures of the memory chip 5114 and the controller chip 5115 are not limited to those described above, and can be changed depending on circumstances or conditions. For example, the word line driver circuit 2622, the row decoder 2621, the sense amplifier 2633, the precharge circuit 2632, and the column decoder 2631 may be incorporated into not the memory chip 5114 but the controller chip 5115.

When the memory chip 5114 is also provided on a back side of the substrate 5113, the capacity of the SD card 5110 can be increased. In addition, a wireless chip with a radio communication function may be provided on the substrate 5113. This structure enables wireless communication between an external device and the SD card 5110, making it possible to write/read data to/from the memory chip 5114.

Figure 17D:
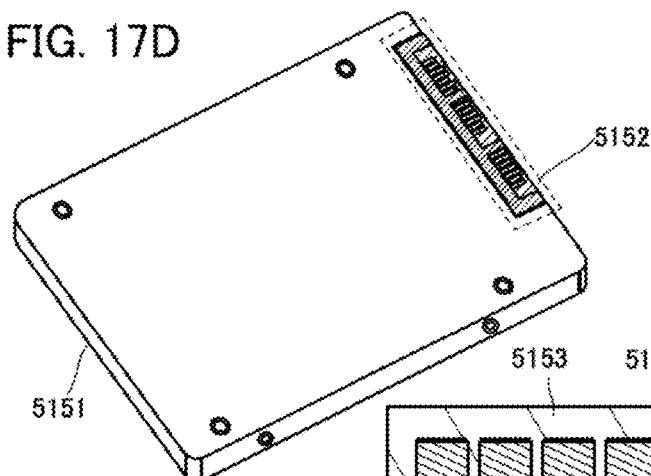
Figure 17E:
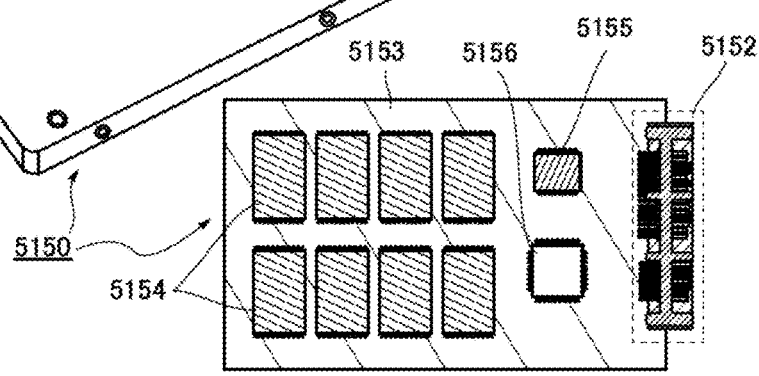

FIG. 17D is a schematic external diagram of an SSD, and FIG. 17E is a schematic diagram illustrating the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the substrate 5153 is provided with a memory chip 5154, a memory chip 5155, and a controller chip 5156. The memory cell array 2610, the word line driver circuit 2622, the row decoder 2621, the sense amplifier 2633, the precharge circuit 2632, the column decoder 2631, and the like, described in Embodiment 3, are incorporated in the memory chip 5154. When the memory chip 5154 is also provided on a back side of the substrate 5153, the capacity of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit structures of the memory chip 5154, the memory chip 5155, and the controller chip 5115 are not limited to those described above, and can be changed depending on circumstances or conditions. For example, a memory functioning as a work memory may also be provided in the controller chip 5156.

Note that this embodiment can be combined with any of the other embodiments in this specification as appropriate.

Embodiment 5

In this embodiment, one embodiment of a semiconductor device is described with reference to FIGS. 18A to 18C, FIGS. 19A to 19C, FIGS. 20A to 20C, and FIGS. 21A to 21C, FIGS. 22A to 22C, FIGS. 23A to 23C, and FIGS. 24A to 24C.

Transistors of one embodiment of the present invention each preferably include an nc-OS or a CAAC-OS, which is described in Embodiment 6.

<Transistor Structure 1>

Figure 18A:
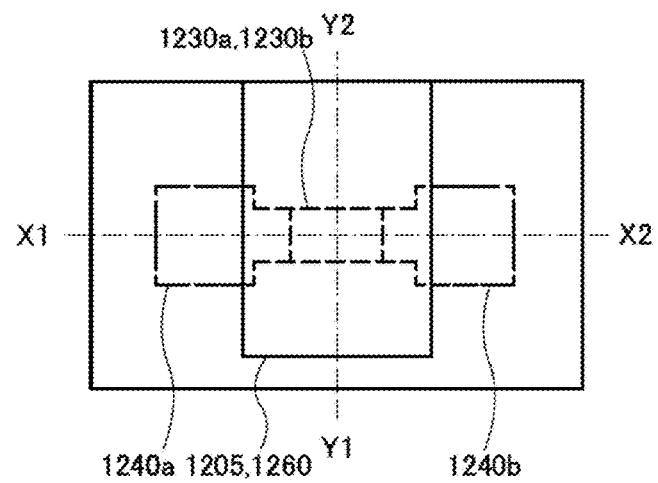
FIGS. 18A to 18C are a top view and cross-sectional views illustrating a structure example of a transistor.
Figure 18B:
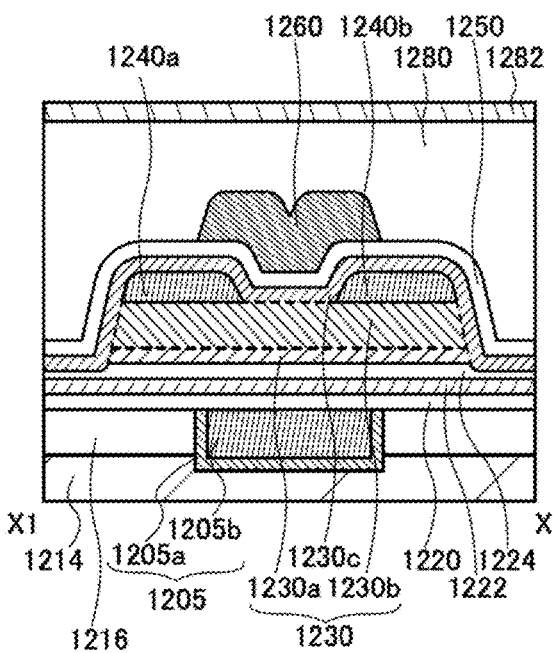
Figure 18C:
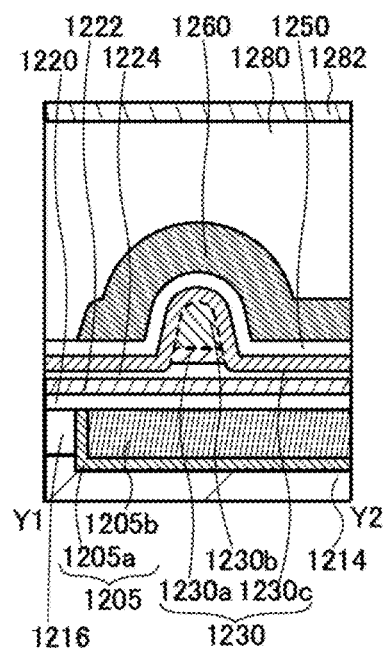

An example of a transistor of one embodiment of the present invention is described below. FIGS. 18A to 18C are a top view and cross-sectional views of a transistor of one embodiment of the present invention. FIG. 18A is a top view. FIG. 18B is a cross-sectional view taken along dashed-dotted line X1-X2 in FIG. 18A. FIG. 18C is a cross-sectional view taken along dashed-dotted line Y1-Y2 in FIG. 18A. Note that for simplification of the drawing, some components in the top view in FIG. 18A are not illustrated.

A transistor 1200A includes a conductor 1205 (conductors 1205*a* and 1205*b*) that functions as a back gate electrode; a conductor 1260 that functions as a gate electrode; an insulator 1220, an insulator 1222, an insulator 1224, and an insulator 1250 that function as gate insulating layers; an oxide 1230 (oxides 1230*a*, 1230*b*, and 1230*c*) that includes a region where a channel is formed; a conductor 1240*a* that functions as one of a source and a drain; a conductor 1240*b* that functions as the other of the source and the drain; an insulator 1280 that includes excess oxygen; and an insulator 1282 that has barrier properties.

The oxide 1230 includes an oxide 1230*a*, an oxide 1230*b* over the oxide 1230*a*, and an oxide 1230*c* over the oxide 1230*b*. When the transistor 1200A is turned on, current flows (a channel is formed) mainly in the oxide 1230*b*. Although current sometimes flow through a region in the vicinity of the interface (a mixed region in some cases) between the oxide 1230*b* and the oxides 1230*a* and 1230*c*, the oxides 1230*a* and 1230*c* function as insulators at the other region.

As illustrated in FIGS. 18A to 18C, the oxide 1230*c* is preferably provided to cover side surfaces of the oxides 1230*a* and 1230*b*. Thus, since the oxide 1230*c* exists between the insulator 1280 and the oxide 1230*b* including the region where the channel is formed, impurities such as hydrogen, water, and halogen can be prevented from diffusing from the insulator 1280 into the oxide 1230*b*.

The insulator 1214 is preferably formed using a material that has a barrier property with respect to hydrogen or oxygen. As an example of a film having a barrier property with respect to hydrogen, silicon nitride formed by a CVD method can be used for the insulator 1214. As the insulator 1214, metal oxide such as aluminum oxide, hafnium oxide, or tantalum oxide is preferably used, for example. In particular, aluminum oxide has an excellent blocking effect that prevents permeation of oxygen and impurities such as hydrogen and moisture that cause a change in electrical characteristics of the transistor. Accordingly, the use of aluminum oxide can prevent entry of impurities such as hydrogen and moisture into the transistor 1200*a* in and after a manufacturing process of the transistor. In addition, release of oxygen from the metal oxide in the transistor 1200*a* can be prevented. Therefore, aluminum oxide is suitably used as a protective film for the transistor 1200*a*.

The insulator 1216 is provided over the insulator 1214. The insulator 1216 is formed using a material such as silicon oxide, silicon oxynitride, silicon nitride oxide, silicon nitride, aluminum oxide, aluminum oxynitride, aluminum nitride oxide, or aluminum nitride.

The conductor 1205 that functions as a back gate electrode can be formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. In particular, a metal nitride film such as a tantalum nitride film is preferable because it has a barrier property against hydrogen or oxygen and is difficult to oxidize (has high oxidation resistance). Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

For example, a conductor having a barrier property with respect to hydrogen, e.g., tantalum nitride, may be used as the conductor 1205*a*, and tungsten, which has high conductivity, may be stacked thereover as the conductor 1205*b*. The use of the combination of the materials can prevent diffusion of hydrogen into the oxide 1230 while conductivity of a wiring is ensured. Although the two-layer structure formed of the conductors 1205*a* and 1205*b* is shown in FIGS. 18A to 18C, one embodiment of the present invention is not limited to this structure, and a single-layer structure or a structure of three or more stacked layers may be employed. For example, a structure where a conductor having a barrier property and a conductor with high conductivity are provided with a conductor which is highly adhesive to the conductor having a barrier property and the conductor with high conductivity positioned therebetween may be employed.

Each of the insulators 1220 and 1224 is preferably an insulator containing oxygen, such as a silicon oxide film or a silicon oxynitride film. In particular, the insulator 1224 is preferably an insulator containing excess oxygen (containing oxygen in excess of that in the stoichiometric composition). In the case where such an insulator containing excess oxygen is provided in contact with the oxide 1230 in the transistor 1200A, oxygen vacancies in the oxide 1230 can be compensated. Note that the insulators 1222 and 1224 are not necessarily formed of the same material.

The insulator 1222 is preferably formed using silicon oxide, silicon oxynitride, silicon nitride oxide, or aluminum oxide, for example. Alternatively, for example, the insulator 1222 is preferably formed using an insulator containing a high-k material such as hafnium oxide, tantalum oxide, zirconium oxide, lead zirconate titanate (PZT), strontium titanate ($SrTiO_3$), or $(Ba,Sr)TiO_3$ (BST). The insulator 1222 is not limited to a single-layer structure of the above material, and is preferably formed of a stacked-layer structure including any of the above materials. In particular, an insulating film having a barrier property against oxygen or hydrogen, e.g., an aluminum oxide film or a hafnium oxide film, is preferably used. The insulator 1222 formed of such a material functions as a layer that prevents release of oxygen from the oxide 1230 and entry of an impurity such as hydrogen from the outside.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

Note that the insulators 1220, the insulator 1222, and the insulator 1224 may have a stacked-layer structure of two or more layers. In this case, the stacked layers are not necessarily formed of the same material but may be formed of different materials.

In the case where the insulator 1222 including a high-k material is provided between the insulator 1220 and the insulator 1224, electrons can be trapped in the insulator 1222 under specific conditions, and the threshold voltage can be increased. As a result, the insulator 1222 is negatively charged in some cases.

For example, in the case where the insulator 1220 and the insulator 1224 are formed using silicon oxide and the insulator 1222 is formed using a material having a lot of electron trap states such as hafnium oxide, aluminum oxide, or tantalum oxide, the state where the potential of the conductor 1205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide 1230 in the transistor 1200A to the conductor 1205. At this time, some of the moving electrons are trapped by the electron trap states of the insulator 1222.

In the transistor in which a necessary amount of electrons is trapped by the electron trap states of the insulator 1222, the threshold voltage is shifted in the positive direction. By controlling the voltage of the conductor 1205, the amount of electrons to be trapped can be controlled, and thus the threshold voltage can be controlled. The transistor 1200A having the structure is a normally-off transistor which is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging.

The threshold voltages can be controlled by appropriate adjustment of the thicknesses of the insulator 1220, the insulator 1222, and the insulator 1224. For example, when the total thickness of the insulators 1220, 1222, and 1224 is reduced, a voltage is efficiently applied from the conductor 1205, resulting in low power consumption of the transistor. The total thickness of the insulators 1220, 1222, and 1224 is less than or equal to 65 nm, preferably less than or equal to 20 nm.

Thus, a transistor having a low leakage current in an off state can be provided. A transistor with stable electrical characteristics can be provided. A transistor having high on-state current can be provided. A transistor having a small subthreshold swing value can be provided. A highly reliable transistor can be provided.

The oxide 1230a, the oxide 1230b, and the oxide 1230c are formed using metal oxide such as In-M-Zn oxide (M is Al, Ga, Y, or Sn). Alternatively, an In—Ga oxide or an In—Zn oxide may be used for the oxide 1230. The oxide 1230 of one embodiment of the present invention is described below.

An oxide used as the oxide 1230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Next, preferred ranges of atomic ratios of indium to the element M and zinc in the oxide of one embodiment of the present invention are described with reference to FIGS. 25A to 25C. Note that the proportion of oxygen atoms is not illustrated in FIGS. 25A to 25C. The terms of the atomic ratio of indium to the element M and zinc in the oxide are denoted by [In], [M], and [Zn], respectively.

Figure 25A:
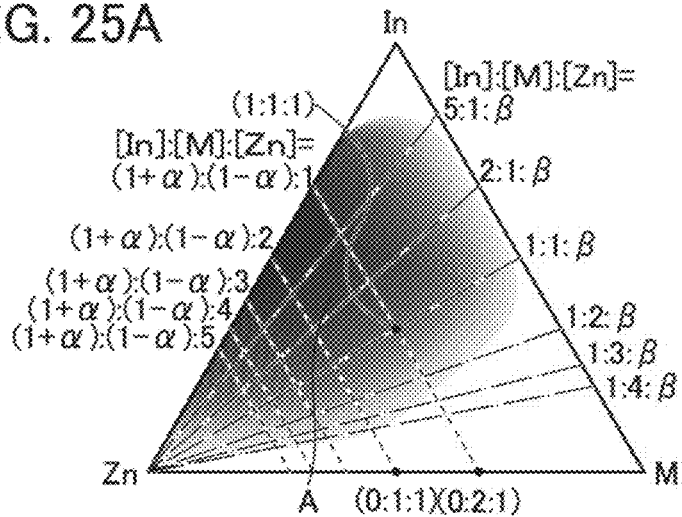
FIGS. 25A to 25C each illustrate an atomic ratio range of an oxide.
Figure 25B:
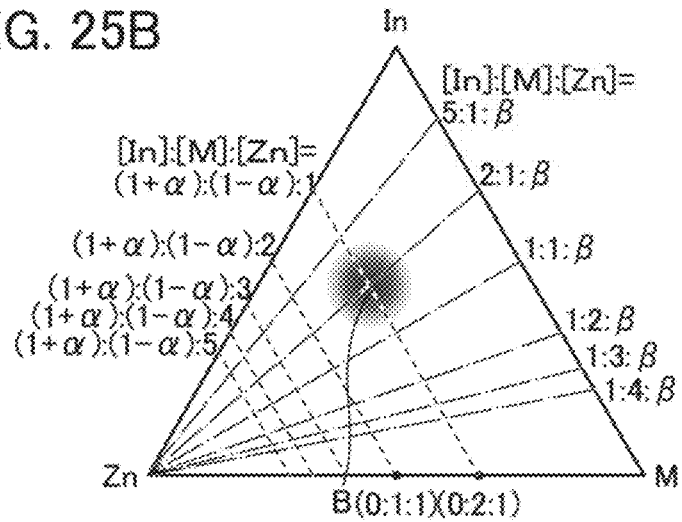
Figure 25C:
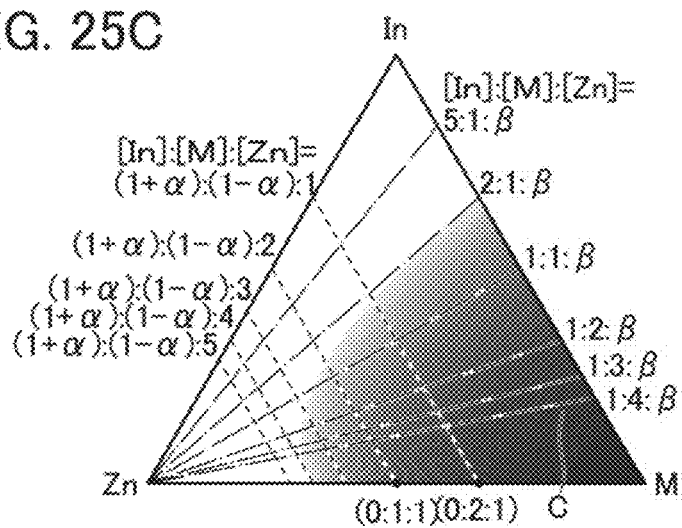

In FIGS. 25A to 25C, broken lines indicate a line where the atomic ratio [In]:[M]:[Zn] is $(1+\alpha):(1-\alpha):1$ ($\alpha$ is a real number greater than or equal to $-1$ and less than or equal to 1), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ ($\beta$ is a real number greater than or equal to 0), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

The oxide in FIGS. 25A to 25C with an atomic ratio of [In]:[M]:[Zn]=0:2:1 or an atomic ratio that is in the neighborhood thereof is likely to have a spinel crystal structure.

FIGS. 25A and 25B illustrate examples of the preferred ranges of the atomic ratios of indium to the element M and zinc contained in the oxide of one embodiment of the present invention.

Figure 26:
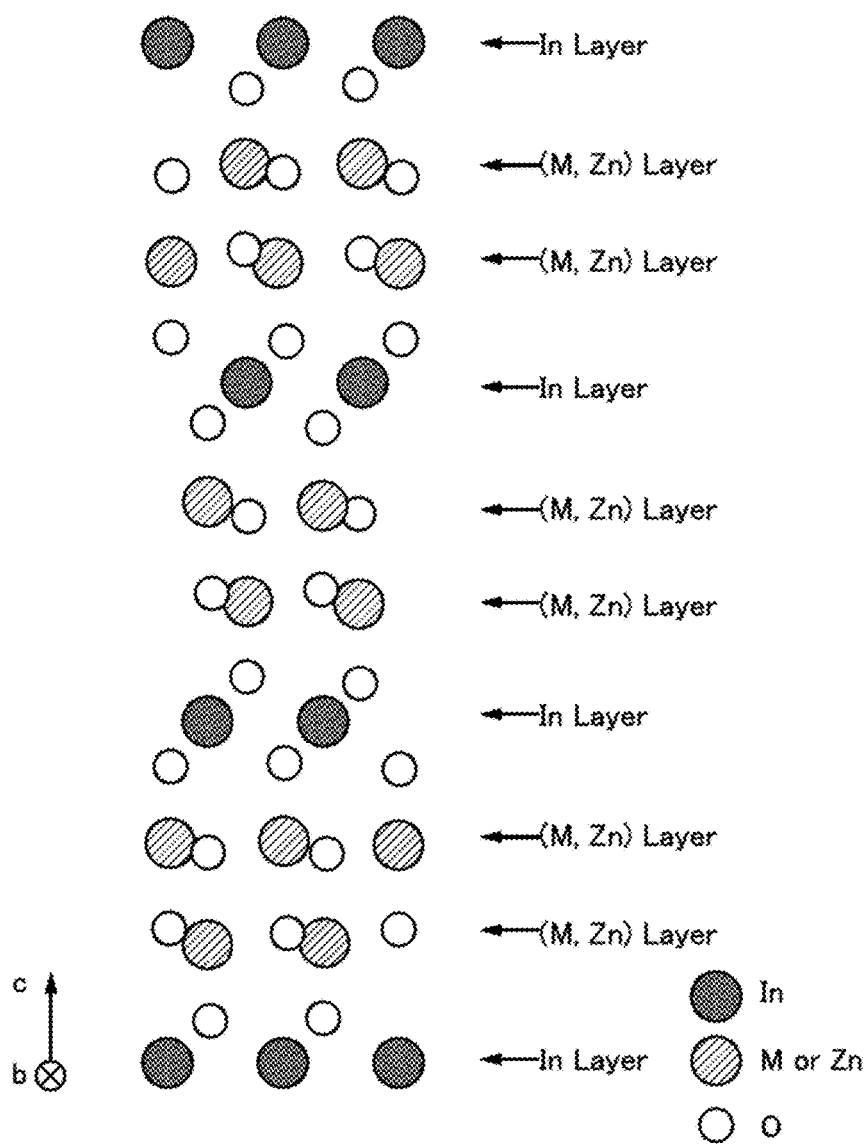
FIG. 26 illustrates a crystal structure of InMZnO$_4$.

FIG. 26 shows an example of the crystal structure of $InMZnO_4$ whose atomic ratio [In]:[M]:[Zn] is 1:1:1. The crystal structure shown in FIG. 26 is of $InMZnO_4$ observed from a direction parallel to a b-axis. Note that a metal element in a layer that contains M, Zn, and oxygen (hereinafter, this layer is referred to as an "(M,Zn) layer") in FIG. 26 represents the element M or zinc. In that case, the proportion of the element M is the same as the proportion of zinc. The element M and zinc can be replaced with each other, and their arrangement is random.

Note that $InMZnO_4$ has a layered crystal structure (also referred to as a layered structure) and includes two (M,Zn) layers that contain the element M, zinc, and oxygen with respect to one layer that contains indium and oxygen (hereinafter referred to as an In layer), as illustrated in FIG. 26.

Indium and the element M can be replaced with each other. Therefore, when the element M in the (M,Zn) layer is replaced with indium, the layer can also be referred to as an (In,M,Zn) layer. In that case, a layered structure that includes two (In,M,Zn) layers with respect to one In layer is obtained.

An oxide whose atomic ratio [In]:[M]:[Zn] is 1:1:2 has a layered structure that includes three (M,Zn) layers with respect to one In layer. In other words, if [Zn] is larger than [In] and [M], the proportion of (M,Zn) layers to In layers becomes higher when the oxide is crystallized.

Note that in the case where the number of (M,Zn) layers with respect to one In layer is not an integer in the oxide, the oxide might have plural kinds of layered structures where the number of (M,Zn) layers with respect to one In layer is an integer. For example, in the case of [In]:[M]:[Zn]=1:1:1.5, the oxide might have the following layered structures: a layered structure of two (M,Zn) layers with respect to one In layer and a layered structure of three (M,Zn) layers with respect to one In layer.

For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have a higher carrier mobility (electron mobility). This is because in an oxide containing indium, the element M, and zinc, the s orbital of heavy metal mainly contributes to carrier transfer, and when the indium content in the oxide is increased, overlaps of the s orbitals of indium atoms are increased; therefore, an oxide having a high content of indium has a higher carrier mobility than an oxide having a low content of indium.

In contrast, when the indium content and the zinc content in an oxide become lower, carrier mobility becomes lower. Thus, with an atomic ratio of [In]:[M]:[Zn]=0:1:0 and the neighborhood thereof (e.g., a region C in FIG. 25C), insulation performance becomes better.

Accordingly, an oxide in one embodiment of the present invention preferably has an atomic ratio represented by a region A in FIG. 25A. With the atomic ratio, a layered structure with high carrier mobility and a few grain boundaries is easily obtained.

A region B in FIG. 25B represents an atomic ratio of [In]:[M]:[Zn]=4:2:3 to 4:2:4.1 and the neighborhood thereof. The neighborhood includes an atomic ratio of [In]:[M]:[Zn]=5:3:4. An oxide with an atomic ratio represented by the region B is an excellent oxide that has particularly high crystallinity and high carrier mobility.

Note that the condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor is described.

Note that when the oxide is used for a transistor, carrier scattering or the like at a grain boundary can be reduced; thus, the transistor can have high field-effect mobility. In addition, the transistor can have high reliability.

An oxide with a low carrier density is preferably used for the transistor. For example, the oxide has a carrier density lower than $8 \times 10^{11}$ cm$^{-3}$, preferably lower than $1 \times 10^{11}$ cm$^{-3}$, further preferably lower than $1 \times 10^{10}$ cm$^{-3}$ and higher than or equal to $1 \times 10^{-9}$ cm$^{-3}$.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. As examples of the impurities, hydrogen, nitrogen, alkali metal, alkaline earth metal, iron, nickel, silicon, and the like are given.

Here, the influence of impurities in the oxide is described.

When silicon or carbon that is a Group 14 element is contained in the oxide, defect states are formed in the oxide. Thus, the concentration of silicon or carbon (measured by secondary ion mass spectrometry (SIMS)) is set to be lower than or equal to $2 \times 10^{18}$ atoms/cm$^3$, preferably lower than or equal to $2 \times 10^{17}$ atoms/cm$^3$ in the oxide or around an interface with the oxide.

When the oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide. Specifically, the concentration of alkali metal or alkaline earth metal measured by SIMS is set to be lower than or equal to $1 \times 10^{18}$ atoms/cm$^3$, preferably lower than or equal to $2 \times 10^{16}$ atoms/cm$^3$.

When containing nitrogen, the oxide easily becomes n-type by generation of electrons serving as carriers and an increase of carrier density. Thus, a transistor whose semiconductor includes an oxide containing nitrogen is likely to be normally-on. For this reason, nitrogen in the oxide is preferably reduced as much as possible; for example, the concentration of nitrogen in the oxide measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, hydrogen in the oxide is preferably reduced as much as possible. Specifically, the concentration of hydrogen in the oxide measured by SIMS is set to be lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide with sufficiently reduced impurity concentration is used for a channel region in a transistor, the transistor can have stable electrical characteristics.

Next, the case where the oxide has a two-layer structure or a three-layer structure is described. A band diagram of a stacked-layer structure of an oxide S1, an oxide S2, and an oxide S3 and insulators that are in contact with the stacked-layer structure, a band diagram of a stacked-layer structure of the oxides S2 and S3 and insulators that are in contact with the stacked-layer structure, and a band diagram of a stacked-layer structure of the oxides S1 and S2 and insulators that are in contact with the stacked-layer structure are described with reference to FIGS. 27A to 27C.

Figure 27A:
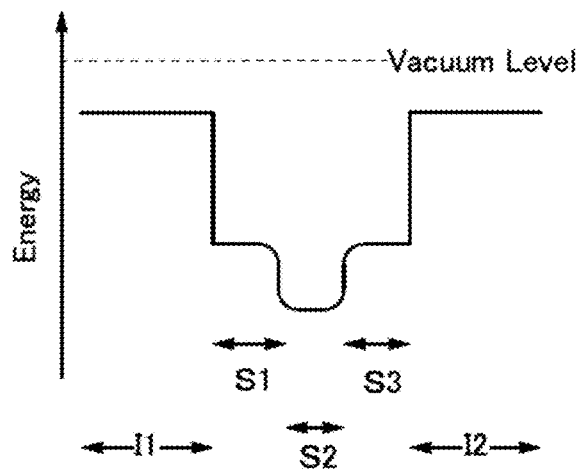
FIGS. 27A to 27C are band diagrams of stacked-layer structures of oxides.
Figure 27B:
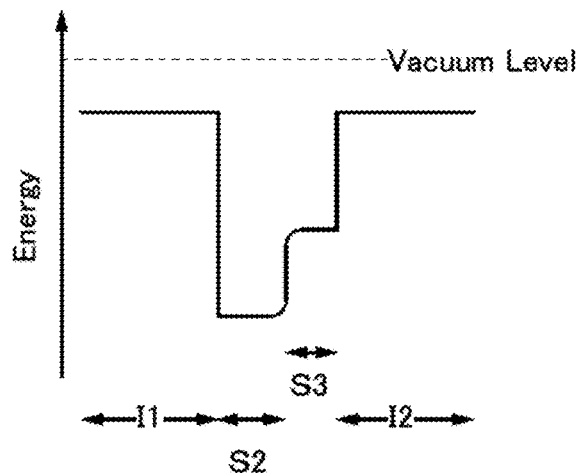
Figure 27C:
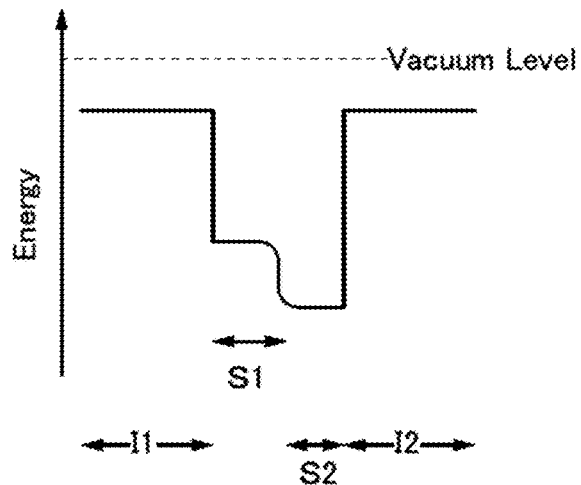

FIG. 27A is an example of a band diagram of a layered structure including an insulator I1, the oxide S1, the oxide S2, the oxide S3, and an insulator I2 in a thickness direction. FIG. 27B is an example of a band diagram of a layered structure including the insulator I1, the oxide S2, the oxide S3, and the insulator I2 in a thickness direction. FIG. 27C is an example of a band diagram of a layered structure including the insulator I1, the oxide S1, the oxide S2, and the insulator I2 in a thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2 is. Typically, the conduction band minimum of the oxide S2 is lower than the conduction band minimum of each of the oxide S1 and the oxide S3. Specifically, a difference in the energy level between the conduction band minimum of the oxide S2 and the conduction band minimum of each of the oxides S1 and S3 is preferably greater than or equal to 0.15 eV and less than or equal to 2 eV, further preferably greater than or equal to 0.5 eV and less than or equal to 1 eV. That is, it is preferable that the electron affinity of the oxide S2 be higher than the electron affinity of each of the oxides S1 and S3, and the difference between the electron affinity of each of the oxides S1 and S3 and the electron affinity of the oxide S2 be greater than or equal to 0.15 eV and less than or equal to 2 eV, further preferably greater than or equal to 0.5 eV and less than or equal to 1 eV.

As shown in FIGS. 27A to 27C, the energy level of the conduction band minimum of each of the oxides S1 to S3 is gradually varied. In other words, the energy level of the conduction band minimum is continuously varied or continuously connected. In order to obtain such a band diagram, the density of defect states in a mixed layer formed at the interface between the oxides S1 and S2 or the interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxides S1 and S2, and the interface between the oxides S2 and S3 mainly function as a channel region. For example, an oxide with high insulation performance and the atomic ratio represented by the region C in FIG. 25C may be used as each of the oxides S1 and S3. Note that the region C in FIG. 25C represents the atomic ratio of [In]:[M]:[Zn]=0:1:0 or the vicinity thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

The insulator 1250 can be formed using silicon oxide, silicon oxynitride, silicon nitride oxide, aluminum oxide. Alternatively, the insulator 1250 can be formed using, for example, an insulator containing a so-called high-k material such as hafnium oxide, tantalum oxide, zirconium oxide, lead zirconate titanate (PZT), strontium titanate (SrTiO$_3$), or (Ba,Sr)TiO$_3$ (BST). Note that the insulator 1250 can be formed to have a single-layer structure or a stacked-layer structure including any of these materials. Alternatively, aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Like the insulator 1224, the insulator 1250 is preferably formed using an oxide insulator that contains oxygen in excess of that in the stoichiometric composition. When such an insulator containing excess oxygen is provided in contact with the oxide 1230, oxygen vacancies in the oxide 1230 can be reduced.

As the insulator 1250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties against oxygen or hydrogen, can be used. The insulator 1250 formed of such a material serves as a layer that prevents release of oxygen from the oxide 1230 and entry of an impurity such as hydrogen from the outside.

Note that the insulator 1250 may have a stacked-layer structure similar to that of the insulator 1220, the insulator 1222, and the insulator 1224. When the insulator 1250 includes an insulator in which a necessary amount of electrons are trapped by electron trap states, the threshold voltage of the transistor 1200A can be shifted in the positive direction. The transistor 1200A having the structure is a normally-off transistor which is in a non-conduction state (also referred to as an off state) even when the gate voltage is 0 V.

In addition to the insulator 1250, a barrier film may be provided between the oxide 1230 and the conductor 1260 in the semiconductor device illustrated in FIGS. 18A to 18C. Alternatively, the oxide 1230c may have a barrier property.

For example, an insulating film containing excess oxygen is provided in contact with the oxide 1230 and enclosed with a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide 1230.

One of the conductors 1240a and 240b functions as a source electrode, and the other thereof functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 1240a and 1240b. In particular, a metal nitride film such as a tantalum nitride film is preferable because it has a barrier property against hydrogen or oxygen and has a high oxidation resistance.

Although a single-layer structure is shown in FIGS. 18A to 18C, a stacked-layer structure of two or more layers may be used. For example, a tantalum nitride film and a tungsten film may be stacked. Alternatively, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

The conductor 1260 functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. In particular, a metal nitride film such as a tantalum nitride film is preferable because it has a barrier property against hydrogen or oxygen and has a high oxidation resistance. Furthermore, one or both of manganese and zirconium may be used. Alternatively, a semiconductor typified by polycrystalline silicon doped with an impurity element such as phosphorus, or a silicide such as nickel silicide may be used. Although a single-layer structure is shown in FIGS. 18A to 18C, a stacked-layer structure of two or more layers may be used.

A two-layer structure where a titanium film is stacked over an aluminum film may be employed, for example. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. Alternatively, an alloy film or a nitride film that contains aluminum and one or more elements selected from titanium, tantalum, tungsten, molybdenum, chromium, neodymium, and scandium may be used.

The conductor 1260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 1260 can have a stacked-layer structure using any of the above-described light-transmitting conductive materials and any of the above-described metals.

Next, the insulator 1280 and the insulator 1282 are provided over the transistor 1200A.

The insulator 1280 preferably includes an oxide containing oxygen in excess of that in the stoichiometric composition. That is, in the insulator 1280, a region containing oxygen in excess of that in the stoichiometric composition (hereinafter also referred to as excess-oxygen region) is preferably formed. In particular, in the case of using an oxide semiconductor in the transistor 1200A, when an insulator including an excess-oxygen region is provided in an interlayer film or the like in the vicinity of the transistor 1200A, oxygen vacancies in the oxide 1230 included in the transistor 1200A are reduced, whereby the reliability can be improved.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 1280 that covers the transistor 1200A may function as a planarization film that covers a roughness thereunder.

The insulator 1282 is preferably formed using an insulating film having a barrier property against oxygen or hydrogen, e.g., an aluminum oxide film or a hafnium oxide film. The insulator 1282 formed of such a material serves as a layer that prevents release of oxygen from the oxide 1230 and entry of an impurity such as hydrogen from the outside.

The above structure makes it possible to provide a transistor including an oxide semiconductor with high on-state current. Alternatively, a transistor including an oxide semiconductor with low off-state current can be provided. Furthermore, when the transistor with the above structure is used in a semiconductor device, variation in the electrical characteristics of the semiconductor device can be reduced, and the reliability thereof can be improved. Alternatively, the power consumption of the semiconductor device can be reduced.

<Transistor Structure 2>

Figure 19A:
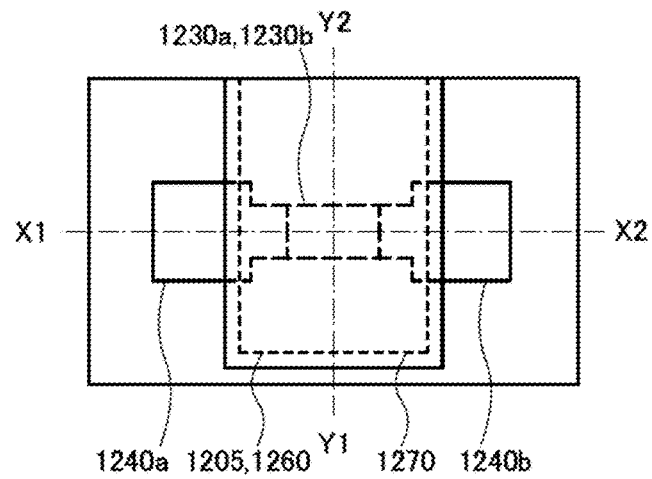
FIGS. 19A to 19C are a top view and cross-sectional views illustrating a structure example of a transistor.
Figure 19B:
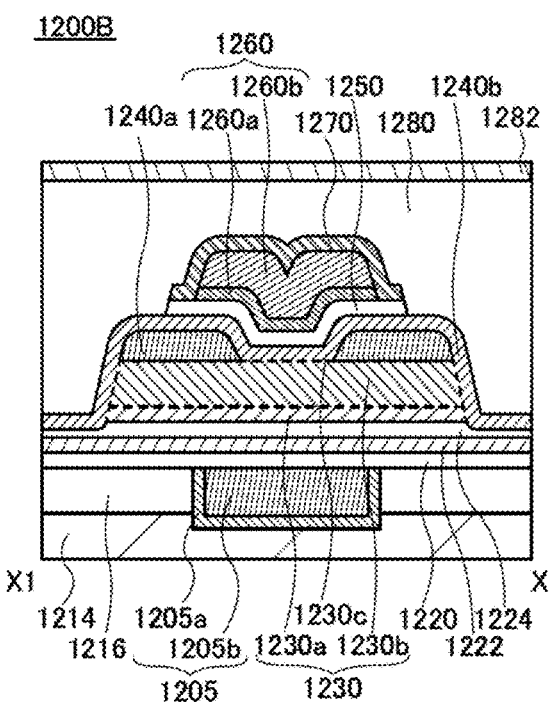
Figure 19C:
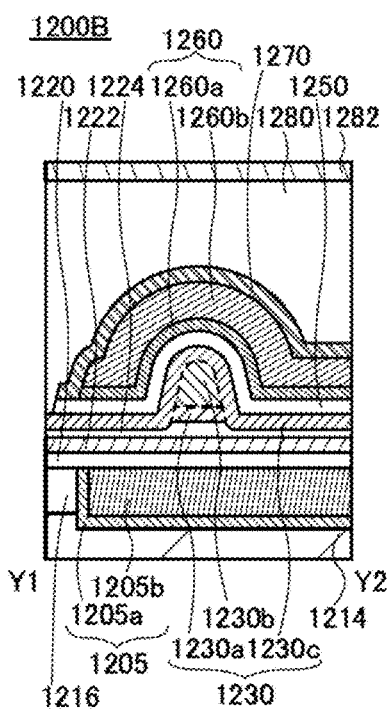

FIGS. 19A to 19C illustrate a structure example of a transistor different from the transistor in FIGS. 18A to 18C. FIG. 19A illustrates a top surface of a transistor 1200B. For simplification of the figure, some films are not illustrated in FIG. 19A. FIG. 19B is a cross-sectional view taken along the dashed-dotted line X1-X2 in FIG. 19A, and FIG. 19C is a cross-sectional view taken along the dashed-dotted line Y1-Y2 in FIG. 19A.

Note that in the transistor 1200B illustrated in FIGS. 19A to 19C, components having the same function as the components in the transistor 1200A in FIGS. 18A to 18C are denoted by the same reference numerals.

In the structure illustrated in FIGS. 19A to 19C, the conductor 1260 has a two-layer structure. In the two-layer structure, layers formed using the same material may be stacked. For example, the conductor 1260a is formed by a thermal CVD method, an MOCVD method, or an ALD method. In particular, the conductor 1260a is preferably formed by an ALD method. By employing an ALD method or the like, damage to the insulator 1250 at the time of the deposition can be reduced. Furthermore, the conductor 1260a is preferably formed by an ALD method or the like because coverage can be improved. Thus, the transistor 1200B having high reliability can be provided.

Next, the conductor 1260b is formed by a sputtering method. At that time, since the conductor 1260a is provided over the insulator 1250, damage caused during deposition of the conductor 1260b can be prevented from affecting the insulator 1250. Since the deposition rate in a sputtering method is higher than that in an ALD method, the productivity can be improved with a high yield.

In the structure illustrated in FIGS. 19A to 19C, an insulator 1270 is provided to cover the conductor 1260. In the case where the insulator 1280 is formed using an oxide material from which oxygen is released, the insulator 1270 is formed using a substance having a barrier property with respect to oxygen to prevent the conductor 1260b from being oxidized by the released oxygen.

For example, the insulator 1270 can be formed using metal oxide such as aluminum oxide. The insulator 1270 is formed to a thickness with which the oxidation of the conductor 1260 is prevented. For example, the thickness of the insulator 1270 is set greater than or equal to 1 nm and less than or equal to 10 nm, preferably greater than or equal to 3 nm and less than or equal to 7 nm.

This structure can expand the range of choices for materials of the conductor 1260. For example, a material which has high conductivity while having low oxidation resistance, such as aluminum, can be used. For example, a conductor which can be easily deposited and processed can be used.

Thus, the oxidation of the conductor 1260 can be prevented, and oxygen released from the insulator 1280 can be supplied to the oxide 1230 efficiently. Furthermore, when the conductor 1260 is formed using a conductor having high conductivity, the transistor 1200B with low power consumption can be provided.

<Transistor Structure 3>

Figure 20A:
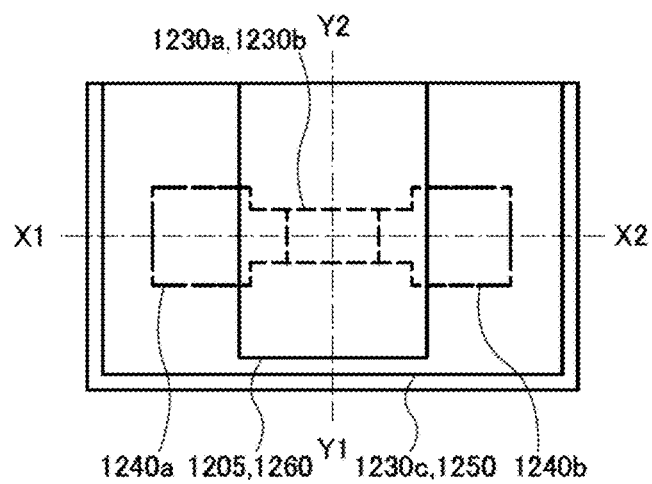
FIGS. 20A to 20C are a top view and cross-sectional views illustrating a structure example of a transistor.
Figure 20B:
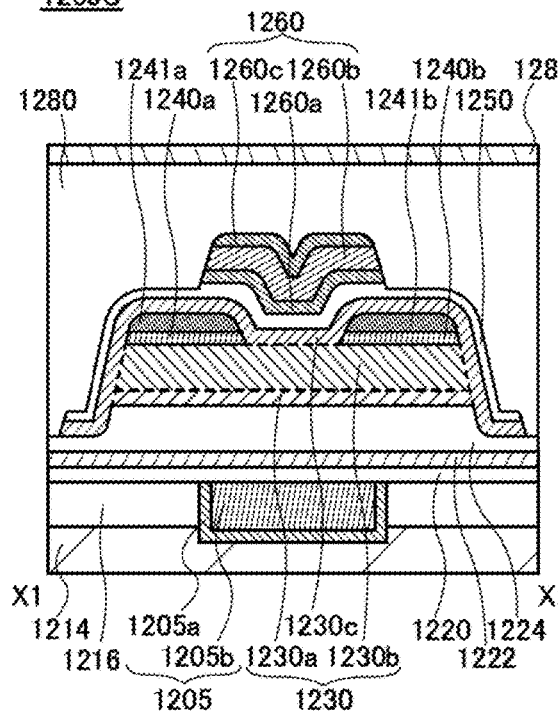
Figure 20C:
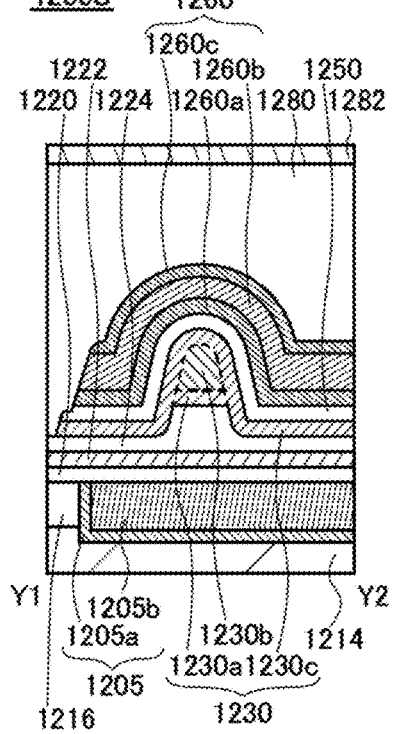

FIGS. 20A to 20C illustrate a structure example of a transistor different from the transistors in FIGS. 18A to 18C and FIGS. 19A to 19C. FIG. 20A illustrates a top surface of a transistor 1200C. For simplification of the figure, some films are not illustrated in FIG. 20A. FIG. 20B is a cross-sectional view taken along the dashed-dotted line X1-X2 in FIG. 20A, and FIG. 20C is a cross-sectional view taken along the dashed-dotted line Y1-Y2 in FIG. 20A.

Note that in the transistor 1200C illustrated in FIGS. 20A to 20C, components having the same function as the components in the transistor 1200A in FIGS. 18A to 18C are denoted by the same reference numerals.

In the structure shown in FIGS. 20A to 20C, the conductor 1260 functioning as a gate electrode includes the conductor 1260a, the conductor 1260b, and a conductor 1260c. The oxide 1230c may be cut over the insulator 1224 as long as the oxide 1230c covers the side surfaces of the oxide 1230b.

The conductor 1260a is formed by a thermal CVD method, an MOCVD method, or an ALD method. In particular, the conductor 1260a is preferably formed by an ALD method. When the conductor 1260a is formed by an ALD method or the like, plasma damage to the insulator 1250 can be reduced. Furthermore, it is preferable to form the conductor 1260a by an ALD method or the like, because coverage can be improved. Thus, the highly reliable transistor 1200C can be provided.

The conductor 1260b is formed using a material having high conductivity such as tantalum, tungsten, copper, or aluminum. The conductor 1260c formed over the conductor 1260b is preferably formed using a conductor with a high oxidation resistance, such as tungsten nitride.

For example, when the insulator 1280 is formed using an oxide material from which oxygen is released, the use of a conductor with a high oxidation resistance for the conductor 1260c, which is in contact with the insulator 1280 having an excess-oxygen region in a large area, can inhibit oxygen released from the excess-oxygen region from being absorbed by the conductor 1260. In addition, the oxidation of the conductor 1260 can be prevented, and oxygen released from the insulator 1280 can be supplied to the oxide 1230 efficiently. Furthermore, a conductor that has high conductivity is used for the conductor 1260b, whereby the transistor 1200C with low power consumption can be provided.

As illustrated in FIG. 20C, the oxide 1230b is covered with the conductor 1260 in the channel width direction of the transistor 1200C. The insulator 1224 has a projection, whereby the side surface of the oxide 1230b is also covered with the conductor 1260. For example, it is preferable that at the side surface of the oxide 1230b, the bottom surface of the conductor 1260 be positioned closer to the substrate than the bottom surface of the oxide 1230b by adjusting the shape of the projection of the insulator 1224. In other words, the transistor 1200C has a structure where the oxide 1230b can be electrically surrounded by an electric field of the conductor 1260. A structure where the oxide 1230b is electrically surrounded by the electric field of the conductor is referred to as a surrounded channel (s-channel) structure. In the transistor 1200C with an s-channel structure, the channel can be formed in the whole oxide 1230b (bulk). In the s-channel structure, the drain current of the transistor can be increased, so that a larger amount of on-state current (current which flows between the source and the drain when the transistor is on) can be obtained. Furthermore, the entire channel formation region of the oxide 1230b can be depleted by the electric field of the conductor 1260. Accordingly, the off-state current of the s-channel transistor can be further reduced. When the channel width is shortened, the effects of the s-channel structure, such as an increase in on-state current and a reduction in off-state current, can be enhanced.

<Transistor Structure 4>

Figure 21A:
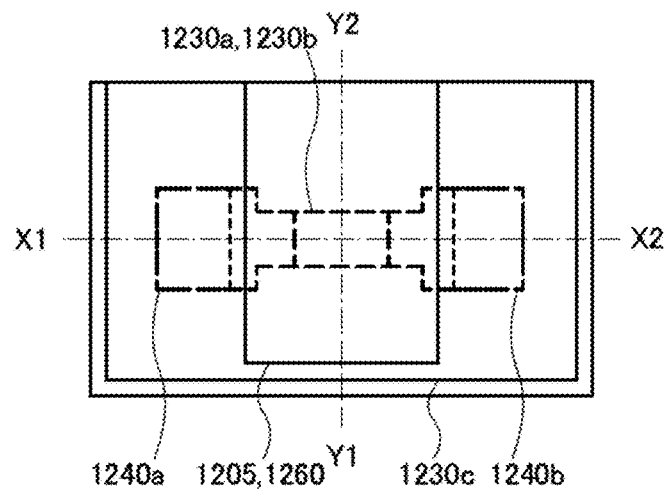
FIGS. 21A to 21C are a top view and cross-sectional views illustrating a structure example of a transistor.
Figure 21B:
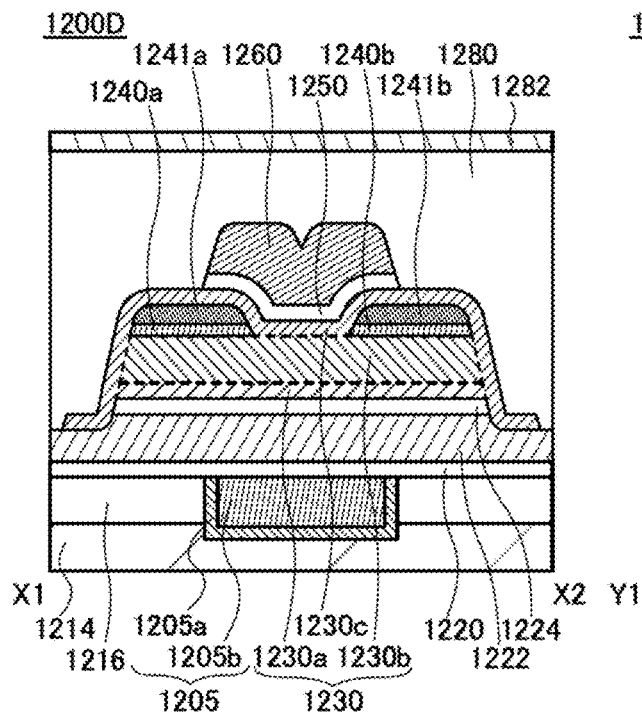
Figure 21C:
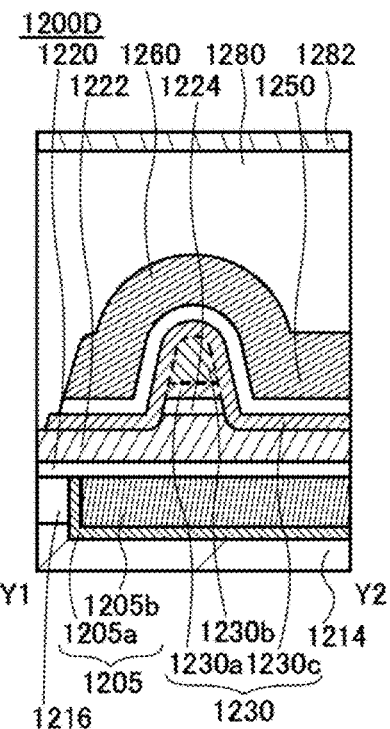

FIGS. 21A to 21C illustrate a structure example of a transistor different from the transistors in FIGS. 18A to 18C, FIGS. 19A to 19C, and FIGS. 20A to 20C. FIG. 21A illustrates a top surface of a transistor 1200D. For simplification of the figure, some films are not illustrated in FIG. 21A. FIG. 21B is a cross-sectional view taken along the dashed-dotted line X1-X2 in FIG. 21A, and FIG. 21C is a cross-sectional view taken along the dashed-dotted line Y1-Y2 in FIG. 21A.

Note that in the transistor 1200D illustrated in FIGS. 21A to 21C, components having the same function as the components in the transistor 1200A in FIGS. 18A to 18C are denoted by the same reference numerals.

In the structure illustrated in FIGS. 21A to 21C, the conductors functioning as the source and the drain have a stacked-layered structure. It is preferable that a conductor which is highly adhesive to the oxide 1230b be used as the conductors 1240a and 1240b, and a material with high conductivity be used as conductors 1241a and 1241b. The conductors 1240a and 1240b are preferably formed by an ALD method. The use of an ALD method or the like can improve the coverage.

For example, when metal oxide including indium is used as the oxide 1230b, titanium nitride or the like may be used as the conductors 1240a and 1240b. When a material with high conductivity, such as tantalum, tungsten, copper, or aluminum, is used as the conductors 1241a and 1241b, the transistor 1200D with high reliability and low power consumption can be provided.

As illustrated in FIGS. 21B and 21C, the oxide 1230b is covered with the conductor 1205 and the conductor 1260 in the channel width direction of the transistor 1200D. The insulator 1222 has a projection, whereby the side surface of the oxide 1230b is also covered with the conductor 1260.

Here, when a high-k material such as hafnium oxide is used as the insulator 1222, the equivalent oxide ($SiO_2$) thickness (EOT) of the insulator 1222 can be small because the insulator 1222 has a high relative dielectric constant. Accordingly, the distance between the conductor 1205 and the oxide 1230 can be increased owing to the physical thickness of the insulator 1222, without a reduction in the influence of the electric field which is applied from the conductor 1205 to the oxide 1230. Thus, the distance between the conductor 1205 and the oxide 1230 can be adjusted by changing the thickness of the insulator 1222.

For example, it is preferable that at the side surfaces of the oxide 1230b, the bottom surface of the conductor 1260 be positioned closer to the substrate than the bottom surface of the oxide 1230b by adjusting the shape of the projection of the insulator 1224. That is, the transistor 1200D has a structure in which the oxide 1230b can be electrically surrounded by an electric field of the conductor 1260. That is, the transistor 1200D has an s-channel structure like the transistor 1200C. In the transistor 1200D with an s-channel structure, the channel can be formed in the whole oxide 1230b (bulk). In the s-channel structure, the drain current of the transistor is increased, so that a larger amount of on-state current (current which flows between the source and the drain when the transistor is on) can be obtained. Furthermore, the entire channel formation region of the oxide 1230b can be depleted by the electric field of the conductor 1260. Accordingly, the off-state current of the s-channel transistor can be further reduced. When the channel width is shortened, the effects of the s-channel structure, such as an increase in on-state current and a reduction in off-state current, can be enhanced.

<Transistor Structure 5>

FIGS. 22A to 22C illustrate a structure example of a transistor different from the transistors in FIGS. 18A to 18C, FIGS. 19A to 19C, FIGS. 20A to 20C, and FIGS. 21A to 21C. FIG. 22A illustrates a top surface of a transistor 1200E. For simplification of the figure, some films are not illustrated in FIG. 22A. FIG. 22B is a cross-sectional view taken along the dashed-dotted line X1-X2 in FIG. 22A, and FIG. 22C is a cross-sectional view taken along the dashed-dotted line Y1-Y2 in FIG. 22A.

Note that in the transistor 1200E in FIGS. 22A to 22C, components having the same function as the components in the transistor 1200A in FIGS. 18A to 18C are denoted by the same reference numerals.

In the transistor 1200E illustrated in FIGS. 22A to 22C, the oxide 1230c, the insulator 1250, and the conductor 1260 are formed in an opening formed in the insulator 1280. One end portion of the conductor 1240a and one end portion of the conductor 1240b are aligned with an end portion of the opening formed in the insulator 1280. Furthermore, an end portion of each of the conductor 1240a and the conductor 1240b is aligned with part of an end portion of the oxide 1230. Therefore, the conductor 1240a and the conductor 1240b can be formed concurrently with the oxide 1230 or the opening in the insulator 1280. This leads to a reduction in the number of masks and steps and improvement in yield and productivity.

The conductor 1240a, the conductor 1240b, and the oxide 1230c are in contact with the insulator 1280 having the oxygen-excess region with the oxide 1230d positioned therebetween. Thus, since the oxide 1230d exists between the insulator 1280 and the oxide 1230b including the region where the channel is formed, impurities such as hydrogen, water, and halogen can be prevented from diffusing from the insulator 1280 into the oxide 1230b.

Since the transistor 1200E illustrated in FIGS. 22A to 22C has a structure in which the conductors 1240a and 1240b hardly overlap with the conductor 1260, the parasitic capacitance added to the conductor 1260 can be reduced. Thus, the transistor 1200E with a high operation frequency can be provided.

<Transistor Structure 6>

Figure 23A:
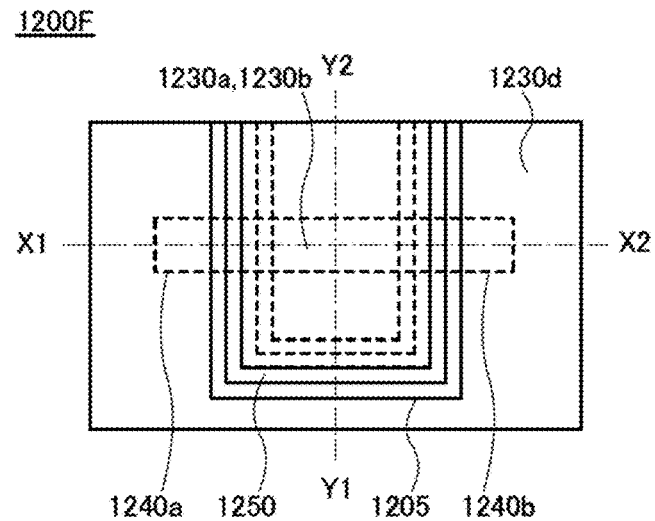
FIGS. 23A to 23C are a top view and cross-sectional views illustrating a structure example of a transistor.
Figure 23B:
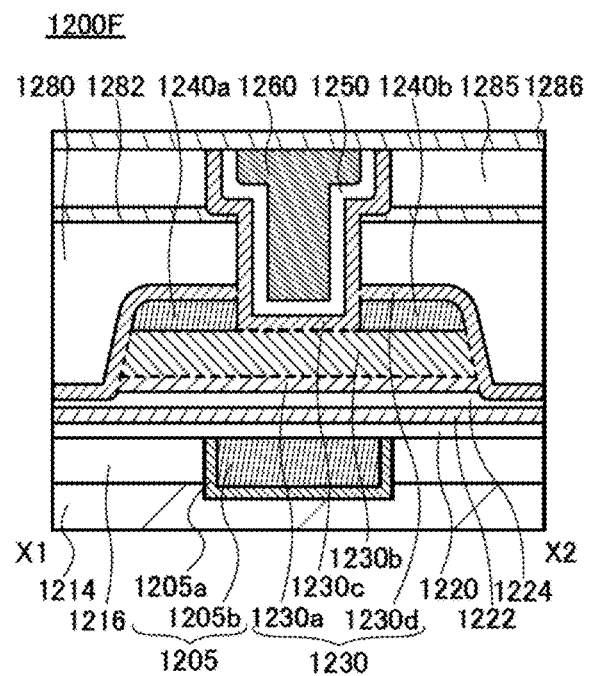
Figure 23C:
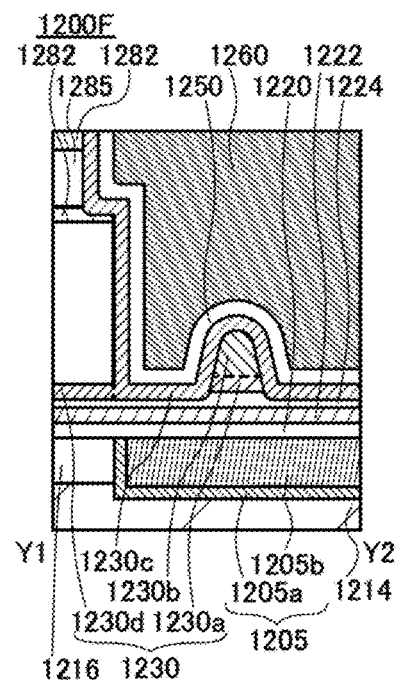

FIGS. 23A to 23C illustrate a structure example of a transistor different from the transistors in FIGS. 18A to 18C, FIGS. 19A to 19C, FIGS. 20A to 20C, FIGS. 21A to 21C, and FIGS. 22A to 22C. FIG. 23A illustrates a top surface of a transistor 1200F. For simplification of the figure, some films are not illustrated in FIG. 23A. FIG. 23B is a cross-sectional view taken along the dashed-dotted line X1-X2 in FIG. 23A, and FIG. 23C is a cross-sectional view taken along the dashed-dotted line Y1-Y2 in FIG. 23A.

Note that in the transistor 1200F illustrated in FIGS. 23A to 23C, components having the same function as the components in the transistor 1200E in FIGS. 22A to 22C are denoted by the same reference numerals.

An insulator 1285 and an insulator 1286 are formed over the insulator 1282.

The oxide 1230c, the insulator 1250, and the conductor 1260 are formed in an opening formed in the insulator 1280, the insulator 1282, and the insulator 1285. Furthermore, an end portion of each of the conductor 1240a and the conductor 1240b is aligned with an end portion of the opening formed in the insulator 1280. Furthermore, the end portion of each of the conductor 1240a and the conductor 1240b is aligned with part of end portions of the oxide 1230c. Thus, the conductors 1240a and 1240b can be formed concurrently with the opening in the insulator 1280. This leads to a reduction in the number of masks and steps and improvement in yield and productivity.

The conductor 1240a, the conductor 1240b, the oxide 1230c, and the oxide 1230b are in contact with the insulator 1280 having the oxygen-excess region with the oxide 1230d positioned therebetween. Thus, since the oxide 1230d exists between the insulator 1280 and the oxide 1230b including the region where the channel is formed, impurities such as hydrogen, water, and halogen can be prevented from diffusing from the insulator 1280 into the oxide 1230b.

In addition, a high-resistance offset region is not formed in the transistor 1200F illustrated in FIGS. 23A to 23C, the on-state current of the transistor 1200F can be increased.

<Transistor Structure 7>

Figure 24A:
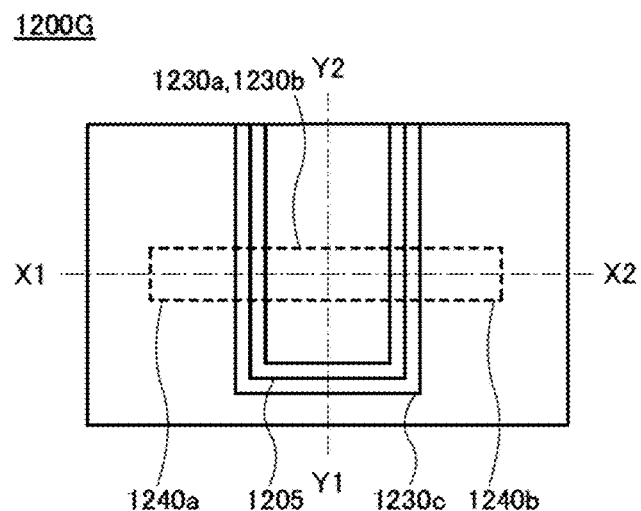
FIGS. 24A to 24C are a top view and cross-sectional views illustrating a structure example of a transistor.
Figure 24B:
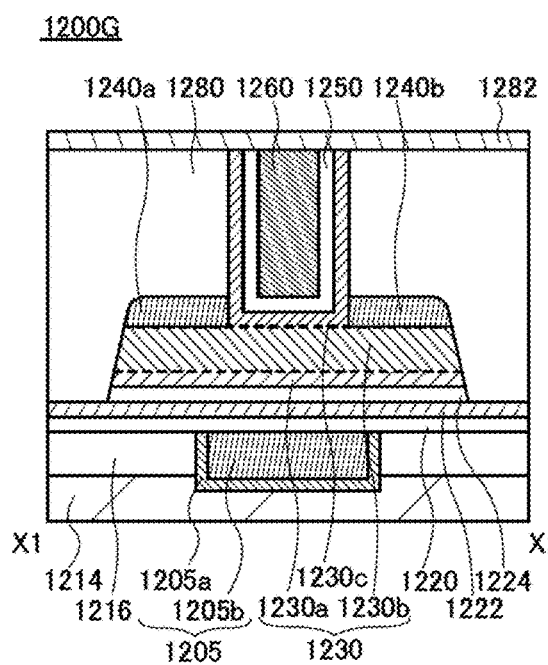
Figure 24C:
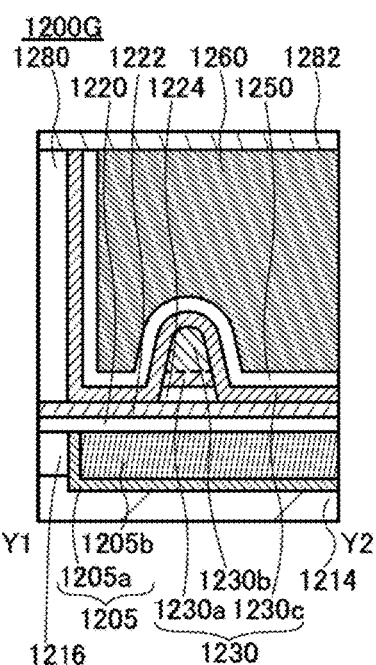

FIGS. 24A to 24C illustrate a structure example of a transistor different from the transistors in FIGS. 18A to 18C, FIGS. 19A to 19C, FIGS. 20A to 20C, FIGS. 21A to 21C, FIGS. 22A to 22C, and FIG. 23A to 23C. FIG. 24A illustrates a top surface of a transistor 1200G. For simplification of the figure, some films are not illustrated in FIG. 24A. FIG. 24B is a cross-sectional view taken along the dashed-dotted line X1-X2 in FIG. 24A, and FIG. 24C is a cross-sectional view taken along the dashed-dotted line Y1-Y2 in FIG. 24A.

Note that in the transistor 1200G illustrated in FIGS. 24A to 24C, components having the same function as the components in the transistor 1200A in FIGS. 18A to 18C are denoted by the same reference numerals.

The transistor 1200G illustrated in FIGS. 24A to 24C does not have the oxide 1230d. For example, when the conductor 1240a and the conductor 1240b are formed using a conductor with a high oxidation resistance, the oxide 1230d is not necessarily provided. Accordingly, the number of masks and steps can be reduced, and yield and productivity can be improved.

The insulator 1224 may be provided only in the region overlapping with the oxides 1230a and 1230b. In that case, the oxides 1230a and 1230b and the insulator 1224 can be processed using the insulator 1222 as an etching stopper. Thus, yield and productivity can be improved.

Since the transistor 1200G illustrated in FIGS. 24A to 24C has a structure in which the conductors 1240a and 1240b hardly overlap with the conductor 1260, the parasitic capacitance added to the conductor 1260 can be reduced. Thus, the transistor 1200G with a high operation frequency can be provided.

Note that this embodiment can be combined with any of the other embodiments in this specification as appropriate.

Embodiment 6

In this embodiment, the structure of an oxide semiconductor film that can be used for the oxide 1230 described in the above embodiment will be described.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 28A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 28B, a peak is not clearly observed. In contrast, in the case where single crystal InGaZnO$_4$ is subjected to φ scan with 2θ fixed at around 56°, as shown in FIG. 28C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 28D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 28E shows a diffraction pattern obtained in such a manner that an electron beam with a probe diameter of 300 nm is incident on the same sample in a direction perpendicular to the sample surface. As shown in FIG. 28E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 28E is considered to be derived from the (010) plane, the (100) plane, and the like of the InGaZnO$_4$ crystal. The second ring in FIG. 28E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

Figure 29A:
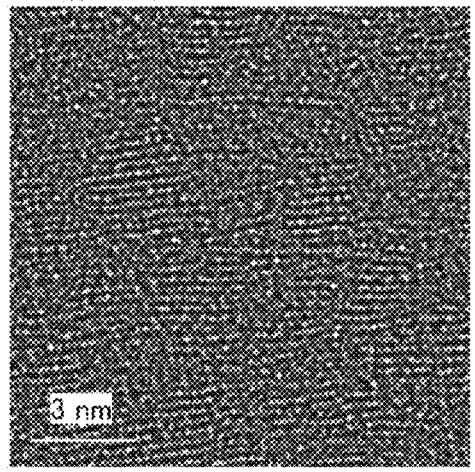
FIGS. 29A to 29E show a cross-sectional TEM image and plan-view TEM images of a CAAC-OS and images obtained through analysis thereof.

FIG. 29A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 29A shows pellets in which metal atoms are arranged in a layered manner. FIG. 29A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 29B:
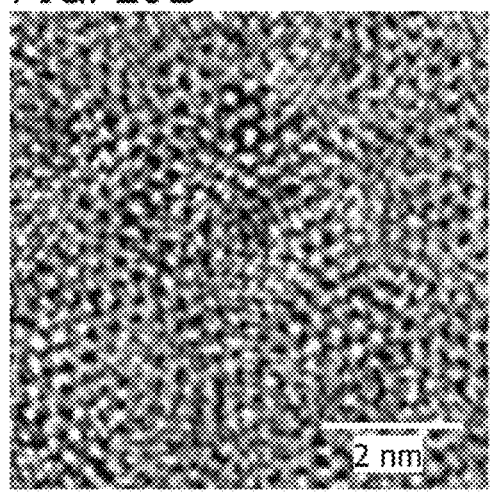
Figure 29C:
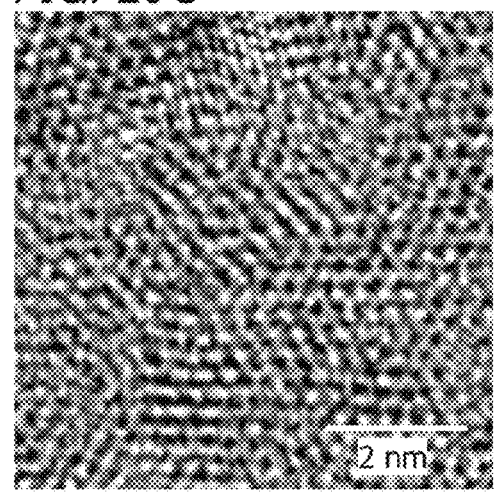
Figure 29D:
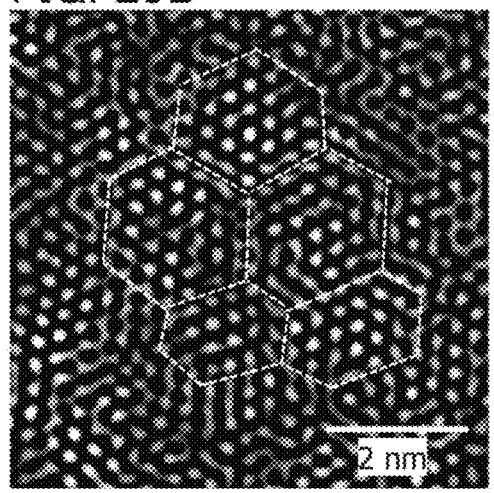
Figure 29E:
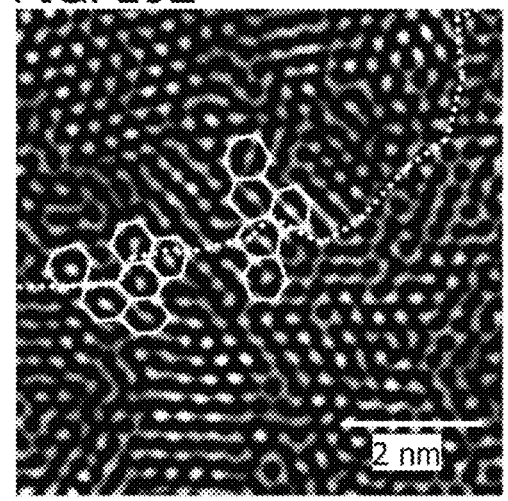

FIGS. 29B and 29C show Cs-corrected high-resolution TEM images of a plane of the CAAC-OS observed from a direction substantially perpendicular to the sample surface. FIGS. 29D and 29E are images obtained through image processing of FIGS. 29B and 29C. The method of image processing is as follows. The image in FIG. 29B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 29D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 29E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the arrangement of oxygen atoms in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 30A:
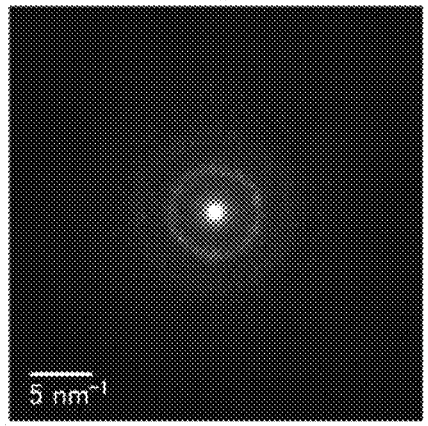
FIGS. 30A to 30D show electron diffraction patterns and a cross-sectional TEM image of an nc-OS.
Figure 30B:
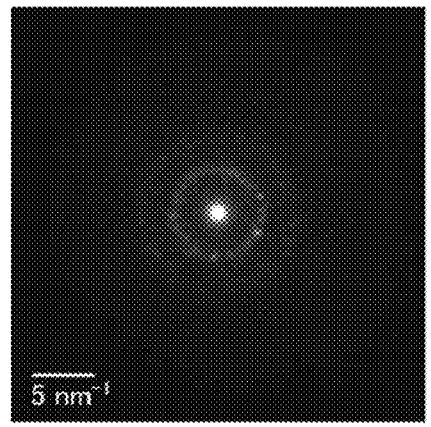

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 30A is observed. FIG. 30B shows a diffraction pattern (a nanobeam electron diffraction pattern) obtained when an electron beam with a probe diameter of 1 nm is incident on the same sample. As shown in FIG. 30B, a plurality of spots are observed in a ring-like region. In other words, ordering in an nc-OS is not observed with an electron beam with a probe diameter of 50 nm but is observed with an electron beam with a probe diameter of 1 nm.

Figure 30C:
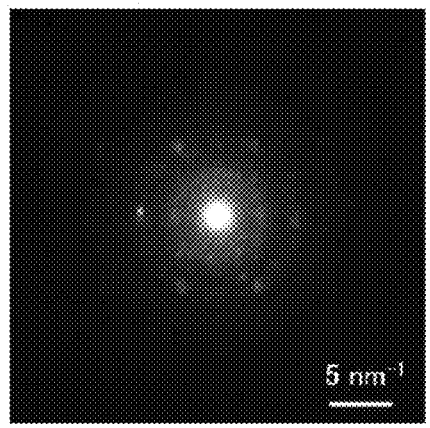

Furthermore, an electron diffraction pattern in which spots are arranged in an approximately regular hexagonal shape is observed in some cases as shown in FIG. 30C when an electron beam having a probe diameter of 1 nm is incident on a region with a thickness less than 10 nm. This means that an nc-OS has a well-ordered region, i.e., a crystal, in the range less than 10 nm in thickness. Note that an electron diffraction pattern having regularity is not observed in some regions because crystals are aligned in various directions.

Figure 30D:
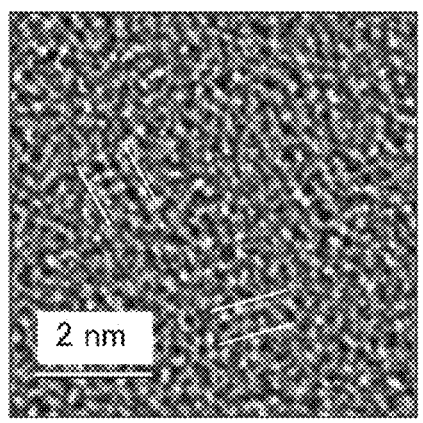

FIG. 30D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 27D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure intermediate between those of the nc-OS and the amorphous oxide semiconductor.

Figure 31A:
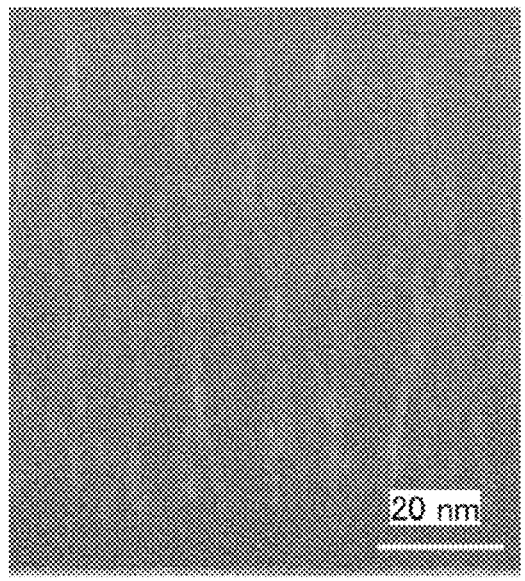
FIGS. 31A and 31B show cross-sectional TEM images of an a-like OS.
Figure 31B:
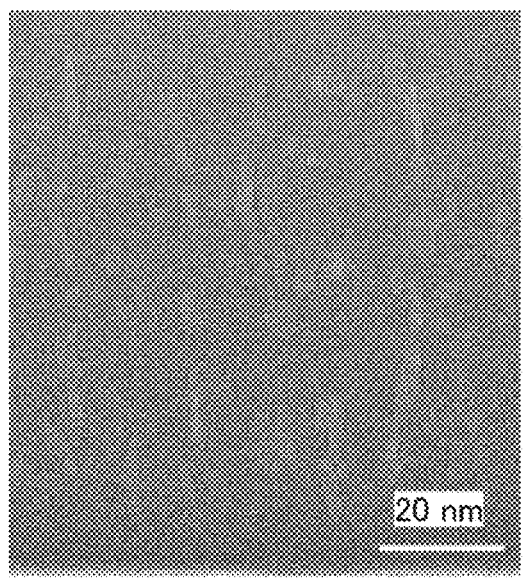

FIGS. 31A and 31B are high-resolution cross-sectional TEM images of an a-like OS. FIG. 31A is the high-resolution cross-sectional TEM image of the a-like OS at the start of the electron irradiation. FIG. 31B is the high-resolution cross-sectional TEM image of the a-like OS after the electron ($e^-$) irradiation at $4.3 \times 10^8$ $e^-/nm^2$. FIGS. 31A and 31B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 32:
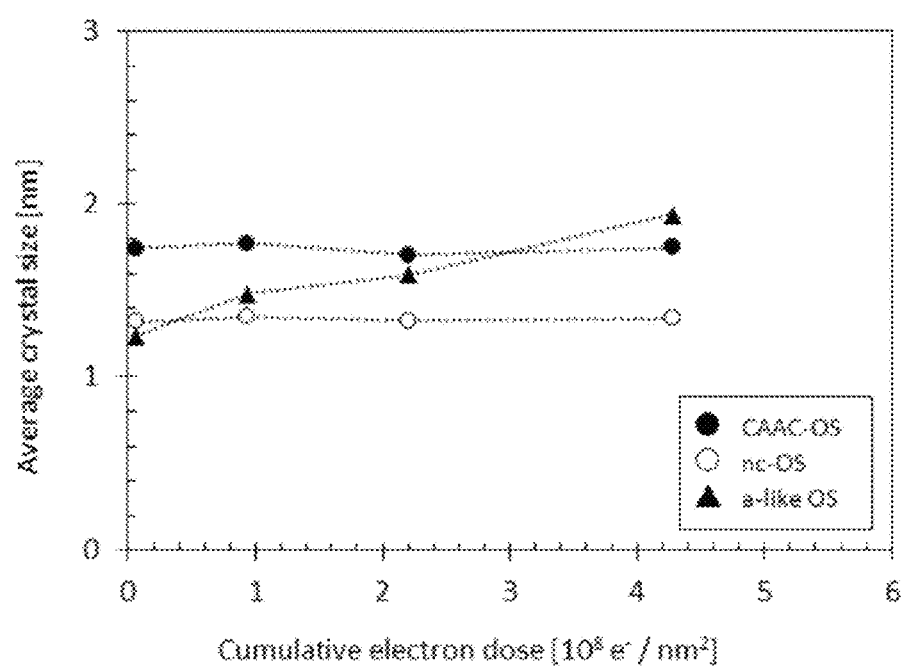
FIG. 32 shows a change of crystal parts of an In—Ga—Zn oxide owing to electron irradiation.

FIG. 32 shows change in the average size of crystal parts (at 22 points to 30 points) in each sample. Note that the crystal part size corresponds to the length of a lattice fringe. FIG. 32 indicates that the crystal part size in the a-like OS increases with an increase in the cumulative electron dose in obtaining TEM images, for example. As shown in FIG. 32, a crystal part of approximately 1.2 nm (also referred to as an initial nucleus) at the start of TEM observation grows to a size of approximately 1.9 nm at a cumulative electron (e) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 32, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of the irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm$^{-3}$, preferably lower than $1 \times 10^{11}$ cm$^3$, and further preferably lower than $1 \times 10^{10}$ cm$^3$ and is higher than or equal to $1 \times 10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$–$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm$^3$ and lower than $1 \times 10^{18}$ cm$^3$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^3$ and lower than or equal to $5 \times 10^{16}$ cm$^3$, yet further preferably higher than or equal to $1 \times 10^{10}$ cm$^3$ and lower than or equal to $1 \times 10^{16}$ cm$^3$, and yet still preferably higher than or equal to $1 \times 10^{11}$ cm$^3$ and lower than or equal to $1 \times 10^{15}$ cm$^{-3}$.

Note that this embodiment can be combined with any of the other embodiments in this specification as appropriate.

(Notes on the Description in this Specification and the Like)

The following are notes on the structures in the above embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

<Notes on Ordinal Numbers>

In this specification and the like, ordinal numbers such as first, second, and third are used in order to avoid confusion among components. Thus, the terms do not limit the number or order of components. Thus, the terms do not limit the number or order of components. In the present specification and the like, a "first" component in one embodiment can be referred to as a "second" component in other embodiments or claims. Furthermore, in the present specification and the like, a "first" component in one embodiment can be referred to without the ordinal number in other embodiments or claims.

<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the embodiments, the same portions or portions having similar functions are denoted by the same reference numerals in different drawings, and the description of such portions is not repeated.

In this specification and the like, the terms for explaining arrangement, such as "over" and "under," are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as plan views (also referred to as layout views) and perspective views, some of components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal. Note that a "bottom gate" is a terminal which is formed before a channel formation region in manufacture of a transistor, and a "top gate" is a terminal which is formed after a channel formation region in manufacture of a transistor.

A transistor has three terminals: a gate, a source, and a drain. A gate is a terminal which functions as a control terminal for controlling the conduction state of a transistor. Depending on the type of the transistor or levels of potentials applied to the terminals, one of a pair of input/output terminals functions as a source and the other functions as a drain. Therefore, the terms "source" and "drain" can be switched in this specification and the like. In this specification and the like, two terminals except a gate are sometimes referred to as a first terminal and a second terminal or as a third terminal and a fourth terminal.

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", "power supply line", and the like can be interchanged with each other depending on circumstances or conditions. For example, the term "wiring" can be changed into the term "signal line" in some cases. For example, the term "wiring" can be changed into the term such as "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases. The term "potential" that is applied to a wiring can be changed into the term "signal" or the like depending on circumstances or conditions. Inversely, the term "signal" or the like can be changed into the term "potential" in some cases.

<Notes on Definitions of Terms>

The following are definitions of the terms mentioned in the above embodiments.

<<Semiconductor>>

In this specification, a "semiconductor" may have characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor layer is silicon, examples of an impurity which changes the characteristics of the semiconductor include oxygen, Group 1 elements except hydrogen, Group 2 elements, Group 13 elements, and Group 15 elements.

<Transistor>

In this specification, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

In one transistor, channel widths in all regions are not necessarily the same. In other words, the channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of the transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a line, an electrode, a terminal, a conductive film, a layer, or the like).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. The term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial no. 2016-034301 filed with Japan Patent Office on Feb. 25, 2016, the entire contents of which are hereby incorporated by reference.

What is claimed is:
1. A semiconductor device comprising:
a first transistor;
a second transistor;
a third transistor;
a first circuit;
a second circuit;
a first inverter circuit;
a first constant current circuit; and
a second constant current circuit,
wherein the second transistor comprises a gate and a back gate,
wherein each of the first transistor and the second transistor is an n-channel transistor,
wherein the third transistor is a p-channel transistor,
wherein the first circuit has a first terminal, a second terminal, and a third terminal,
wherein the first circuit is configured to output a potential corresponding to current flowing through the first terminal and current flowing through the second terminal from the third terminal,
wherein the second circuit has a fourth terminal and a fifth terminal,
wherein the second circuit is configured to output one of two potentials from the fifth terminal in accordance with a potential applied to the fourth terminal,
wherein the first constant current circuit is configured to make constant current flow from an input terminal of the first constant current circuit to an output terminal of the first constant current circuit,
wherein the second constant current circuit is configured to make constant current flow from an input terminal of the second constant current circuit to an output terminal of the second constant current circuit,
wherein one of a source and a drain of the first transistor is electrically connected to the first terminal,
wherein the other of the source and the drain of the first transistor is electrically connected to the input terminal of the first constant current circuit,
wherein one of a source and a drain of the second transistor is electrically connected to the second terminal,
wherein the other of the source and the drain of the second transistor is electrically connected to the input terminal of the first constant current circuit,
wherein a gate of the third transistor is electrically connected to the third terminal,
wherein one of a source and a drain of the third transistor is electrically connected to the input terminal of the second constant current circuit,
wherein an input terminal of the first inverter circuit is electrically connected to the one of the source and the drain of the third transistor,
wherein an output terminal of the first inverter circuit is electrically connected to the fourth terminal,
wherein the fifth terminal is electrically connected to the back gate of the second transistor,
wherein the first constant current circuit includes a sixth transistor,
wherein the second constant current circuit includes a seventh transistor,
wherein each of the sixth transistor and the seventh transistor is an n-channel transistor,
wherein one of a source and a drain of the sixth transistor is electrically connected to the input terminal of the first constant current circuit,
wherein the other of the source and the drain of the sixth transistor is electrically connected to the output terminal of the first constant current circuit,
wherein a gate of the sixth transistor is electrically connected to a gate of the seventh transistor,
wherein one of a source and a drain of the seventh transistor is electrically connected to the input terminal of the second constant current circuit,
wherein the other of the source and the drain of the seventh transistor is electrically connected to the output terminal of the second constant current circuit,
wherein each of the sixth transistor and the seventh transistor comprises a gate and a back gate,
wherein the back gate of the sixth transistor is electrically connected to the gate of the sixth transistor, and
wherein the back gate of the seventh transistor is electrically connected to the gate of the seventh transistor.

2. The semiconductor device according to claim 1, wherein the first transistor has a back gate.

3. The semiconductor device according to claim 1,
wherein the second circuit includes a second inverter circuit,
wherein the second inverter circuit includes a fourth transistor,
wherein an input terminal of the second inverter circuit is electrically connected to the fourth terminal,
wherein an output terminal of the second inverter circuit is electrically connected to the fifth terminal, and
wherein a gate of the fourth transistor is electrically connected to the input terminal of the second inverter circuit.

4. The semiconductor device according to claim 1,
wherein the second circuit includes a fourth transistor and a first resistor,
wherein a gate of the fourth transistor is electrically connected to the fourth terminal,
wherein one of a source and a drain of the fourth transistor is electrically connected to one terminal of the first resistor, and
wherein the fifth terminal is electrically connected to the one of the source and the drain of the fourth transistor.

5. The semiconductor device according to claim 1,
wherein the second circuit includes a fourth transistor and a first diode,
wherein a gate of the fourth transistor is electrically connected to the fourth terminal,
wherein one of a source and a drain of the fourth transistor is electrically connected to an output terminal of the first diode, and
wherein the fifth terminal is electrically connected to the one of the source and the drain of the fourth transistor.

6. The semiconductor device according to claim 1,
wherein the first circuit includes a current mirror circuit,
wherein the current mirror circuit has a sixth terminal and a seventh terminal,
wherein the first terminal is electrically connected to the sixth terminal,
wherein the second terminal is electrically connected to the seventh terminal, and
wherein the third terminal is electrically connected to the seventh terminal.

7. The semiconductor device according to claim 1,
wherein the first circuit includes a second resistor and a third resistor,
wherein the first terminal is electrically connected to one terminal of the second resistor, wherein the second terminal is electrically connected to one terminal of the third resistor, and wherein the third terminal is electrically connected to the one terminal of the third resistor.

8. The semiconductor device according to claim 1, wherein the first circuit includes a second diode and a third diode, wherein the first terminal is electrically connected to an output terminal of the second diode, wherein the second terminal is electrically connected to an output terminal of the third diode, and wherein the third terminal is electrically connected to the output terminal of the third diode.

9. The semiconductor device according to claim 1, wherein the first inverter circuit includes a fifth transistor, and wherein a channel formation region of the fifth transistor includes an oxide containing at least one of indium, an element M (the element M is aluminum, gallium, yttrium, or tin), and zinc.

10. The semiconductor device according to claim 1, wherein a channel formation region of each of the first transistor and the second transistor includes an oxide containing at least one of indium, an element M (the element M is aluminum, gallium, yttrium, or tin), and zinc.

11. A semiconductor device comprising:

a first transistor;

a second transistor;

a third transistor;

a first circuit;

a first inverter circuit;

a first constant current circuit; and a second constant current circuit, wherein the second transistor comprises a gate and a back gate, wherein each of the first transistor and the second transistor is an n-channel transistor, wherein the third transistor is a p-channel transistor, wherein the first circuit has a first terminal, a second terminal, and a third terminal, wherein the first circuit is configured to output a potential corresponding to current flowing through the first terminal and current flowing through the second terminal from the third terminal, wherein the first constant current circuit is configured to make constant current flow from an input terminal of the first constant current circuit to an output terminal of the first constant current circuit, wherein the second constant current circuit is configured to make constant current flow from an input terminal of the second constant current circuit to an output terminal of the second constant current circuit, wherein one of a source and a drain of the first transistor is electrically connected to the first terminal, wherein the other of the source and the drain of the first transistor is electrically connected to the input terminal of the first constant current circuit, wherein one of a source and a drain of the second transistor is electrically connected to the second terminal, wherein the other of the source and the drain of the second transistor is electrically connected to the input terminal of the first constant current circuit, wherein a gate of the third transistor is electrically connected to the third terminal, wherein one of a source and a drain of the third transistor is electrically connected to the input terminal of the second constant current circuit, wherein an input terminal of the first inverter circuit is electrically connected to the one of the source and the drain of the third transistor, wherein the back gate of the second transistor is electrically connected to the one of the source and the drain of the third transistor, wherein the first constant current circuit includes a sixth transistor, wherein the second constant current circuit includes a seventh transistor, wherein each of the sixth transistor and the seventh transistor is an n-channel transistor, wherein one of a source and a drain of the sixth transistor is electrically connected to the input terminal of the first constant current circuit, wherein the other of the source and the drain of the sixth transistor is electrically connected to the output terminal of the first constant current circuit, wherein a gate of the sixth transistor is electrically connected to a gate of the seventh transistor, wherein one of a source and a drain of the seventh transistor is electrically connected to the input terminal of the second constant current circuit, wherein the other of the source and the drain of the seventh transistor is electrically connected to the output terminal of the second constant current circuit, wherein each of the sixth transistor and the seventh transistor comprises a gate and a back gate, wherein the back gate of the sixth transistor is electrically connected to the gate of the sixth transistor, and wherein the back gate of the seventh transistor is electrically connected to the gate of the seventh transistor.

12. The semiconductor device according to claim 11, wherein the first transistor comprises a gate and a back gate.

13. The semiconductor device according to claim 11, further comprising a second circuit, wherein the second circuit has a fourth terminal and a fifth terminal, wherein the second circuit is configured to output one of two potentials from the fifth terminal in accordance with a potential applied to the fourth terminal, wherein the second circuit is positioned between the back gate of the second transistor and the one of the source and the drain of the third transistor which are electrically connected, wherein the fourth terminal is electrically connected to the one of the source and the drain of the third transistor, and wherein the fifth terminal is electrically connected to the back gate of the second transistor.

14. The semiconductor device according to claim 13, wherein the second circuit includes a buffer circuit, wherein an input terminal of the buffer circuit is electrically connected to the fourth terminal, and wherein an output terminal of the buffer circuit is electrically connected to the fifth terminal.

15. The semiconductor device according to claim 13, wherein the first circuit includes a current mirror circuit, wherein the current mirror circuit has a sixth terminal and a seventh terminal, wherein the first terminal is electrically connected to the sixth terminal, wherein the second terminal is electrically connected to the seventh terminal, and wherein the third terminal is electrically connected to the seventh terminal.

16. The semiconductor device according to claim 11, wherein the first circuit includes a second resistor and a third resistor, wherein the first terminal is electrically connected to one terminal of the second resistor, wherein the second terminal is electrically connected to one terminal of the third resistor, and wherein the third terminal is electrically connected to the one terminal of the third resistor.

17. The semiconductor device according to claim 11, wherein the first circuit includes a second diode and a third diode, wherein the first terminal is electrically connected to an output terminal of the second diode, wherein the second terminal is electrically connected to an output terminal of the third diode, and wherein the third terminal is electrically connected to the output terminal of the third diode.

18. The semiconductor device according to claim 11, wherein the first inverter circuit includes a fifth transistor, and wherein a channel formation region of the fifth transistor includes an oxide containing at least one of indium, an element M (the element M is aluminum, gallium, yttrium, or tin), and zinc.

19. The semiconductor device according to claim 11, wherein a channel formation region of each of the first transistor and the second transistor includes an oxide containing at least one of indium, an element M (the element M is aluminum, gallium, yttrium, or tin), and zinc.

* * * * *